United States Patent
Iwato et al.

(10) Patent No.: US 8,722,319 B2
(45) Date of Patent: May 13, 2014

(54) PATTERN FORMING METHOD, CHEMICAL AMPLIFICATION RESIST COMPOSITION AND RESIST FILM

(75) Inventors: Kaoru Iwato, Shizuoka (JP); Keita Kato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/245,326

(22) Filed: Sep. 26, 2011

(65) Prior Publication Data

US 2012/0077122 A1    Mar. 29, 2012

(30) Foreign Application Priority Data

Sep. 28, 2010   (JP) ................................. 2010-217967

(51) Int. Cl.
*G03F 7/26*   (2006.01)

(52) U.S. Cl.
USPC .......................................... 430/322; 430/331

(58) Field of Classification Search
USPC ....................................... 430/322, 270.1, 331
See application file for complete search history.

(56) References Cited

U.S. PATENT DOCUMENTS

| | | | |
|---|---|---|---|
| 5,650,262 A * | 7/1997 | Munzel et al. | 430/270.1 |
| 6,177,229 B1 | 1/2001 | Saito et al. | |
| 2001/0001703 A1 * | 5/2001 | Takahashi et al. | 430/322 |
| 2002/0072579 A1 * | 6/2002 | Hasegawa et al. | 526/281 |
| 2004/0253547 A1 * | 12/2004 | Endo et al. | 430/322 |
| 2005/0186516 A1 * | 8/2005 | Endo et al. | 430/322 |
| 2009/0142693 A1 | 6/2009 | Iwashita | |
| 2010/0239984 A1 | 9/2010 | Tsubaki | |

FOREIGN PATENT DOCUMENTS

| | | |
|---|---|---|
| JP | 11-282167 A | 10/1999 |
| JP | 2000-206694 A | 7/2000 |
| JP | 2006-195050 A | 7/2006 |
| JP | 2006-259582 A | 9/2006 |
| JP | 2006-317803 A | 11/2006 |
| JP | 2008-292975 A | 12/2008 |
| JP | 2008-310314 A | 12/2008 |
| JP | 2009-025707 A | 2/2009 |

OTHER PUBLICATIONS

Office Action dated Dec. 17, 2013, issued by the Japanese Patent Office in counterpart Japanese Application No. 2010-217967.

\* cited by examiner

*Primary Examiner* — Kathleen Duda
*Assistant Examiner* — Caleen Sullivan
(74) *Attorney, Agent, or Firm* — Sughrue Mion, PLLC

(57) ABSTRACT

A pattern forming method includes: (i) forming a film from a chemical amplification resist composition that contains (A) a resin, (B) a compound capable of generating an acid upon irradiation with an actinic ray or radiation and (C) a tertiary alcohol; (ii) exposing the film; and (iii) performing development by using a developer containing an organic solvent.

15 Claims, No Drawings

PATTERN FORMING METHOD, CHEMICAL AMPLIFICATION RESIST COMPOSITION AND RESIST FILM

This application is based on and claims priority under 35 U.S.C. §119 from Japanese Patent Application No. 2010-217967 filed Sep. 28, 2010, the entire disclosure of which is herein incorporated by reference.

BACKGROUND OF THE INVENTION

1. Field of the Invention

The present invention relates to a pattern forming method which is applicable to the process of producing a semiconductor such as IC or the production of a liquid crystal device or a circuit board such as thermal head and further to the lithography in other photo-fabrication processes, a chemical amplification resist composition for use in the pattern forming method, and a resist film. More specifically, the present invention relates to a pattern forming method suitable for exposure by an ArF exposure apparatus, an ArF immersion-type projection exposure apparatus or an EUV exposure apparatus each using a light source that emits far ultraviolet light at a wavelength of 300 nm or less, a chemical amplification resist composition for use in the pattern forming method, and a resist film.

2. Description of the Related Art

Since the advent of a resist for KrF excimer laser (248 nm), an image forming method called chemical amplification is used as an image forming method for resists so as to compensate for sensitivity reduction caused by light absorption. For example, the image forming method by positive chemical amplification is an image forming method of decomposing an acid generator in the exposed area upon exposure to an excimer laser, an electron beam, extreme-ultraviolet light or the like to produce an acid, converting an alkali-insoluble group into an alkali-soluble group by using the generated acid as a reaction catalyst in the baking after exposure (PEB: Post Exposure Bake), and removing the exposed area with an alkali developer.

As for the alkali developer used in the method above, various alkali developers have been proposed, but an aqueous alkali developer of 2.38 mass % TMAH (an aqueous tetramethylammonium hydroxide solution) is being used for general purposes.

Also, due to miniaturization of a semiconductor device, the trend is moving toward a shorter wavelength of the exposure light source and a higher numerical aperture (higher NA) of the projection lens, and an exposure machine using an ArF excimer laser with a wavelength of 193 nm as a light source has been developed at present. Furthermore, for example, a so-called immersion method of filling a high refractive-index liquid (hereinafter sometimes referred to as an "immersion liquid") between the projection lens and the sample, and EUV lithography of performing exposure to ultraviolet light having a shorter wavelength (13.5 nm), have been proposed.

However, it is actually very difficult to find out an appropriate combination of a resist composition, a developer, a rinsing solution and the like, which is necessary for forming a pattern having overall good performance, and more improvements are demanded.

On the other hand, as well as the currently predominant positive resist, a negative chemical amplification resist composition for use in the pattern formation by alkali development is also being developed (see, for example, JP-A-2006-317803 (the term "JP-A" as used herein means an "unexamined published Japanese patent application"), JP-A-2006-259582, JP-A-2006-195050 and JP-A-2000-206694). Because, in the manufacture of a semiconductor device or the like, patterns having various profiles such as line, trench and hole need to be formed, nevertheless, some patterns are difficult to form by the current positive resist composition.

The pattern formation by alkali development using a conventional negative resist composition readily involves problems such as increase in the line width variation (LWR) or decrease in the focus latitude (DOF), for which swelling at the development is presumed to be a main cause.

Also, a double developing technique as a double patterning technology for further raising the resolution is described in JP-A-2008-292975. By making use of a property that when exposed, the polarity of a resin in a resist composition becomes high in a high light intensity region and is kept low in a low light intensity region, the high exposure region of a specific resist film is dissolved with a high-polarity developer and the low exposure region is dissolved with a developer containing an organic solvent (hereafter also referred to as "an organic solvent-containing developer"), whereby the medium exposure dose region is allowed to remain without being dissolved/removed by the development and a line-and-space pattern having a pitch half the pitch of the exposure mask is formed.

SUMMARY OF THE INVENTION

In the negative development step described in JP-A-2008-292975, where the low exposure region is dissolved with an organic solvent-containing developer and the high exposure region is allowed to remain, the pattern is kept from swelling that is generated in alkali development using the above-described negative resist, and this is considered to make it easy to suppress troubles presumed attributable to swelling of the pattern. However, also in the negative development step, more improvements are demanded in terms of sensitivity, reduction of development defect, pattern profile and other various performances.

An object of the present invention is to solve the above-described problems and provide a pattern forming method, a chemical amplification resist composition, and a resist film, ensuring that in the negative pattern formation, all of sensitivity, reduction of development defect, and pattern profile are excellent.

The present invention includes the following configurations, and the above-described object of the present invention is attained by these configurations.

[1] A pattern forming method, comprising:

(i) forming a film from a chemical amplification resist composition that contains (A) a resin, (B) a compound capable of generating an acid upon irradiation with an actinic ray or radiation and (C) a tertiary alcohol;

(ii) exposing the film; and (iii) performing development by using a developer containing an organic solvent.

[2] The pattern forming method as described in [1] above, wherein a content of the organic solvent in the developer containing an organic solvent is from 90 to 100 mass % based on the entire amount of the developer.

[3] The pattern forming method as described in [1] or [2] above, wherein the tertiary alcohol (C) is a compound represented by the following formula (C1):

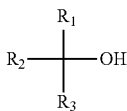

(C1)

wherein each of $R_1$, $R_2$ and $R_3$ independently represents an alkyl group, a cycloalkyl group, an alkenyl group, an alkynyl group or an aryl group, and two or more of $R_1$, $R_2$ and $R_3$ may combine with each other to form a ring; and the compound may have a structure containing two or more structures represented by formula (C1) where any one of $R_1$ to $R_3$ in a structure represented by formula (C1) is bonded to any one of $R_1$ to $R_3$ in another structure represented by formula (C1).

[4] The pattern forming method as described in any one of [1] to [3] above, wherein the tertiary alcohol (C) has a molecular weight of from 120 to 500.

[5] The pattern forming method as described in any one of [1] to [4] above, wherein the resin (A) is a resin capable of increasing a polarity of the resin (A) by an action of an acid to decrease a solubility of the resin (A) for a developer containing an organic solvent.

[6] The pattern forming method as described in any one of [1] to [5] above, further comprising:

heating the film after the exposing of the film but before the development.

[7] The pattern forming method as described in any one of [1] to [6] above, further comprising:

(iv) performing rinsing by using a rinsing solution containing an organic solvent.

[8] The pattern forming method as described in any one of [1] to [7] above, wherein the exposing of the film in the step (ii) is exposure using an ArF excimer laser.

[9] The pattern forming method as described in any one of [1] to [8] above, wherein the exposing of the film in the step (ii) is immersion exposure.

[10] A chemical amplification resist composition for use in the pattern forming method as described in [3] above.

[11] A resist film, which is formed from the chemical amplification resist composition as described in [10] above.

The present invention preferably further includes the following configurations.

[12] The pattern forming method as described in any one of [3] to [9] above, wherein each of $R_1$ to $R_3$ independently represents an alkyl group or a cycloalkyl group.

[13] The pattern forming method as described in any one of [1] to [9] and [12] above, wherein the chemical amplification resist composition further contains a hydrophobic resin.

[14] The pattern forming method as described in any one of [1] to [9], [12] and [13] above, wherein the developer contains substantially no water.

DETAILED DESCRIPTION OF THE INVENTION

The mode for carrying out the present invention is described below.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the description of the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

Furthermore, in the description of the present invention, unless otherwise indicated, the "exposure" includes not only exposure to a mercury lamp, a far ultraviolet ray typified by excimer laser, an extreme-ultraviolet ray, an X-ray, EUV light or the like but also lithography with a particle beam such as electron beam and ion beam.

The pattern forming method of the present invention comprises:

(i) a step of forming a film from a chemical amplification resist composition containing (A) a resin (preferably a resin capable of increasing the polarity by the action of an acid to decrease the solubility for an organic solvent-containing developer), (B) a compound capable of generating an acid upon irradiation with an actinic ray or radiation, and (C) a tertiary alcohol, (ii) a step of exposing the film, and (iii) a step of performing development by using a developer containing an organic solvent (hereafter also referred to as "an organic solvent-containing developer").

When the pattern forming method of the present invention using a chemical amplification resist composition containing (C) a tertiary alcohol is employed, in the negative pattern formation by an organic solvent-containing developer, the sensitivity is increased, the development defect can be reduced, and an excellent pattern profile is obtained. The reason therefor is not clearly known but is presumed as follows.

In the negative pattern formation by an organic solvent-containing developer, compared with a resist composition comprising (A) a resin and (B) a compound capable of generating an acid upon irradiation with an actinic ray or radiation, in the unexposed area of the resist film, reduction in the interaction between polymer chains in the resin (A) or enhancement of the polymer chain mobility is caused by virtue of further containing (C) a tertiary alcohol in addition to the resin (A) and the compound (B), and this encourages to, for example, increase the dissolution or diffusion rate of the polymer chain or increase the permeation speed of the developer through the resist film, as a result, the solubility of the resist film for an organic solvent-containing developer is enhanced. Conversely, in the exposed area of the resist film, the tertiary alcohol (C) undergoes a dehydration reaction by the action of an acid and changes into a corresponding alkene, thereby forming a configuration facilitating volatilization out of the resist film. In turn, the action to reduce the interaction between polymer chains in the resin (A) or enhance the polymer chain mobility is weakened and the dissolution or diffusion rate of the polymer chain as well as the penetration rate of the developer through the resist film are decreased, as a result, low solubility of the exposed area for the developer is maintained. It is presumed that thanks to such a large contradicting difference between the unexposed area and the exposed area, an effect of increasing the sensitivity, reducing the development defect, and giving an excellent pattern profile is obtained in the pattern forming method of the present invention.

In the pattern forming method of the present invention, the developer is preferably a developer containing at least one kind of an organic solvent selected from the group consisting of a ketone-based solvent, an ester-based solvent, an alcohol-based solvent, an amide-based solvent and an ether-based solvent.

The pattern forming method of the present invention preferably further comprises (iv) a step of rinsing the film with a rinsing solution containing an organic solvent (hereafter also referred to as "an organic solvent-containing rinsing solution").

The rinsing solution is preferably a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent.

The pattern forming method of the present invention preferably comprises (v) a heating step after the exposure step (ii).

In the pattern forming method of the present invention, the above-described resin (A) may be a resin capable of increasing the polarity by the action of an acid to increase the solubility for an alkali developer and the method may further comprise (vi) a step of performing development by using an alkali developer.

In the pattern forming method of the present invention, the exposure step (ii) may be performed a plurality of times.

In the pattern forming method of the present invention, the heating step (v) may be performed a plurality of times.

The resist film of the present invention is a film formed of the above-described chemical amplification resist composition, and this film is formed, for example, by applying the resist composition on a base material.

The resist composition which can be used in the present invention is described below.

The present invention also relates to the resist composition described below.

[1] (C) Tertiary Alcohol

The tertiary alcohol (C) for use in the present invention is a compound having at least one tertiary alcoholic hydroxyl group, and it is preferred to have two or more tertiary alcoholic hydroxyl groups.

The tertiary alcohol (C) for use in the present invention undergoes a dehydration reaction by the action of an acid and changes into a corresponding alkene, whereby the volatility can be enhanced.

The "action of an acid" as used in the present invention includes, for example, an action by an acid generated from the later-described compound capable of generating an acid upon irradiation with an actinic ray or radiation.

The volatility means easiness of volatilization, and a substance having a relatively high vapor pressure and a low boiling point tends to show high volatility.

Here, the reason why the volatility is enhanced by the change into the corresponding alkene is considered because when the tertiary alcohol (C) is changed into the corresponding alkene, the tertiary alcohol (C) having polarity and thereby making intermolecular interaction (e.g., molecular association) with another tertiary alcohol (C) molecule or making interaction with another component (for example, the resin (A)) in the resist composition loses the polarity and while the intermolecular interaction (e.g., molecular association) or the interaction with another component in the resist composition is weakened, the volatility is enhanced.

The tertiary alcohol (C) for use in the present invention is not a so-called polymer or oligomer which is obtained, for example, by cleaving the unsaturated bond of a compound having an unsaturated bond (so-called polymerizable monomer) with use of an initiator and expanding the bond through a chain reaction.

The tertiary alcohol (C) for use in the present invention is preferably a low molecular compound such as saturated or unsaturated aliphatic alcohol and alicyclic alcohol, more preferably a low molecular compound where the molecular weight of the tertiary alcohol (C) is from 120 to 500, still more preferably a low molecular compound having a molecular weight of 150 to 400, yet still more preferably a low molecular compound having a molecular weight of 180 to 300.

If the molecular weight is too small, the compound is liable to volatilize before exposure or development (for example, at the pre-bake stage) and the effect can be hardly obtained, whereas if the molecular weight is too large, the compound is liable to remain after exposure (for example, after post-bake), as a result, the dissolution rate in the exposed area is less likely to decrease and film loss is liable to occur.

The tertiary alcohol (C) for use in the present invention is preferably a compound represented by the following formula (C1):

In the formula, each of $R_1$, $R_2$ and $R_3$ independently represents an alkyl group, a cycloalkyl group, an alkenyl group, an alkynyl group or an aryl group, and two or more of $R_1$, $R_2$ and $R_3$ may combine with each other to form a ring.

However, the carbon atom in $R_1$, which is adjacently bonded to the tertiary carbon atom bonded to the hydroxyl group in formula (C1), is preferably bonded to at least one hydrogen atom.

The compound represented by formula (C1) may have a structure containing two or more structures represented by formula (C1) where any one of $R_1$ to $R_3$ in a structure represented by formula (C1) is bonded to any one of $R_1$ to $R_3$ in another structure represented by formula (C1).

Each of $R_1$ to $R_3$ is independently, preferably an alkyl group or a cycloalkyl group.

The alkyl group of $R_1$ to $R_3$ is preferably an alkyl group having a carbon number of 1 to 8, and examples thereof include a methyl group, an ethyl group, a propyl group, an n-butyl group, a sec-butyl group, a hexyl group, and an octyl group.

The cycloalkyl group of $R_1$ to $R_3$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the cycloalkyl group may be substituted with a heteroatom such as oxygen atom.

The alkenyl group of $R_1$ to $R_3$ is preferably an alkenyl group having a carbon number of 2 to 8, and examples thereof include a vinyl group, an allyl group, a butenyl group, and a cyclohexenyl group.

The alkynyl group of $R_1$ to $R_3$ includes, for example, an alkynyl group having a carbon number of 2 to 5, such as ethynyl group, propynyl group and butynyl group.

The aryl group of $R_1$ to $R_3$ is preferably an aryl group having a carbon number of 6 to 10, and examples thereof include a phenyl group, a naphthyl group, and an anthryl group.

The ring formed by combining two members out of $R_1$, $R_2$ and $R_3$ is preferably a cycloalkyl group (monocyclic or polycyclic). The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. A monocyclic cycloalkyl group having a carbon number of 5 to 6 is more preferred, and a monocyclic cycloalkyl group having a carbon number of 5 is still more preferred.

The molecular weight of the alkene after dehydration the tertiary alcohol (C) by the action of an acid, is preferably 200 or less, more preferably 175 or less, still more preferably 150 or less.

Specific examples of the compound (C) for use in the present invention are illustrated below, but the present invention is not limited thereto.

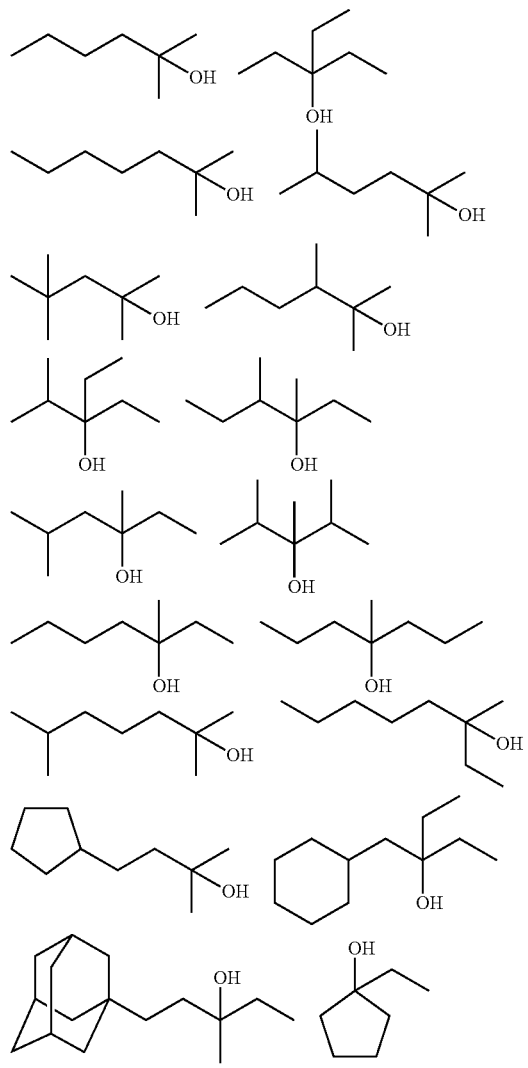

-continued

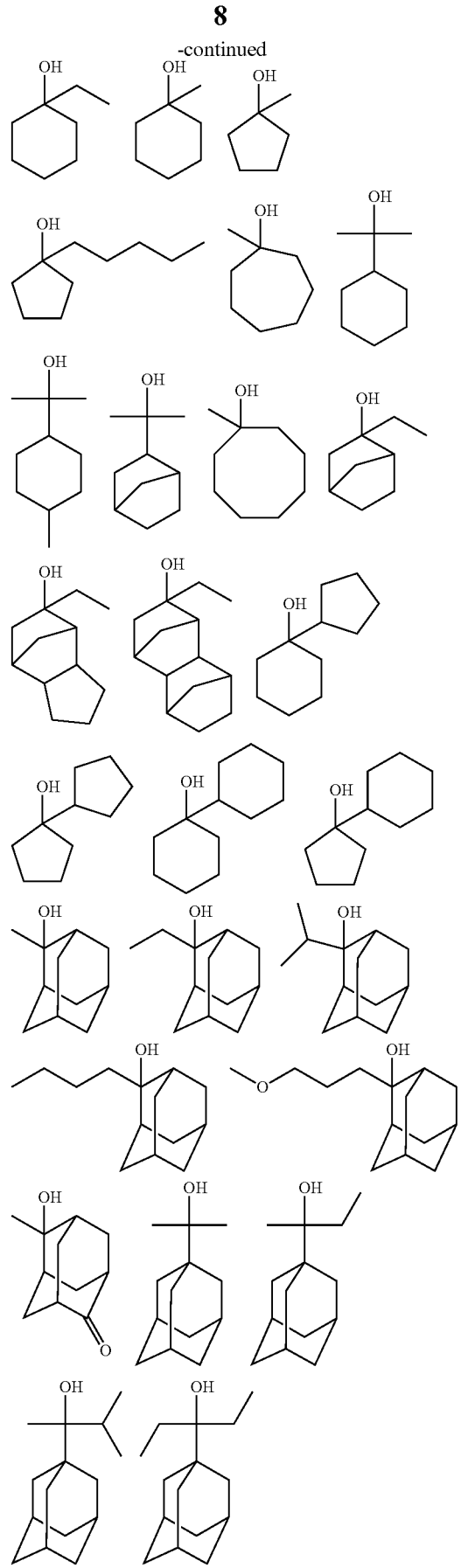

-continued

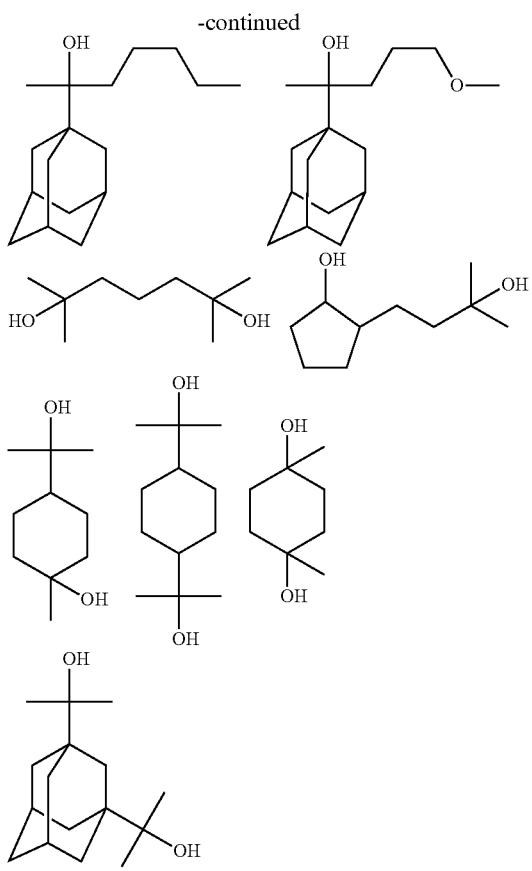

One of these compounds (C) may be used alone, or two or more thereof may be used in combination.

In the present invention, the content of the compound (C) is preferably from 1 to 30 mass %, more preferably from 3 to 25 mass %, still more preferably from 5 to 20 mass %, yet still more preferably from 5 to 10 mass %, based on the solid content of the resist composition. (In this specification, mass ratio is equal to weight ratio.)

The tertiary alcohol (C) for use in the present invention can be synthesized by a general organic synthesis reaction, for example, by a reaction of a ketone and a nucleating agent, a ring-opening reaction of an epoxide, hydroxylation of a corresponding halide, an oxidation reaction of a compound having a corresponding tertiary carbon atom, or alcoholization from a corresponding tertiary alcohol derivative.

[2] (A) Resin

The resin (hereinafter, sometimes referred to as a "resin A") for use in the resist composition of the present invention is preferably a resin capable of increasing the polarity by the action of an acid to decrease the solubility for an organic solvent-containing developer and includes, for example, a resin having a group capable of decomposing by the action of an acid to produce a polar group (hereinafter, sometimes referred to as an "acid-decomposable group"), on either one or both of the main chain and the side chain of the resin (hereinafter, sometimes referred to as an "acid-decomposable resin"). Incidentally, this resin is a resin capable of increasing the polarity by the action of an acid to increase the solubility for an alkali developer.

The acid-decomposable group preferably has a structure where a polar group is protected with a group capable of decomposing and leaving by the action of an acid.

The polar group is not particularly limited as long as it is a group capable of being sparingly solubilized or insolubilized in an organic solvent-containing developer, but examples thereof include a carboxyl group, a fluorinated alcohol group (preferably hexafluoroisopropanol group), an acidic group (a group capable of dissociating in an aqueous 2.38 mass % tetramethylammonium hydroxide solution which has been conventionally used as the developer for a resist) such as sulfonic acid group, and an alcoholic hydroxyl group.

The alcoholic hydroxyl group as used herein indicates a non-phenolic hydroxyl group, more specifically, a hydroxyl group having a pKa of 12 to 20.

The group preferred as the acid-decomposable group is a group where a hydrogen atom of the group above is replaced by a group capable of leaving by the action of an acid.

Examples of the group capable of leaving by the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the cycloalkyl group may be substituted with a heteroatom such as oxygen atom.

The aryl group of $R_{36}$ to $R_{39}$, $R_{01}$ and $R_{02}$ is preferably an aryl group having a carbon number of 6 to 10, and examples thereof include a phenyl group, a naphthyl group, and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group, and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ is preferably a cycloalkyl group (monocyclic or polycyclic). The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. A monocyclic cycloalkyl group having a carbon number of 5 to 6 is more preferred, and a monocyclic cycloalkyl group having a carbon number of 5 is still more preferred.

The acid-decomposable group-containing repeating unit which can be contained in the resin (A) is preferably a repeating unit represented by the following formula (AI):

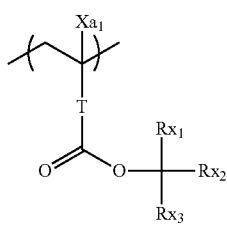

(AI)

In formula (AI), $Xa_1$ represents a hydrogen atom, a methyl group which may have a substituent, or a group represented by —$CH_2$—$R_9$. $R_9$ represents a hydroxyl group or a monovalent organic group. Examples of the monovalent organic group include an alkyl group having a carbon number of 5 or less, and an acyl group having a carbon number of 5 or less. Of these, an alkyl group having a carbon number of 3 or less is preferred, and a methyl group is more preferred. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members out of $Rx_1$ to $Rx_3$ may combine to form a cycloalkyl group (monocyclic or polycyclic).

Examples of the divalent linking group of T include an alkylene group, a —COO—Rt- group, a —O—Rt- group. In the formulae, Rt represents an alkylene group or a cycloalkylene group.

T is preferably a single bond or a —COO-Rt- group. Rt is preferably an alkylene group having a carbon number of 1 to 5, more preferably a —$CH_2$— group, —$(CH_2)_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. Above all, a monocyclic cycloalkyl group having a carbon number of 5 to 6 is preferred.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

The content in total of the acid-decomposable group-containing repeating units is preferably from 20 to 70 mol %, more preferably from 30 to 65 mol %, based on all repeating units in the resin (A).

Specific preferred examples of the repeating unit having an acid-decomposable group are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents a substituent containing a polar group, and when a plurality of Z's are present, each Z may be the same as or different from every other Z. p represents 0 or a positive integer. Specific examples and preferred examples of Z are the same as specific examples and preferred examples of $R_{10}$ in formula (2-1) described later.

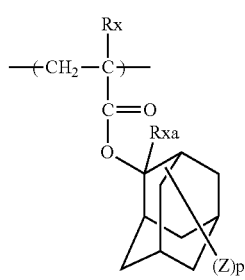

1

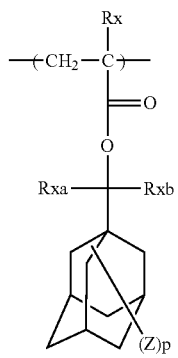

2

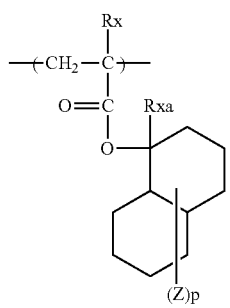

3

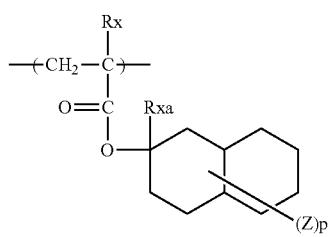

4

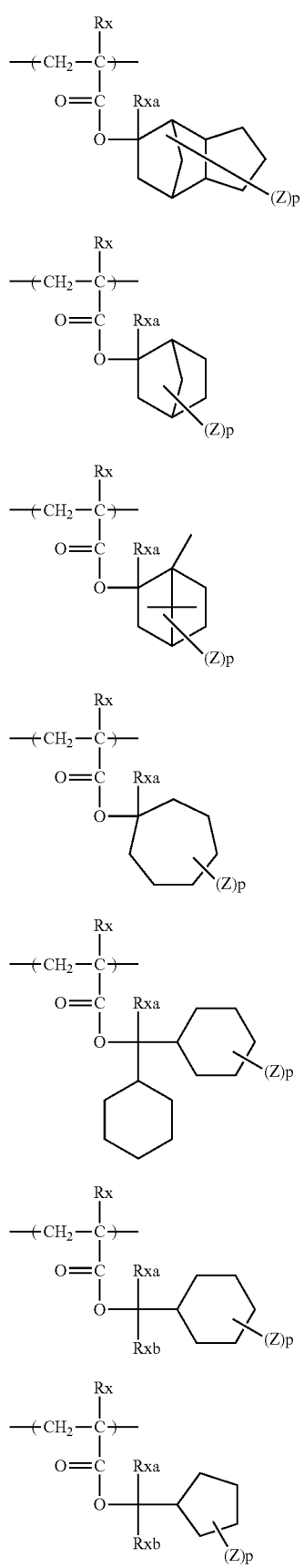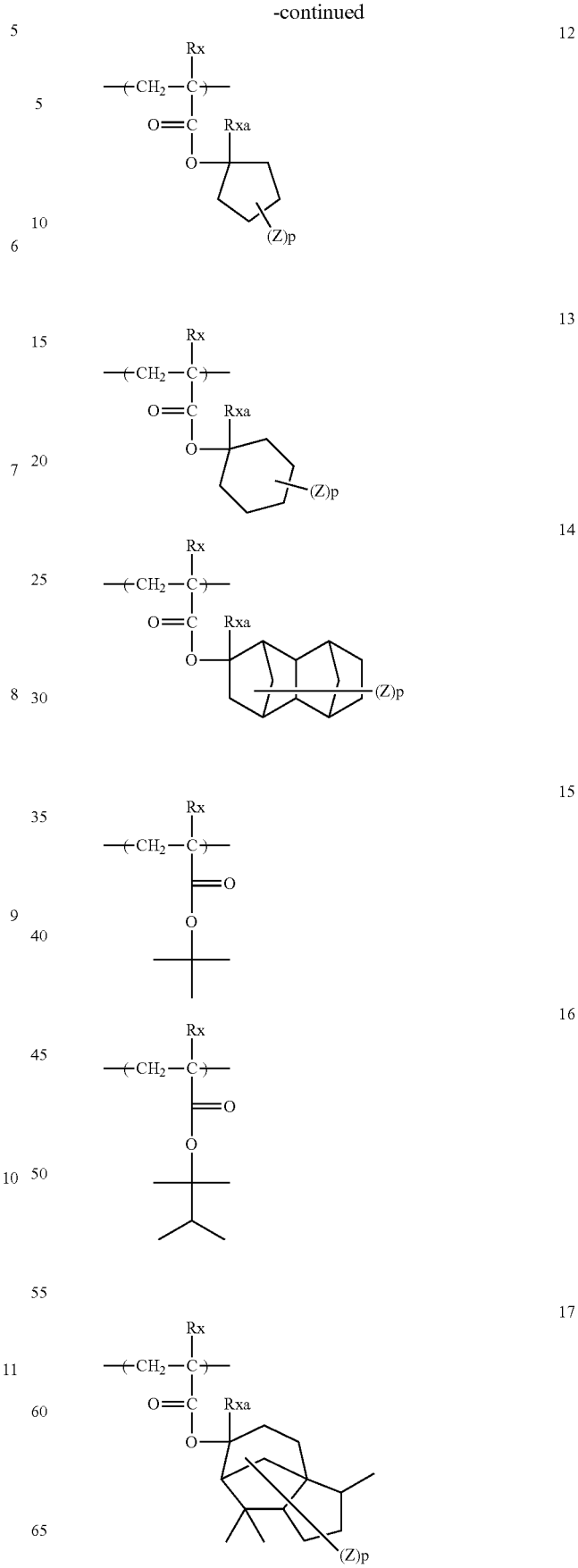

18
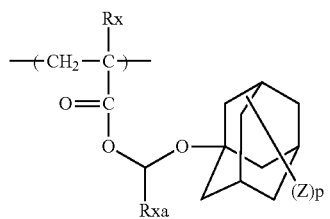
19
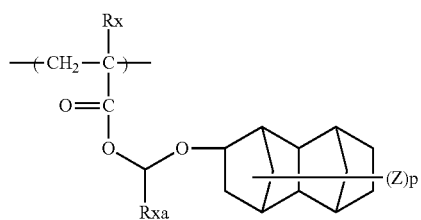
20
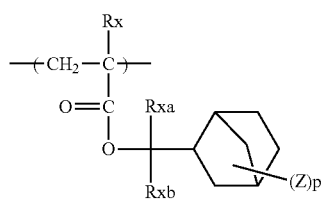
21
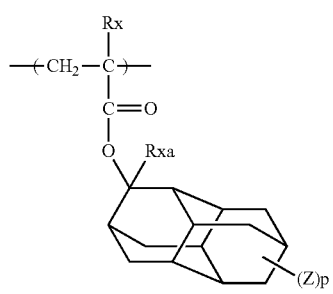
22
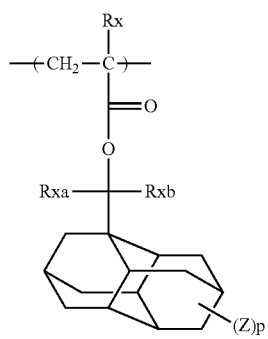
23
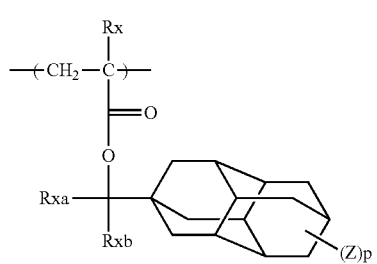
24
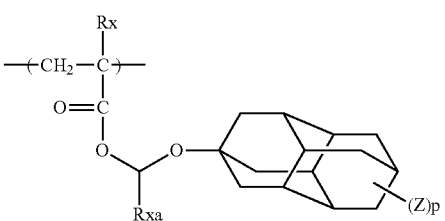
25
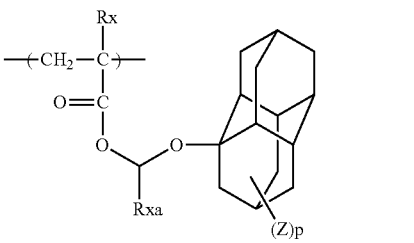
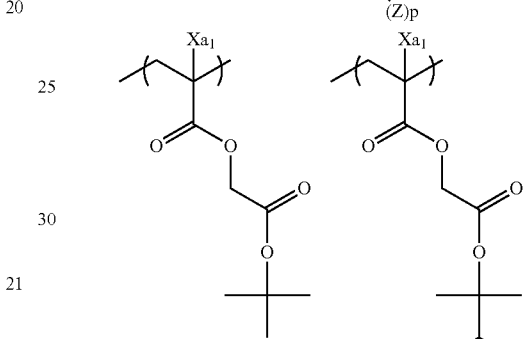
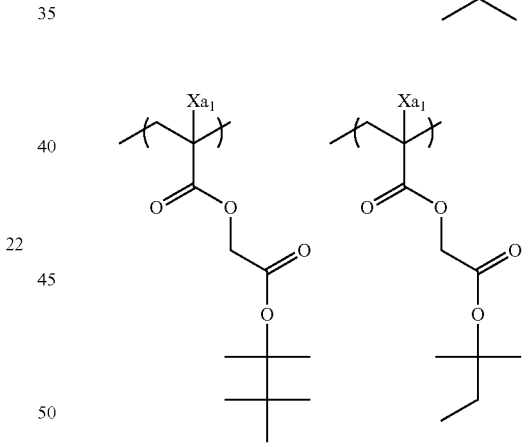
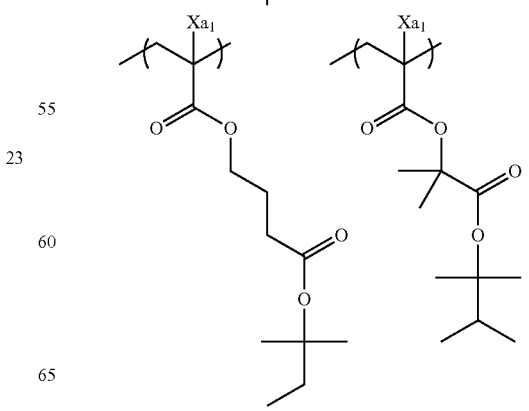

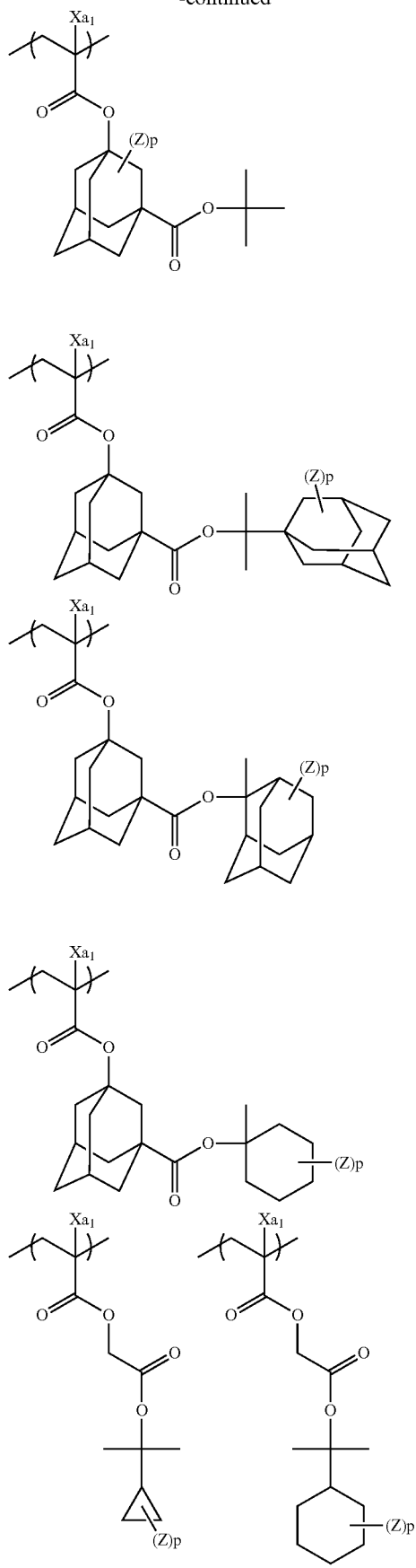
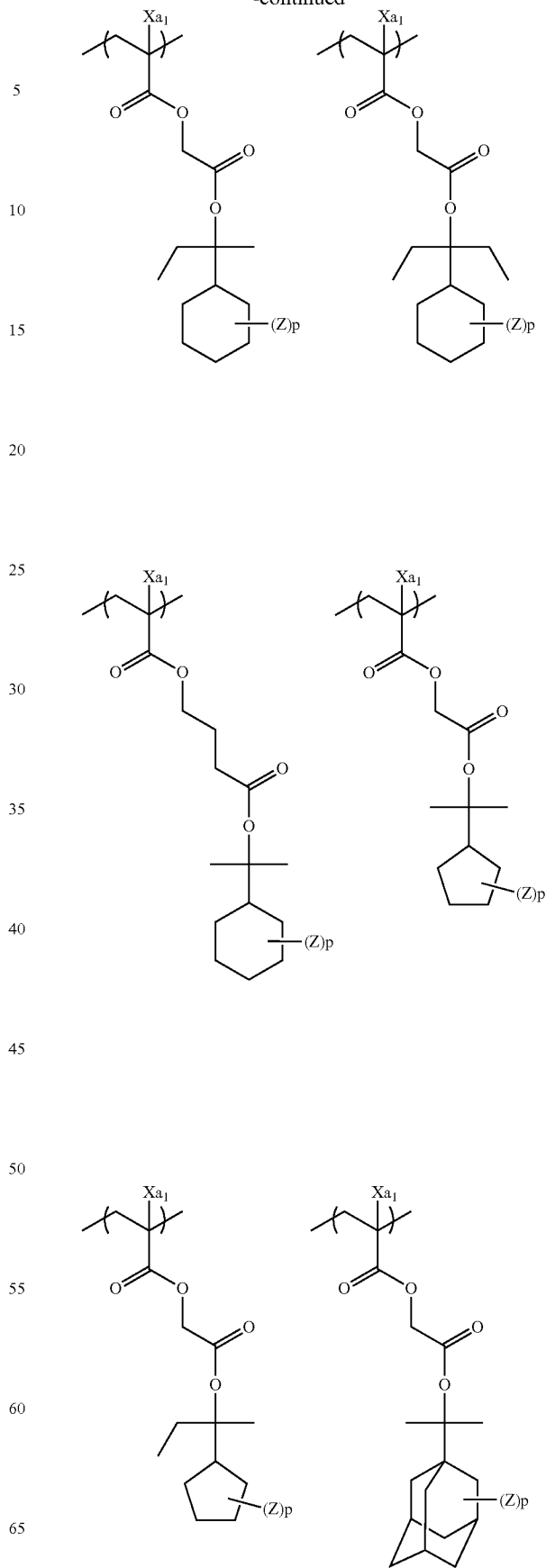

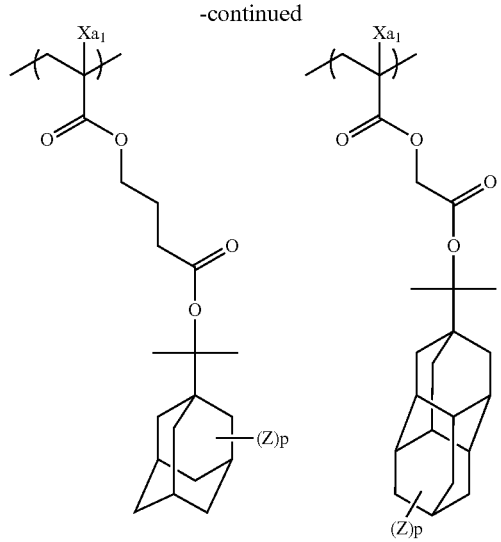
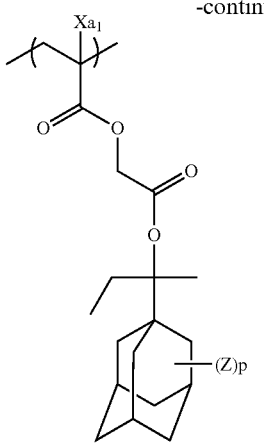
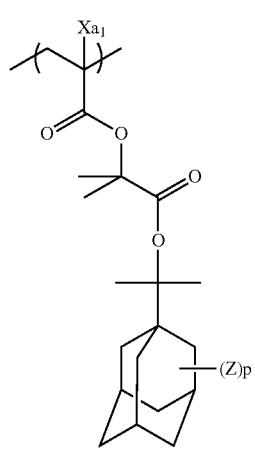
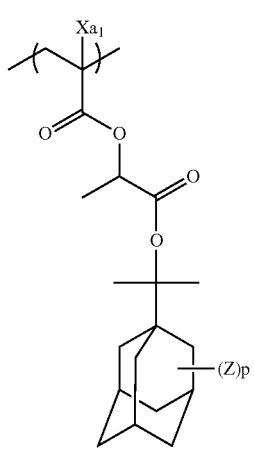
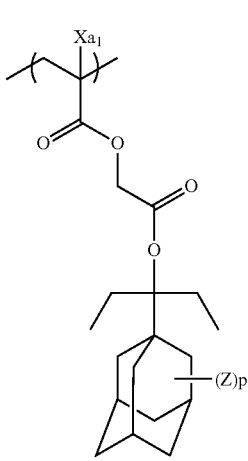
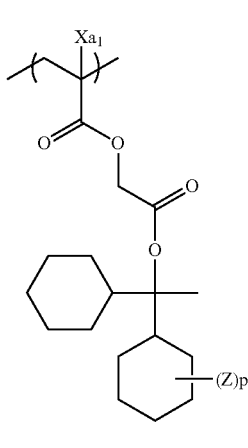
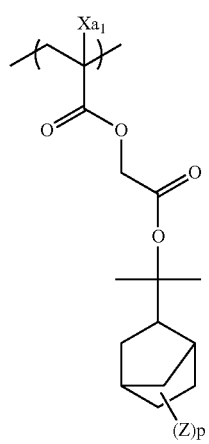
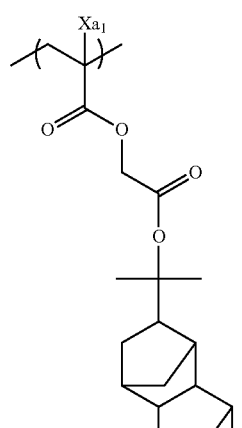
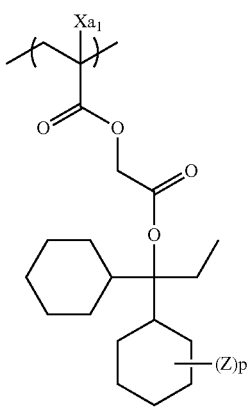

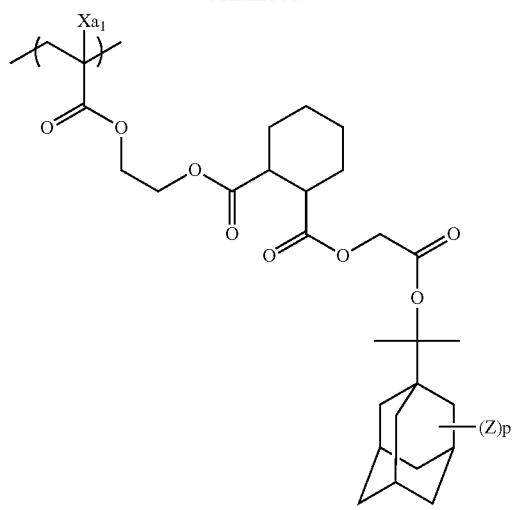
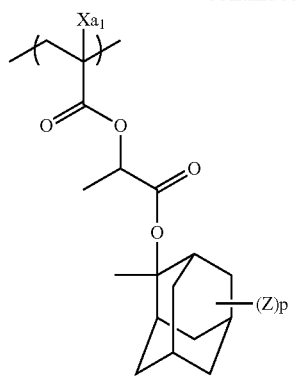
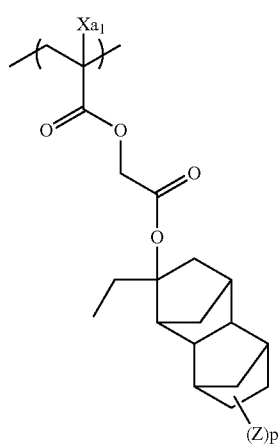
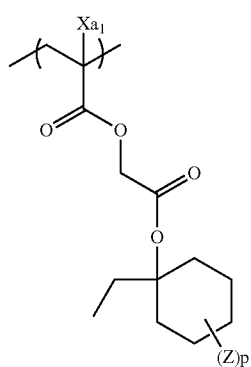

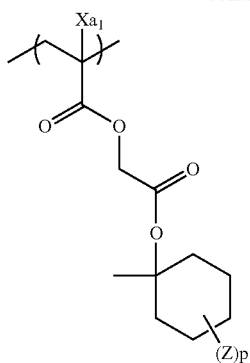

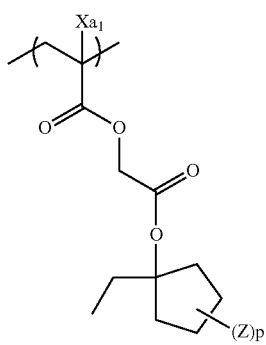

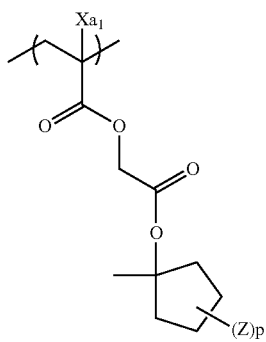

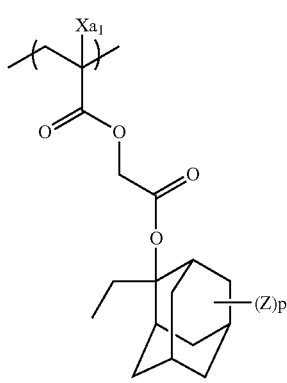

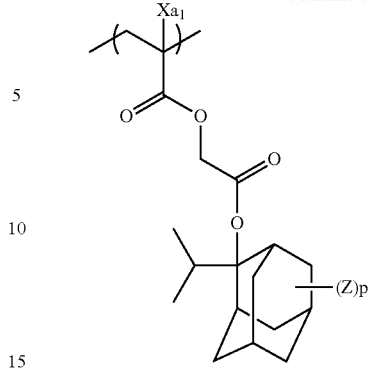

The resin (A) is more preferably a resin containing, as the repeating unit represented by formula (AI), at least either a repeating unit represented by formula (1) or a repeating unit represented by formula (2).

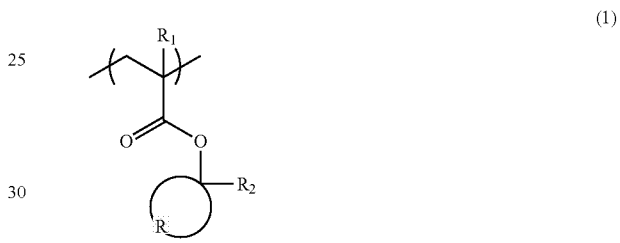

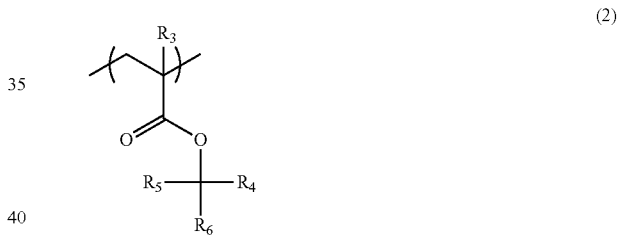

In formulae (1) and (2), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

Each of $R_1$ and $R_3$ is preferably a hydrogen atom, a methyl group, a trifluoromethyl group or a hydroxymethyl group. Specific examples and preferred examples of the monovalent organic group in $R_9$ are the same as those described for $R_9$ in formula (AI).

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R together with the carbon atom is preferably a monocyclic alicyclic structure, and the carbon number thereof is preferably from 3 to 7, more preferably 5 or 6.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The repeating unit represented by formula (1) includes, for example, a repeating unit represented by the following formula (1-a):

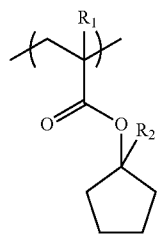

(1-a)

In the formula, $R_1$ and $R_2$ have the same meanings as those in formula (1).

The repeating unit represented by formula (2) is preferably a repeating unit represented by the following formula (2-1):

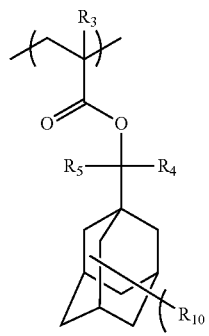

(2-1)

In formula (2-1), $R_3$ to $R_5$ have the same meanings as those in formula (2).

$R_{10}$ represents a polar group-containing substituent. In the case where a plurality of $R_{10}$'s are present, each $R_{10}$ may be the same as or different from every other $R_{10}$. Examples of the polar group-containing substituent include a hydroxyl group, a cyano group, an amino group, an alkylamide group, a sulfonamide group itself, and a linear or branched alkyl group or cycloalkyl group having at least one of these groups. An alkyl group having a hydroxyl group is preferred, and a branched alkyl group having a hydroxyl group is more preferred. The branched alkyl group is preferably an isopropyl group.

p represents an integer of 0 to 15. p is preferably an integer of 0 to 2, more preferably 0 or 1.

The resin (A) is more preferably a resin containing, as the repeating unit represented by formula (AI), at least either one of a repeating unit represented by formula (1) and a repeating unit represented by formula (2). In another embodiment, the resin is more preferably a resin containing, as the repeating unit represented by formula (AI), at least two kinds of repeating units represented by formula (1).

As for the repeating unit having an acid-decomposable group of the resin (A), one kind of a repeating unit may be used, or two or more kinds of repeating units may be used. In the case of using the repeating units in combination, preferred examples of the combination are illustrated below. In the formulae below, each R independently represents a hydrogen atom or a methyl group.

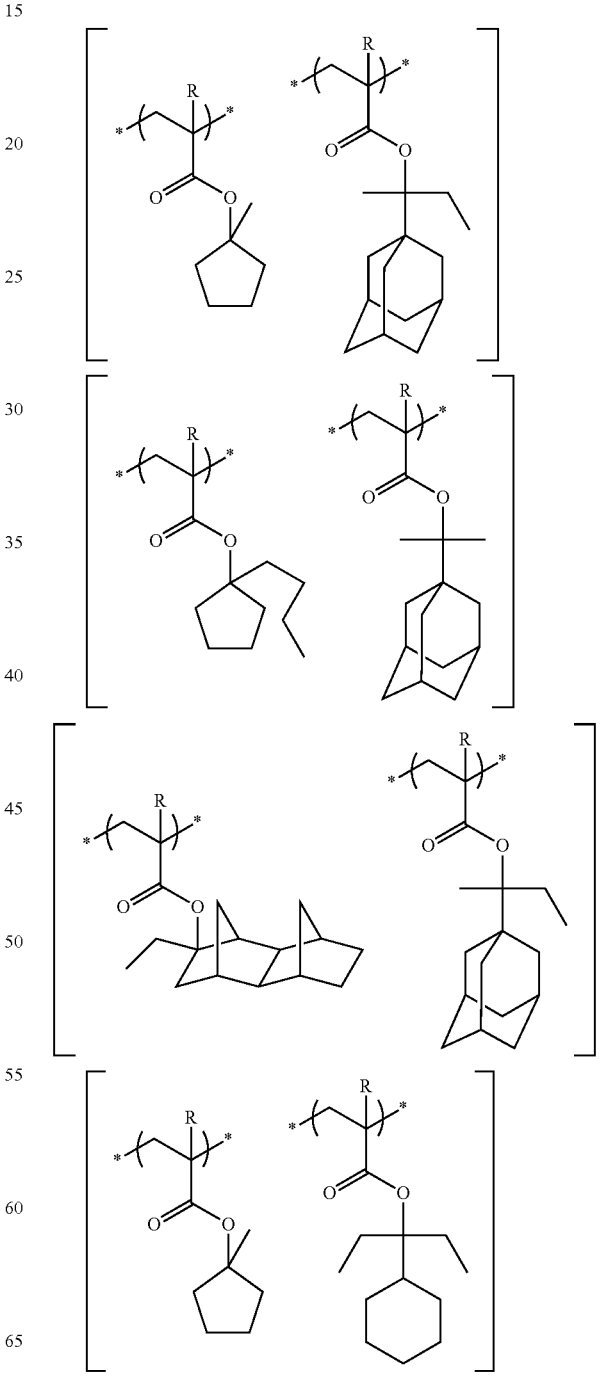

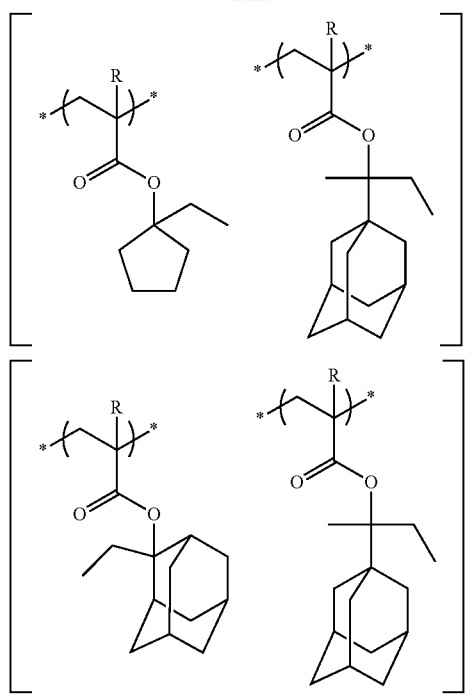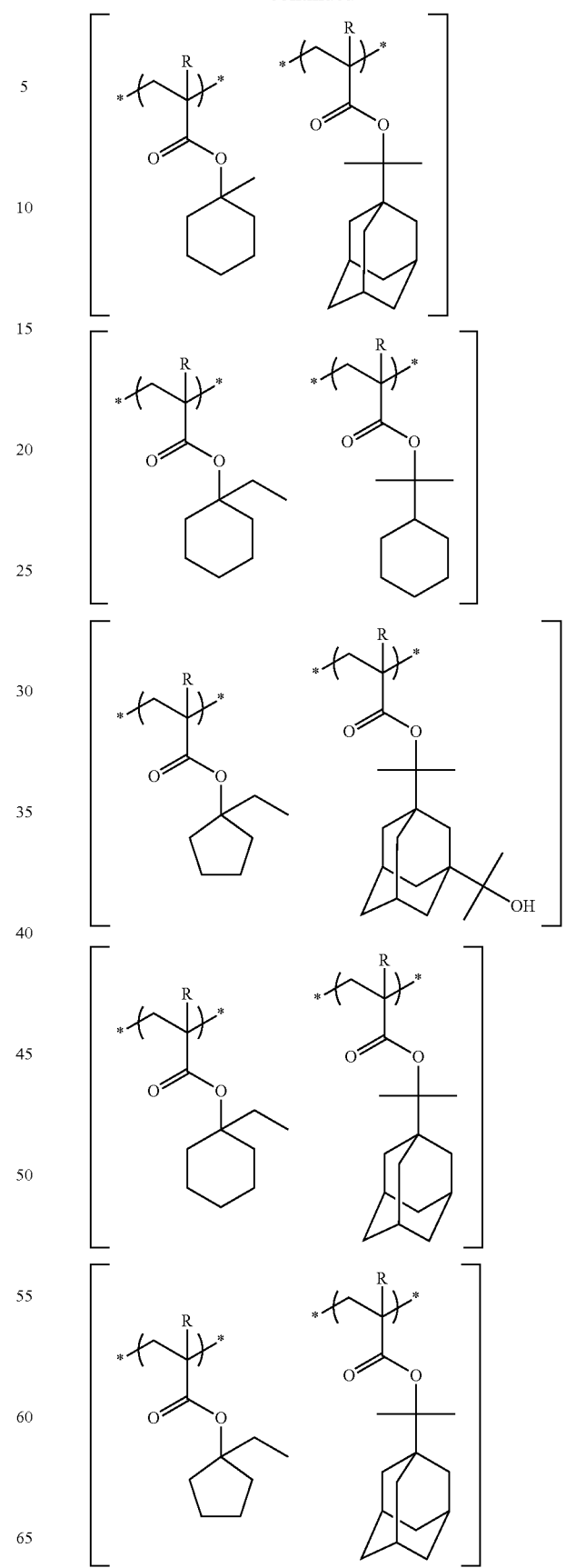

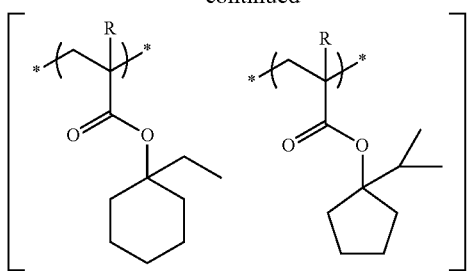
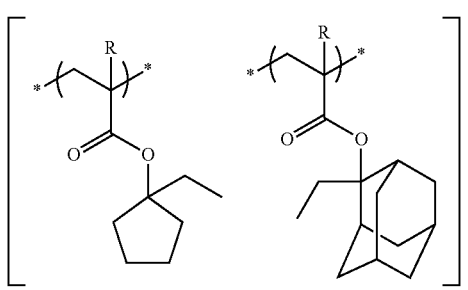
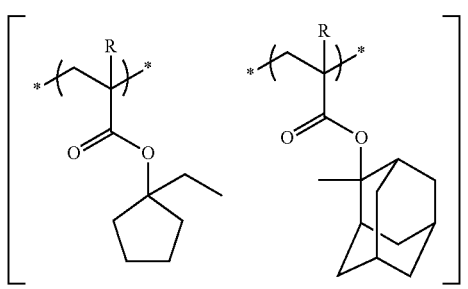
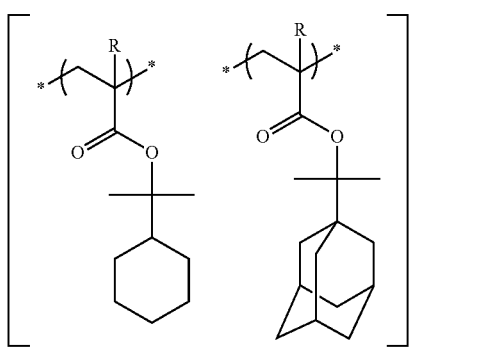
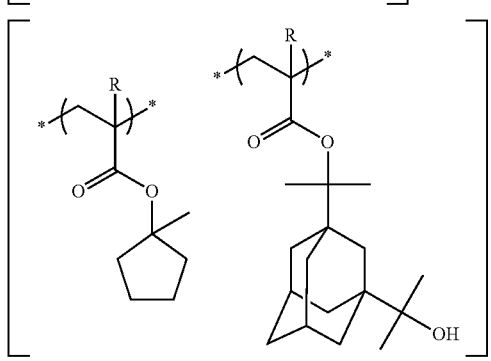
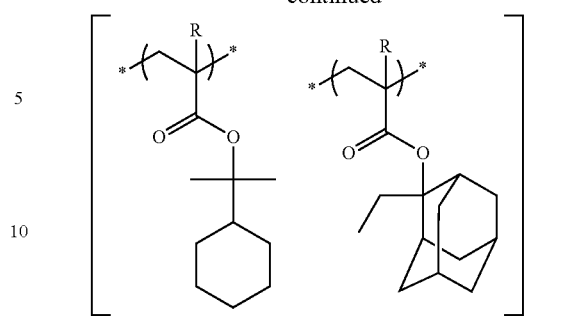
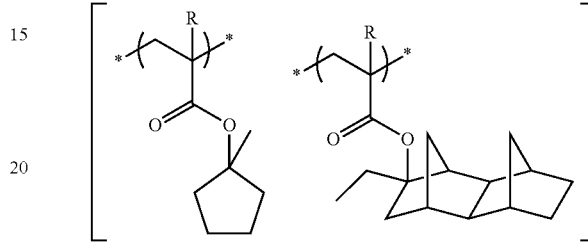
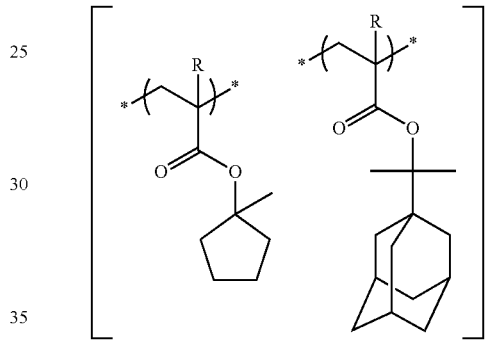
As an embodiment different from the repeating units illustrated above, the following repeating units capable of producing an alcoholic hydroxyl group are also a preferred embodiment.
In specific examples, $Xa_1$ represents a hydrogen atom, $CH_3$, $CF_3$ or $CH_2OH$.
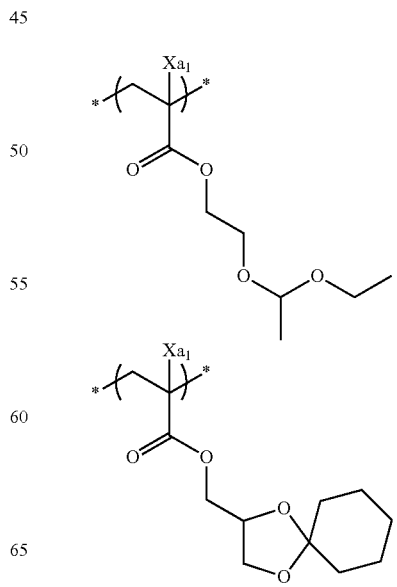

31
-continued
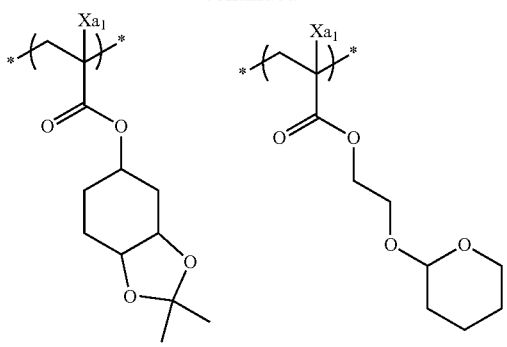
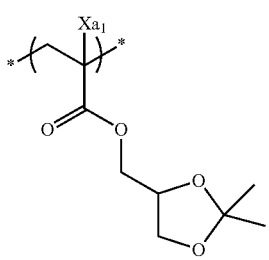
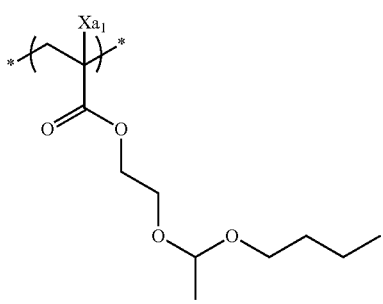
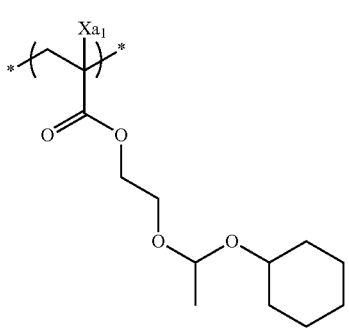
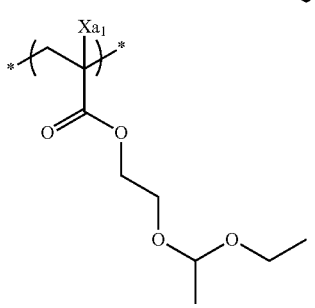
32
-continued
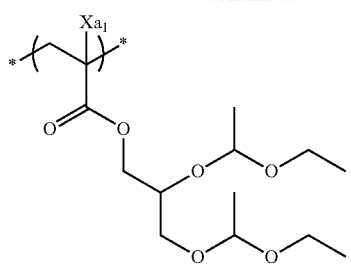
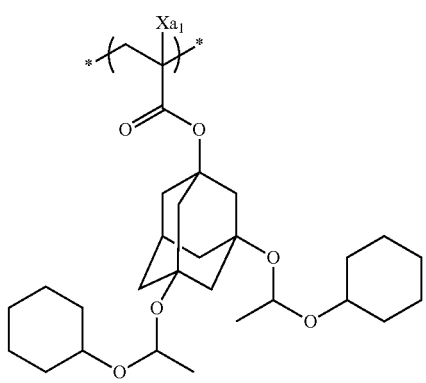
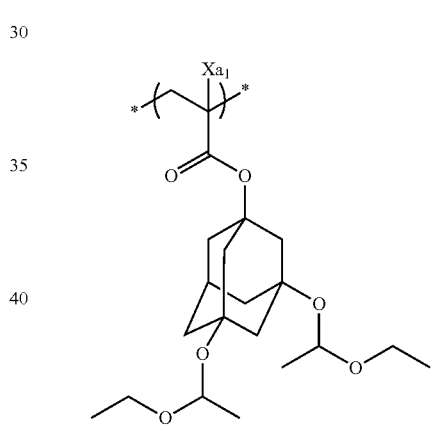
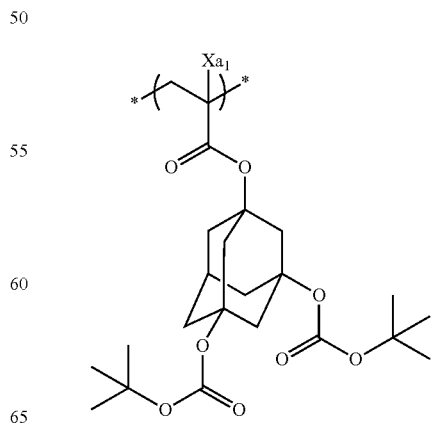

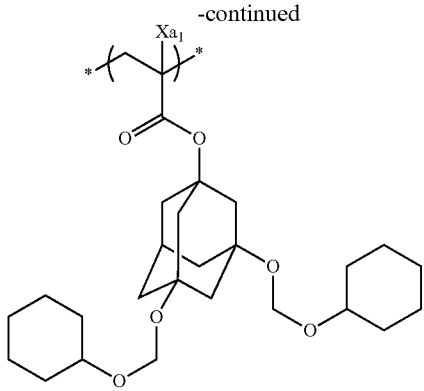

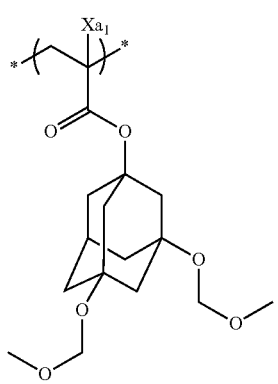

The resin (A) preferably contains a repeating unit having a lactone structure.

Any lactone structure may be used as long as it has a lactone structure, but a 5- to 7-membered ring lactone structure is preferred, and a 5- to 7-membered ring lactone structure to which another ring structure is fused to form a bicyclo structure or a Spiro structure is preferred. It is more preferred to contain a repeating unit having a lactone structure represented by any of the following formulae (LC1-1) to (LC1-17). The lactone structure may be bonded directly to the main chain. Among these lactone structures, (LC1-1), (LC1-4), (LC1-5), (LC1-6), (LC1-13), (LC1-14) and (LC1-17) are preferred, and the lactone structure of (LC1-4) is more preferred. By virtue of using such a specific lactone structure, LWR and development defect are improved.

LC1-1

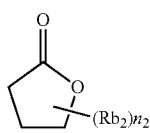

LC1-2

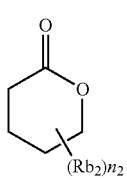

LC1-3

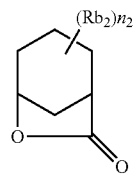

LC1-4

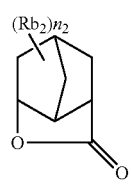

LC1-5

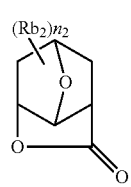

LC1-6

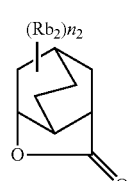

LC1-7

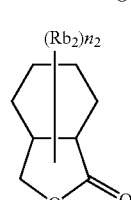

LC1-8

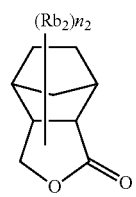

LC1-9

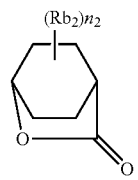

LC1-10

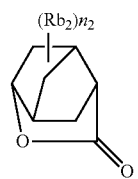

LC1-11
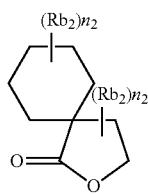

LC1-12
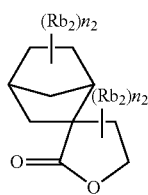

LC1-13
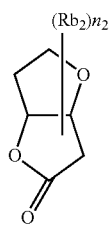

LC1-14
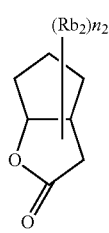

LC1-15
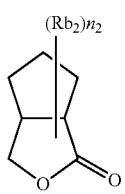

LC1-16
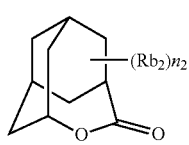

LC1-17
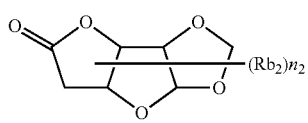

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituent ($Rb_2$), and also, the plurality of substituents ($Rb_2$) may combine together to form a ring.

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

The lactone structure-containing repeating unit is preferably a unit represented by the following formula (III):

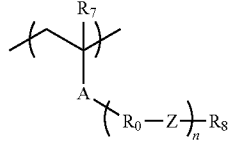

(III)

In formula (III), A represents an ester bond (a group represented by —COO—) or an amido bond (a group represented by —CONH—).

$R_0$ represents, when a plurality of $R_0$s are present, each independently represents, an alkylene group, a cycloalkylene group or a combination thereof.

Z represents, when a plurality of Z's are present, each independently represents, a single bond, an ether bond, an ester bond, an amide bond, a urethane bond (a group represented by

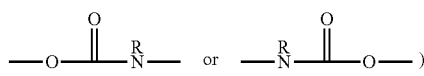  or  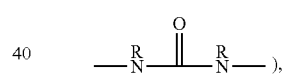 )

or a urea bond (a group represented by

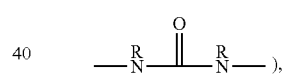 ), wherein each R independently represents a hydrogen atom, an alkyl group, a cycloalkyl group or an aryl group.

$R_8$ represents a monovalent organic group having a lactone structure.

n is the repetition number of the structure represented by —$R_0$—Z— and represents an integer of 0 to 5, preferably 0 or 1. When n is 0, —$R_0$—Z— is not present and a single bond is formed.

$R_7$ represents a hydrogen atom, a halogen atom or an alkyl group.

The alkylene group and cycloalkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group.

The alkyl group in the alkylene group and cycloalkylene group of $R_0$ and in $R_7$ may be substituted, and examples of the substituent include a halogen atom such as fluorine atom, chlorine atom and bromine atom, a mercapto group, a hydroxyl group, an alkoxy group such as methoxy group, ethoxy group, isopropoxy group, tert-butoxy group and benzyloxy group, and an acyloxy group such as acetyloxy group and propionyloxy group.

$R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably from 1 to 5, and examples thereof include a methylene group, an ethylene group and a propylene group. The cycloalkylene group is preferably a cycloalkylene group having a carbon number of 3 to 20, and examples thereof include a cyclohexylene group, a cyclopentylene group, a norbornylene group and an adamantylene group. For bringing out the effects of the present invention, a chain alkylene group is more preferred, and a methylene group is still more preferred.

The lactone structure-containing monovalent organic group represented by $R_8$ is not limited as long as it has a lactone structure. Specific examples thereof include lactone structures represented by formulae (LC 1-1) to (LC 1-17) and among these, a structure represented by (LC1-4) is preferred. Also, structures where $n_2$ in (LC1-1) to (LC1-17) is an integer of 2 or less are more preferred.

$R_8$ is preferably a monovalent organic group having an unsubstituted lactone structure, or a monovalent organic group having a lactone structure containing a methyl group, a cyano group or an alkoxycarbonyl group as the substituent, more preferably a monovalent organic group having a lactone structure containing a cyano group as the substituent (cyano-lactone).

Specific examples of the repeating unit containing a group having a lactone structure are illustrated below, but the present invention is not limited thereto.

In specific examples, R represents a hydrogen atom, an alkyl group which may have a substituent, or a halogen atom, preferably a hydrogen atom, a methyl group, a hydroxymethyl group or an acetyloxymethyl group.

(In the formulae, Rx represents H, $CH_3$, $CH_2OH$ or $CF_3$.)

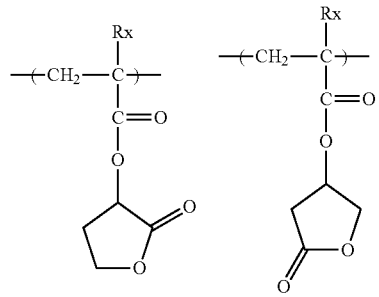

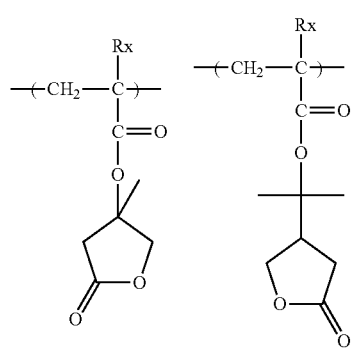

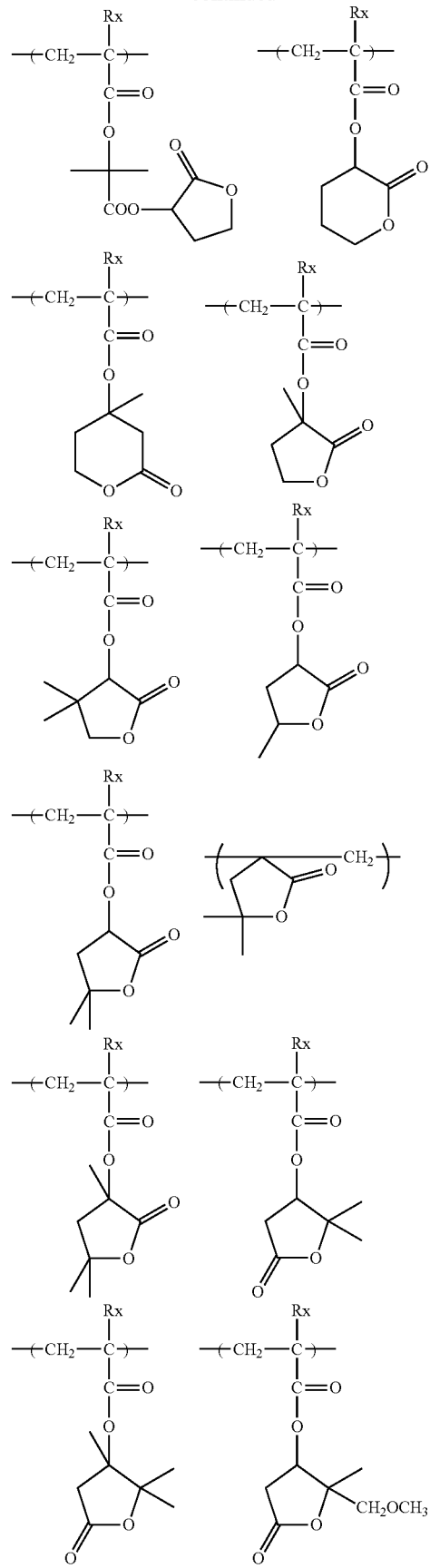

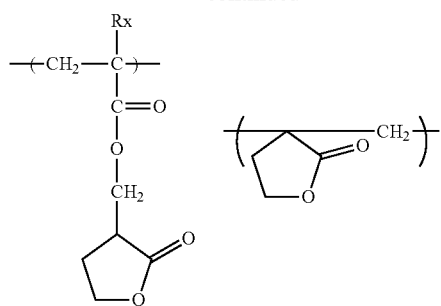
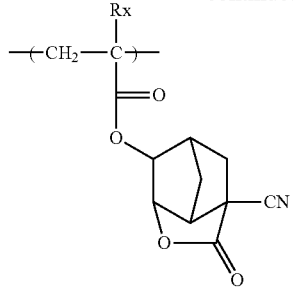
(In the formulae, Rx represents H, CH₃, CH₂OH or CF₃.)
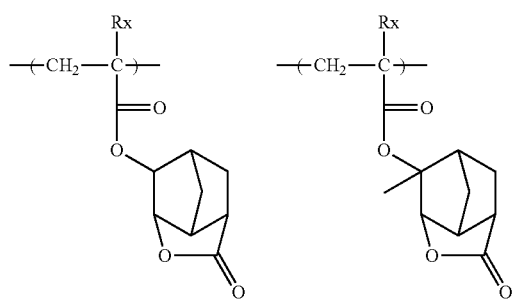
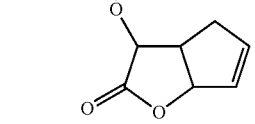
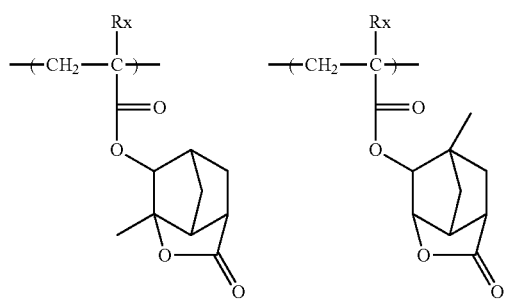
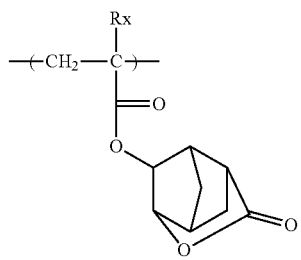
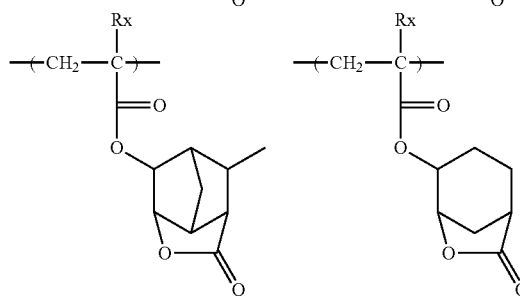
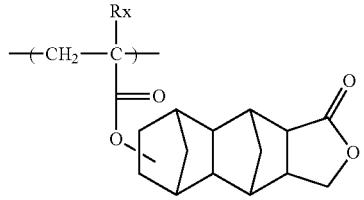
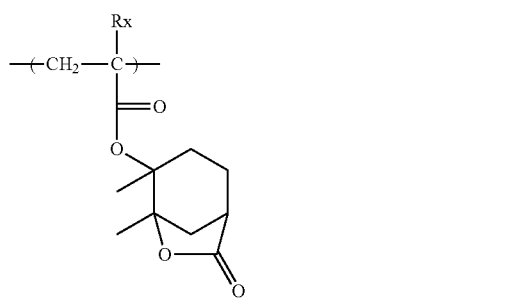
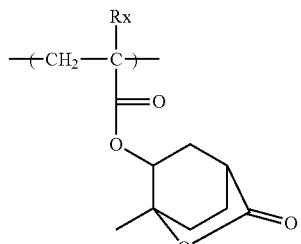
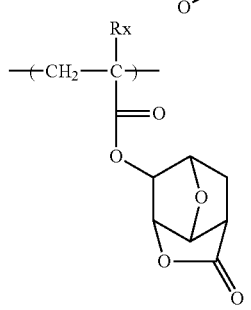

-continued
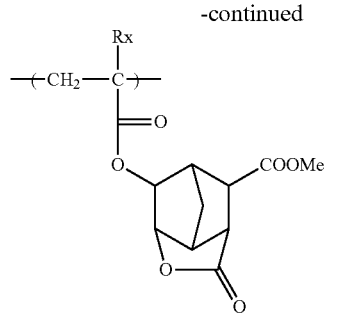
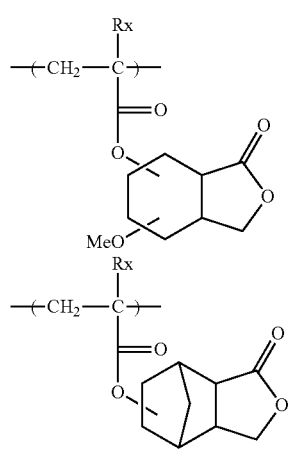
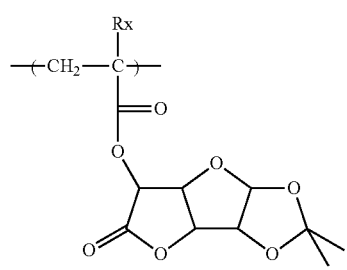
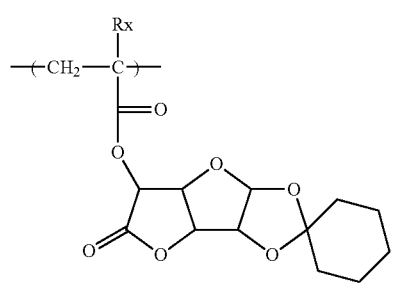
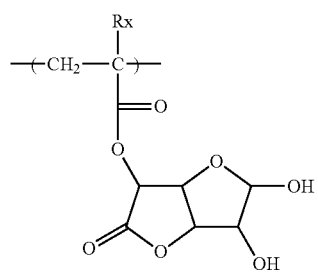
-continued
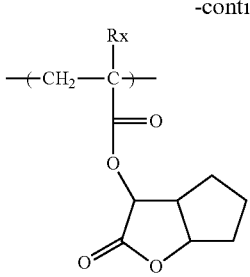
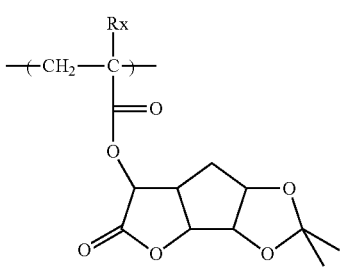
(In the formulae, Rx represents H, CH$_3$, CH$_2$OH or CF$_3$.)
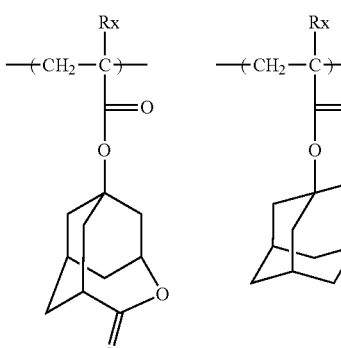
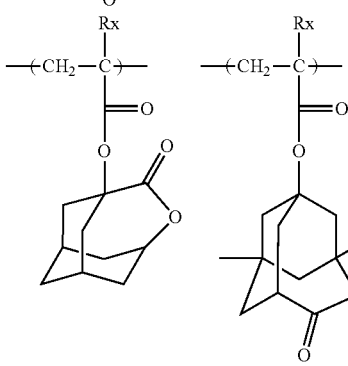
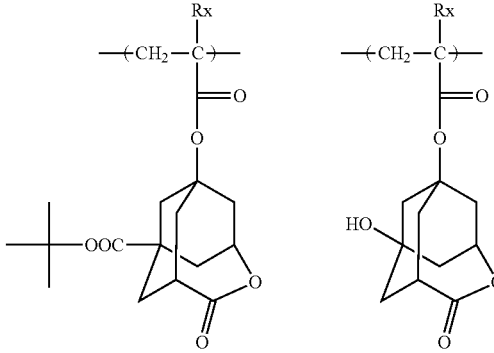

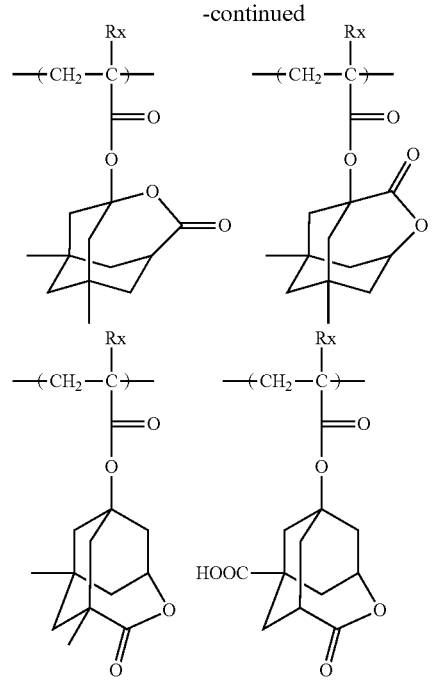
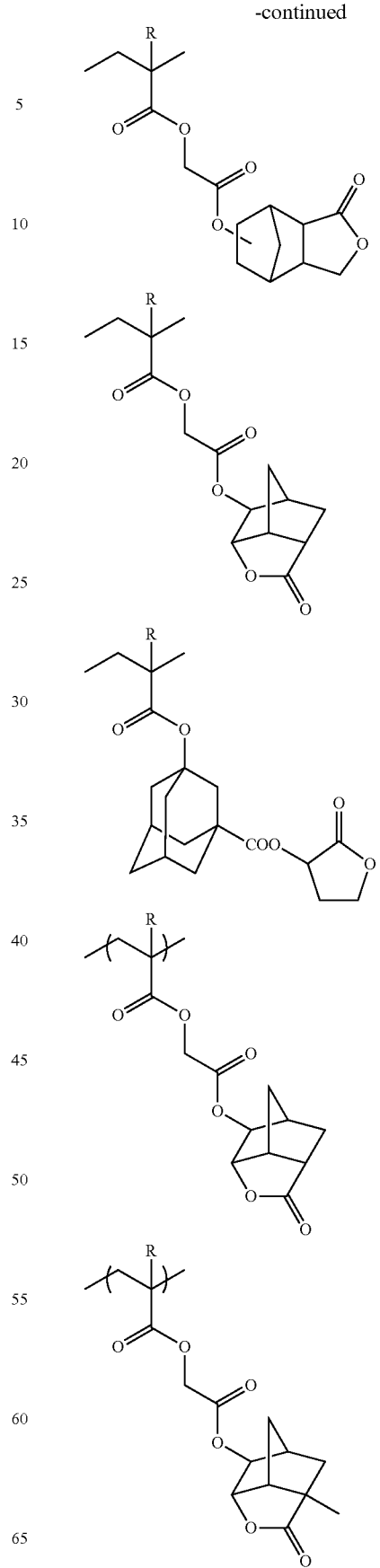

45
-continued
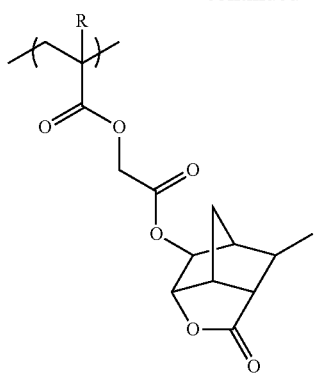
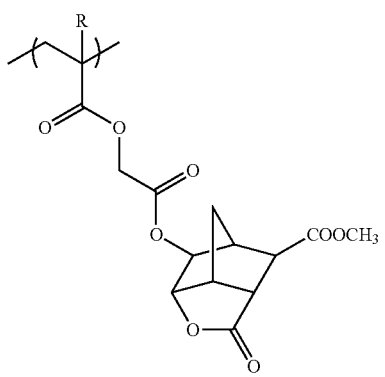
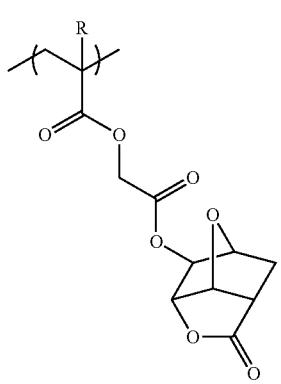
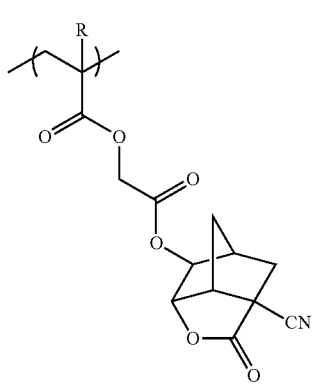
46
-continued
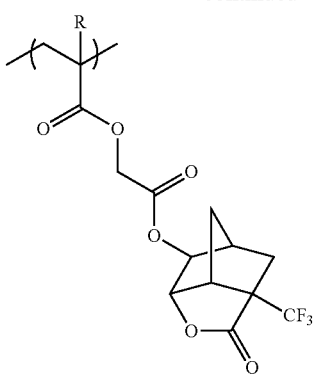
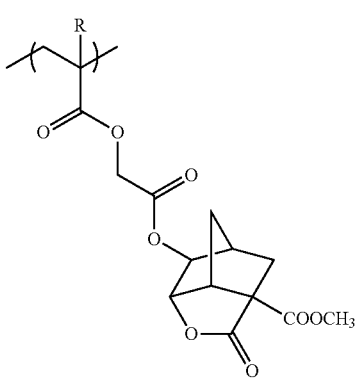
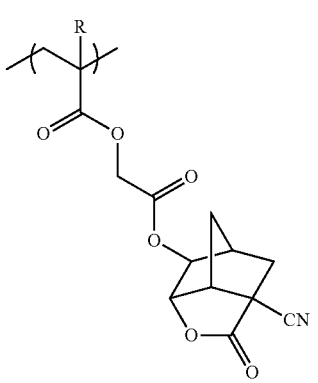
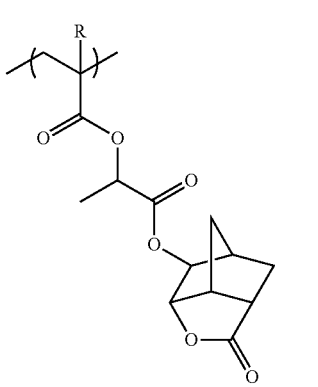

47
-continued
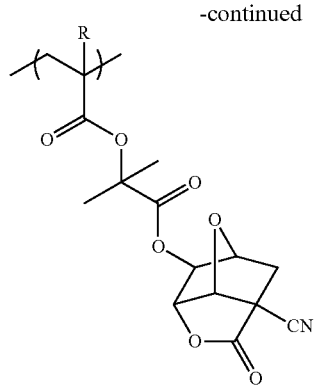
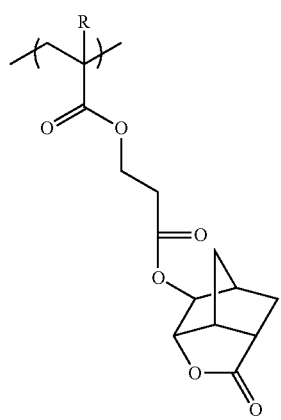
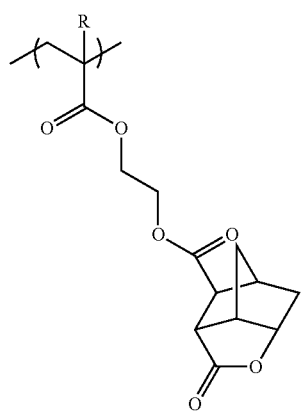
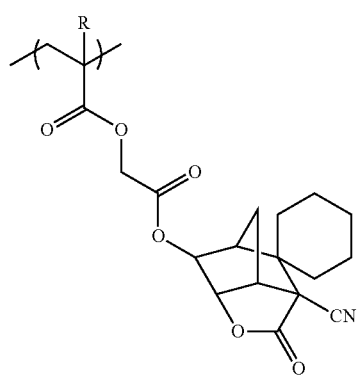
48
-continued
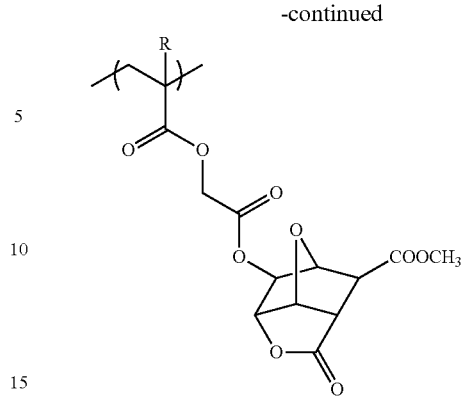
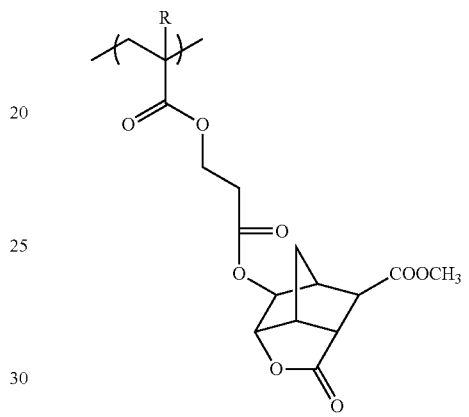
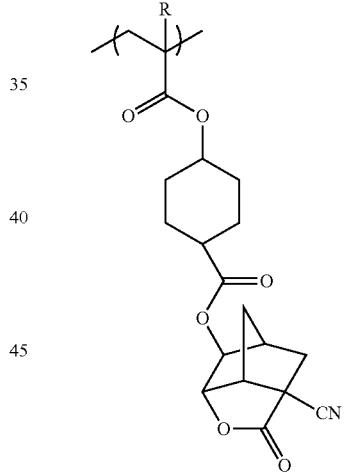
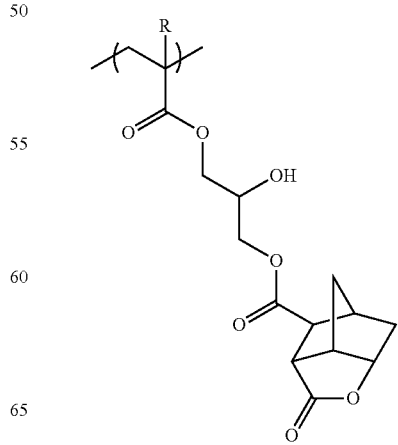

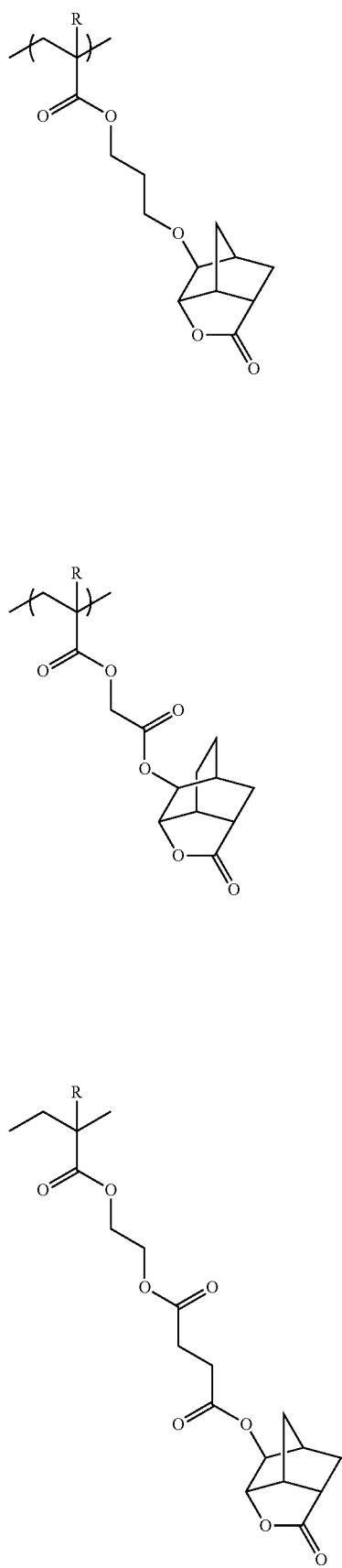
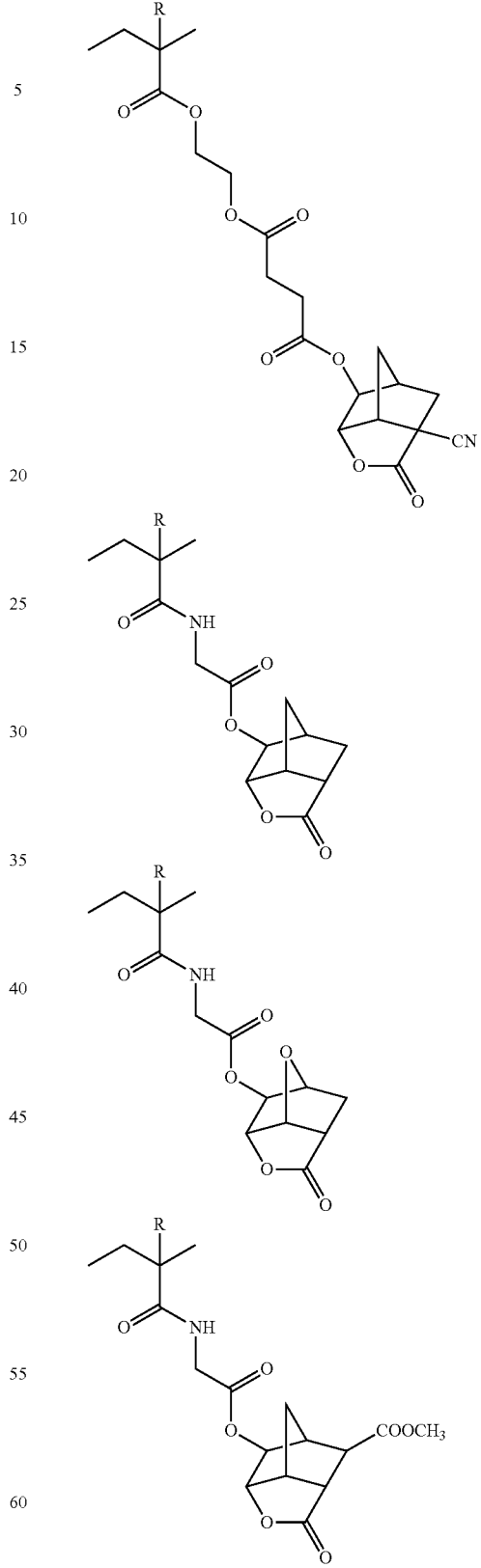
Two or more kinds of lactone structure-containing repeating units may be also used in combination for increasing the effects of the present invention.

The content of the repeating unit having a lactone structure is preferably from 10 to 70 mol %, more preferably from 15 to 65 mol %, still more preferably from 20 to 60 mol %, based on all repeating units in the resin (A).

The resin (A) preferably contains a repeating unit having a hydroxy group or a cyano group, other than formula (III). Thanks to this repeating unit, adherence to substrate and affinity for developer are enhanced. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIId):

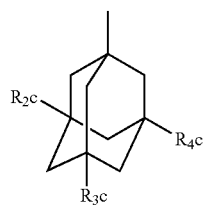
(VIIa)

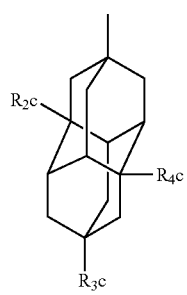
(VIIb)

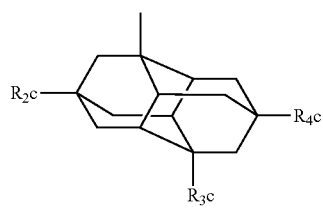
(VIIc)

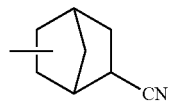
(VIId)

In formulae (VIIa) to (VIIc), each of $R_2c$ to $R_4c$ independently represents a hydrogen atom, a hydroxyl group or a cyano group. However, at least one of $R_2c$ to $R_1c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

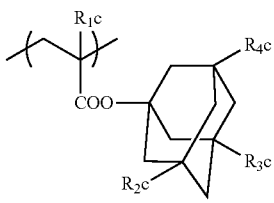
(AIIa)

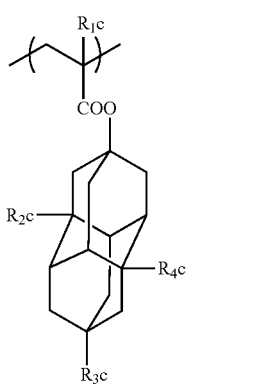
(AIIb)

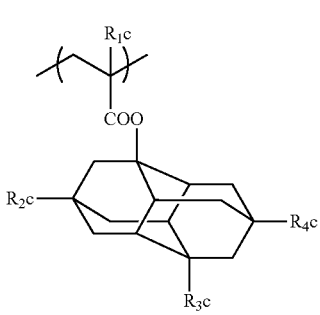
(AIIc)

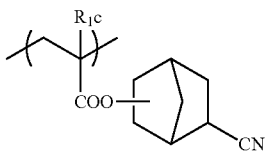
(AIId)

In formulae (AIIa) to (AIId), $R_1c$ represents a hydrogen atom, a methyl group, a trifluoromethyl group or a hydroxymethyl group.

$R_2c$ to $R_1c$ have the same meanings as $R_2c$ to $R_4c$ in formulae (VIIa) to (VIIc).

The content of the repeating unit having a hydroxy group or a cyano group is preferably from 5 to 40 mol %, more preferably from 5 to 30 mol %, still more preferably from 5 to 25 mol %, based on all repeating units in the resin (A).

Specific examples of the repeating unit having a hydroxy group or a cyano group are illustrated below, but the present invention is not limited thereto.

The resin (A) may contain a repeating unit having an acid group. The acid group includes a carboxyl group, a sulfonamide group, a sulfonylimide group, a bissulfonylimide group, and an aliphatic alcohol group substituted with an electron-withdrawing group at the α-position (e.g., hexafluoroisopropanol). It is more preferred to contain a repeating unit having a carboxy group. By virtue of containing a repeating unit having an acid group, the resolution increases in the usage of forming contact holes. As for the repeating unit having an acid group, a repeating unit where the acid group is directly bonded to the main chain of the resin, such as repeating unit by an acrylic acid or a methacrylic acid, a repeating unit where the acid group is bonded to the main chain of the resin through a linking group, and a repeating unit where the acid group is introduced into the terminal of the polymer chain by using an acid group-containing polymerization initiator or chain transfer agent at the polymerization, all are preferred. The linking group may have a monocyclic or polycyclic, cyclic hydrocarbon structure. A repeating unit by an acrylic acid or a methacrylic acid is more preferred.

The resin (A) may or may not contain a repeating unit having an acid group, but in the case of containing a repeating unit having an acid group, the content thereof is preferably 10 mol % or less, more preferably 5 mol % or less, based on all repeating units in the resin (A). In the case where the rein (A) contains a repeating unit having an acid group, the content of the acid group-containing repeating unit in the resin (A) is usually 1 mol % or more Specific examples of the repeating unit having an acid group are illustrated below, but the present invention is not limited thereto.

In specific examples, Rx represents H, $CH_3$, $CH_2OH$ or $CF_3$.

-continued

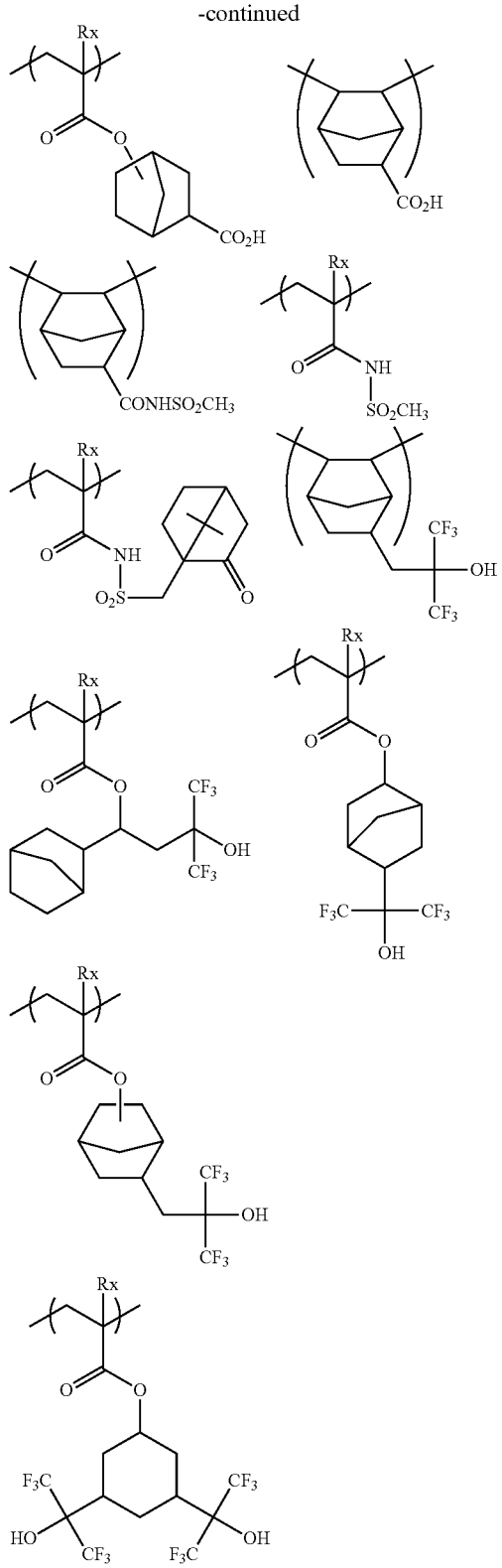

The resin (A) may further contain a repeating unit having an alicyclic hydrocarbon structure free from a polar group (for example, the above-described acid group, a hydroxyl group or a cyano group) and not exhibiting acid decomposability. Thanks to this repeating unit, not only dissolving out of low molecular components from the resist film into the immersion liquid at the immersion exposure can be reduced but also the solubility of the resin at the development using an organic solvent-containing developer can be appropriately adjusted. Such a repeating unit includes a repeating unit represented by formula (IV):

(IV)

In formula (IV), $R_5$ represents a hydrocarbon group having at least one cyclic structure and having no polar group.

Ra represents a hydrogen atom, an alkyl group, or a $-CH_2-O-Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo [4.3.1.1$^{2,5}$]undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricycle[5,2,1,0$^{2,6}$]decanyl group. Of these crosslinked cyclic hydrocarbon rings, a norbornyl group and an adamantyl group are more preferred.

These alicyclic hydrocarbon groups may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group with a hydrogen atom being substituted for, and an amino group with a hydrogen atom being substituted for.

Examples of the substituent for hydrogen atom include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (A) may or may not contain a repeating unit having a polar group-free alicyclic hydrocarbon structure and not exhibiting acid decomposability, but in the case of containing the repeating unit, the content thereof is preferably from 1 to 40 mol %, more preferably from 5 to 20 mol %, based on all repeating units in the resin (A).

Specific examples of the repeating unit having a polar group-free alicyclic hydrocarbon structure and not exhibiting acid decomposability are illustrated below, but the present invention is not limited thereto. In the formulae, Ra represents H, $CH_3$, $CH_2OH$ or $CF_3$.

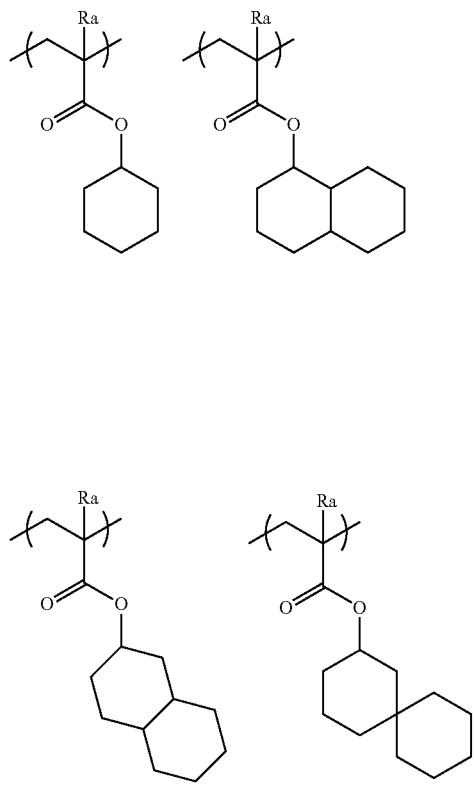

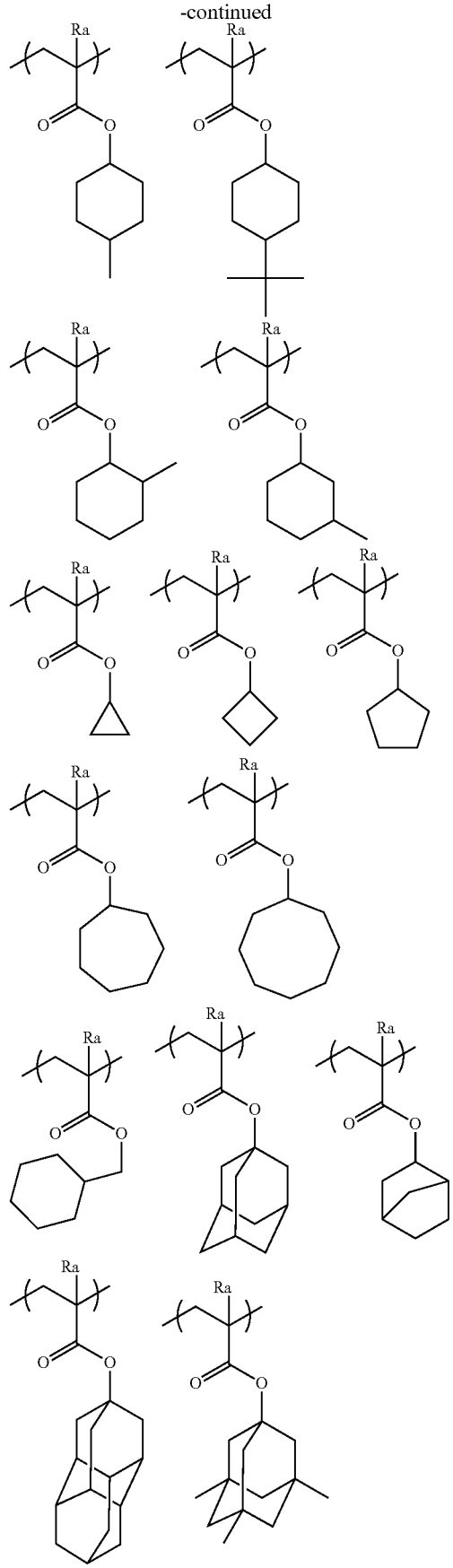

-continued

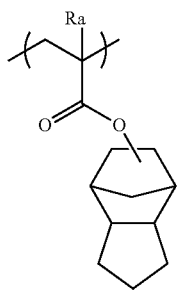

The resin (A) for use in the composition of the present invention may contain, in addition to the above-described repeating structural units, various repeating structural units for the purpose of controlling the dry etching resistance, suitability for standard developer, adherence to substrate, resist profile and properties generally required of an resist composition, such as resolution, heat resistance and sensitivity.

Examples of such a repeating structural unit include, but are not limited to, repeating structural units corresponding to the monomers described below.

Thanks to such a repeating structural unit, the performance required of the resin used in the composition of the present invention, particularly (1) solubility for coating solvent,
(2) film-forming property (glass transition point),
(3) alkali developability,
(4) film loss (selection of hydrophilic, hydrophobic or alkali-soluble group),
(5) adherence of unexposed area to substrate,
(6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A) for use in the resist composition of the present invention, the molar ratio of respective repeating structural units contained is appropriately set to control dry etching resistance of the resist composition, suitability for standard developer, adherence to substrate, resist profile and performances generally required of the resist composition, such as resolution, heat resistance and sensitivity.

In the case where the composition of the present invention is used for ArF exposure, in view of transparency to ArF light, the resin (A) for use in the composition of the present invention preferably has substantially no aromatic group (specifically, the ratio of an aromatic group-containing repeating unit in the resin is preferably 5 mol % or less, more preferably 3 mol % or less, and ideally 0 mol %, that is, the resin does not have an aromatic group), and the resin (A) preferably has a monocyclic or polycyclic alicyclic hydrocarbon structure.

The resin (A) for use in the composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the content of the acrylate-based repeating unit is preferably 50 mol % or less based on all repeating units. A copolymerized polymer containing from 20 to 50 mol % of an acid decomposable group-containing (meth)acrylate-based repeating unit (in the case of containing the acid decomposable repeating units (A2) and/or (B), the total amount of the acid decomposable repeating unit (A) and the acid decomposable repeating units (A2) and/or (B)), from 20 to 50 mol % of a lactone group-containing (meth)acrylate-based repeating unit, from 5 to 30 mol % of a (meth)acrylate-based repeating unit having an alicyclic hydrocarbon structure substituted with a hydroxyl group or a cyano group, and from 0 to 20 mol % of other (meth)acrylate-based repeating units is also preferred.

In the case of irradiating the composition of the present invention with KrF excimer laser light, electron beam, X-ray or high-energy beam at a wavelength of 50 nm or less (e.g., EUV), the resin (A) preferably further contains a hydroxystyrene-based repeating unit. It is more preferred to contain a hydroxystyrene-based repeating unit, a hydroxystyrene-based repeating unit protected with an acid-decomposable group, and an acid-decomposable repeating unit such as tertiary alkyl (meth)acrylate.

Preferred examples of the hydroxystyrene-based repeating unit having an acid-decomposable group include repeating units composed of a tert-butoxycarbonyloxystyrene, a 1-alkoxyethoxystyrene and a tertiary alkyl(meth)acrylate. Repeating units composed of a 2-alkyl-2-adamantyl(meth)acrylate and a dialkyl(1-adamantyl)methyl(meth)acrylate are more preferred.

The resin (A) for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the photosensitive composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction solution is poured in a solvent, and the desired polymer is collected, for example, by a powder or solid recovery method. The concentration at the reaction is from 5 to 50 mass %, preferably from 10 to 30 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from, for example, a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

The weight average molecular weight of the resin (A) for use in the present invention is preferably from 1,000 to 200,000, more preferably from 2,000 to 20,000, still more preferably from 3,000 to 15,000, in terms of polystyrene by the GPC method. When the weight average molecular weight is from 1,000 to 200,000, reduction in the heat resistance and dry etching resistance can be avoided and at the same time, the film-forming property can be prevented from deterioration due to impairment of developability or increase in the viscosity.

The polydispersity (molecular weight distribution) is usually from 1.0 to 3.0, preferably from 1.0 to 2.6, more preferably from 1.0 to 2.0, still more preferably from 1.3 to 2.0. As the molecular weight distribution is smaller, the resolution and resist profile are more excellent, the side wall of the resist pattern is smoother, and the roughness is more improved.

In the resist composition of the present invention, the content of the resin (A) in the entire composition is preferably from 30 to 99 mass %, more preferably from 50 to 95 mass %, still more preferably from 55 to 95 mass %, yet still more preferably from 65 to 95 mass %, based on the entire solid content.

In the present invention, as for the resin (A), one kind of a resin may be used or a plurality of kinds of resins may be used in combination. Also, a resin (A) and another resin not coming under the resin (A) may be used in combination. In this case, the resin (A) is preferably present in a ratio of 50 wt % or more based on all resins.

[3] (B) Compound Capable of Generating an Acid Upon Irradiation with an Actinic Ray or Radiation The composition of the present invention contains a compound capable of generating an acid upon irradiation with an actinic ray or radiation (hereinafter, sometimes referred to as an "acid generator").

The acid generator which can be used may be appropriately selected from a photo-initiator for cationic photopolymerization, a photo-initiator for radical photopolymerization, a photo-decoloring agent for dyes, a photo-discoloring agent, a known compound capable of generating an acid upon irradiation with an actinic ray or radiation, which is used for microresist or the like, and a mixture thereof Examples thereof include a diazonium salt, a phosphonium salt, a sulfonium salt, an iodonium salt, imidosulfonate, oxime sulfonate, diazodisulfone, disulfone, and o-nitrobenzyl sulfonate.

Out of the acid generators, preferred compounds include compounds represented by the following formulae (ZI), (ZII) and (ZIII):

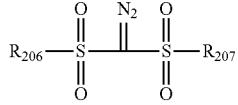

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methyl anion.

The non-nucleophilic anion is an anion having an extremely low ability of causing a nucleophilic reaction and this anion can suppress the decomposition with aging due to intramolecular nucleophilic reaction. Thanks to this anion, the aging stability of the resist composition is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion and aliphatic carboxylate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent on this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8 or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl)benzenesulfonate anion.

As the non-nucleophilic anion of $Z^-$, an anion capable of producing an acid represented by the following formula (I) is also preferred.

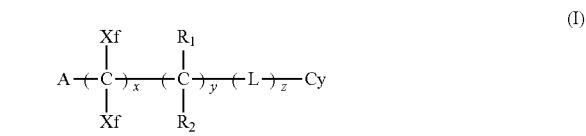

(I)

In the formula, each Xf independently represents a fluorine atom or an alkyl group substituted with at least one fluorine atom.

Each of $R_1$ and $R_2$ independently represents a hydrogen atom, a fluorine atom or an alkyl group, and when a plurality of $R_1$'s or $R_2$'s are present, each $R_1$ or $R_2$ may be the same as or different from every other $R_1$ or $R_2$.

L represents a divalent linking group, and when a plurality of L's are present, each L may be the same as or different from every other L.

Cy represents a cyclic organic group.

A represents $HO_3S-$ or $Rf-SO_2-NH-SO_2-$. Rf represents an alkyl group having at least one fluorine atom, a cycloalkyl group having at least one fluorine atom, or an aryl group having at least one fluorine atom (the substitution on cycloalkyl and aryl group may be substitution with an alkyl fluoride such as $-CF_3$ but not with a fluorine atom; specific examples of the alkyl group as Rf having at least one fluorine atom are the same as specific examples of Xf described later, specific examples of the cycloalkyl group as Rf having at least one fluorine atom include perfluorocyclopentyl and perfluorocyclohexyl, specific examples of the aryl group as Rf having at least one fluorine atom include perfluorophenyl, and each of these groups may be substituted with a substituent not containing a fluorine atom).

x represents an integer of 1 to 20, y represents an integer of 0 to 10, and z represents an integer of 0 to 10.

Formula (I) is described in more detail below.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xfs are a fluorine atom.

The alkyl group of $R_1$ and $R_2$ is preferably an alkyl group having a carbon number of 1 to 4, which may have a substituent (preferably fluorine atom), more preferably a perfluoroalkyl group having a carbon number of 1 to 4. Specific examples of the alkyl group having a substituent of $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R_1$ and $R_2$ is preferably a fluorine atom or $CF_3$.

y is preferably from 0 to 4, more preferably 0. x is preferably from 1 to 8, more preferably from 1 to 4, still more preferably 1. z is preferably from 0 to 8, more preferably from 0 to 4.

The divalent linking group of L is not particularly limited and includes $-COO-$, $-OCO-$, $-CO-$, $-O-$, $-CONR-$ (R is a hydrogen atom or an alkyl group), $-S-$, $-SO-$, $-SO_2-$, an alkylene group, a cycloalkylene group, an alkenylene group, and a linking group formed by combining a plurality of these members, and a linking group having a total carbon number of 12 or less is preferred. Above all, $-COO-$, $-OCO-$, $-CO-$, $-O-$, $-CONR-$ and $-SO_2-$ are preferred, $-COO-$, $-OCO-$, $-CONR-$ and $-SO_2-$ are more preferred.

The cyclic organic group of Cy is not particularly limited as long as it has a cyclic structure, and examples thereof include an alicyclic group, an aryl group and a heterocyclic group (including not only those having aromaticity but also those having no aromaticity, for example, a tetrahydropyrane ring and a lactone ring structure).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that diffusion in the film at the PEB (post-exposure baking) step can be suppressed and MEEF (mask error enhancement factor) can be improved.

The aryl group may be monocyclic or polycyclic and includes a benzene ring, a naphthalene ring, a phenanthrene ring and an anthracene ring. Among these, naphthalene having low absorbance is preferred in view of absorbance for light at 193 nm.

The heterocyclic group may be monocyclic or polycyclic includes those derived from a furan ring, a thiophene ring, a benzofuran ring, a benzothiophene ring, a dibenzofuran ring, a dibenzothiophene ring, a pyridine ring and a decahydroisoquinoline ring. In particular, those derived from a furan ring, a thiophene ring, a pyridine ring and a decahydroisoquinoline ring are preferred.

The above-described cyclic organic group may have a substituent, and examples of the substituent include an alkyl group (may be any of linear, branched and cyclic, preferably having a carbon number of 1 to 12), a cycloalkyl group (may be any of monocyclic, polycyclic and spirocyclic, preferably having a carbon number of 3 to 20), an aryl group (preferably having a carbon number of 6 to 14), a hydroxyl group, an alkoxy group, an ester group, an amide group, a urethane group, a ureido group, a thioether group, a sulfonamide group, and a sulfonic acid ester group. Incidentally, the carbon constituting the cyclic organic group (the carbon contributing to ring formation) may be carbonyl carbon.

Examples of the organic group represented by $R_{201}$, $R_{202}$ and $R_{203}$ include corresponding groups in the later-described compounds (ZI-1), (ZI-2), (ZI-3) and (ZI-4).

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI) through a single bond or a linking group.

Compounds (ZI-1), (ZI-2), (ZI-3) and (ZI-4) described below are more preferred as the component (ZI).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole residue group, a furan residue group, a thiophene residue group, an indole residue group, a benzofuran residue group and a benzothiophene residue group. In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $Z_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl), and a cycloalkyl group having a carbon number of 3 to 10 (e.g., cyclopentyl, cyclohexyl, norbornyl). The alkyl group is more preferably. a 2-oxoalkyl group or an alkoxycarbonylmethyl group. The cycloalkyl group is more preferably a 2-oxocycloalkyl group.

The 2-oxoalkyl group may be either linear or branched and is preferably a group having $>C=O$ at the 2-position of the above-described alkyl group.

The 2-oxocycloalkyl group is preferably a group having $>C=O$ at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is described below.

The compound (ZI-3) is a compound represented by the following formula (ZI-3), and this is a compound having a phenacylsulfonium salt structure.

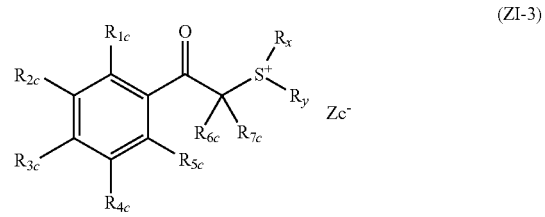

In formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$, may combine together to form a ring structure. This ring structure may contain an oxygen atom, a sulfur atom, a ketone group, an ester bond or an amide bond.

The ring structure includes an aromatic or non-aromatic hydrocarbon ring, an aromatic or non-aromatic heterocyclic ring, and a polycyclic condensed ring formed by combining two or more of these rings. The ring structure includes a 3- to 10-membered ring and is preferably a 4- to 8-membered ring, more preferably a 5- or 6-membered ring.

Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

The group formed by combining a pair of $R_{5c}$ and $R_{6c}$ or a pair of $R_{5c}$ and $R_x$ is preferably a single bond or an alkylene group, and examples of the alkylene group include a methylene group and an ethylene group.

$Z_c^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 10 (e.g., cyclopentyl, cyclohexyl).

The aryl group as $R_{1c}$ to $R_{5c}$ is preferably an aryl group having a carbon number of 5 to 15, and examples thereof include a phenyl group and a naphthyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy), or a cyclic alkoxy group having a carbon number of 3 to 10 (e.g., cyclopentyloxy, cyclohexyloxy).

Specific examples of the alkoxy group in the alkoxycarbonyl group of $R_{1c}$ to $R_{5c}$ are the same as specific examples of the alkoxy group of $R_{1c}$ to $R_{5c}$.

Specific examples of the alkyl group in the alkylcarbonyloxy group and alkylthio group of $R_{1c}$ to $R_{5c}$ are the same as specific examples of the alkyl group of $R_{1c}$ to $R_{5c}$.

Specific examples of the cycloalkyl group in the cycloalkylcarbonyloxy group of $R_{1c}$ to $R_{5c}$ are the same as specific examples of the cycloalkyl group of $R_{1c}$ to $R_{5c}$.

Specific examples of the aryl group in the aryloxy group and arylthio group of $R_{1c}$ to $R_{5c}$ are the same as specific examples of the aryl group of $R_{1c}$ to $R_{5c}$.

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

The ring structure which may be formed by combining any two or more members out of $R_{1c}$ to $R_{5c}$ with each other is preferably a 5- or 6-membered ring, more preferably a 6-membered ring (for example, phenyl ring).

The ring structure which may be formed by combining $R_{5c}$ and $R_{6c}$ with each other includes a 4- or higher-membered ring (preferably a 5- or 6-membered ring) formed together with the carbonyl carbon atom and carbon atom in formula (I) by combining $R_{5c}$ and $R_{6c}$ with each other to constitute a single bond or an alkylene group (e.g., methylene, ethylene).

The aryl group as $R_{6c}$ and $R_{7c}$ is preferably an aryl group having a carbon number of 5 to 15, and examples thereof include a phenyl group and a naphthyl group.

An embodiment where both $R_{6c}$ and $R_{7c}$ are an alkyl group is preferred, an embodiment where each of $R_{6c}$ and $R_{7c}$ is a linear or branched alkyl group having a carbon number of 1 to 4 is more preferred, and an embodiment where both are a methyl group is still more preferred.

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group as $R_x$ and $R_y$ include a group having >C=O at the 2-position of the alkyl group or cycloalkyl group of $R_{1c}$ to $R_{7c}$.

Examples of the alkoxy group in the alkoxycarbonylalkyl group as $R_x$ and $R_y$ are the same as those of the alkoxy group of $R_{1c}$ to $R_{5c}$. The alkyl group is, for example, an alkyl group having a carbon number of 1 to 12, preferably a linear alkyl group having a carbon number of 1 to 5 (e.g., methyl, ethyl).

The allyl group as $R_x$ and $R_y$ is not particularly limited but is preferably an unsubstituted allyl group or an allyl group substituted with a monocyclic or polycyclic cycloalkyl group (preferably a cycloalkyl group having a carbon number of 3 to 10).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having a carbon number of 3 to 10).

The ring structure which may be formed by combining $R_{5c}$ and $R_x$ with each other includes a 5- or higher-membered ring (preferably a 5-membered ring) formed together with the sulfur atom and carbonyl carbon atom in formula (I) by combining $R_{5c}$ and $R_x$ with each other to constitute a single bond or an alkylene group (e.g., methylene, ethylene).

The ring structure which may be formed by combining $R_x$ and $R_y$ with each other includes a 5- or 6-membered ring formed by divalent $R_x$ and $R_y$ (for example, a methylene group, an ethylene group or a propylene group) together with the sulfur atom in formula (ZI-3), and a 5-membered ring (that is, a tetrahydrothiophene ring) is particularly preferred.

Each of $R_x$ and $R_y$ is an alkyl or cycloalkyl group having a carbon number of preferably 4 or more, more preferably 6 or more, still more preferably 8 or more.

$R_{1c}$ to $R_{7c}$, $R_x$ and $R_y$ may further have a substituent, and examples of the substituent include a halogen atom (e.g., fluorine), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group and an aryloxycarbonyloxy group.

The alkyl group above includes, for example, a linear or branched alkyl group having a carbon number of 1 to 12, such as methyl group, ethyl group, n-propyl group, i-propyl group, n-butyl group, 2-methylpropyl group, 1-methylpropyl group and tert-butyl group.

The cycloalkyl group above includes, for example, a cycloalkyl group having a carbon number of 3 to 10, such as cyclopentyl group and cyclohexyl group.

The aryl group above includes, for example, an aryl group having a carbon number of 6 to 15, such as phenyl group and naphthyl group.

The alkoxy group above includes, for example, a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

The aryloxy group above includes, for example, an aryloxy group having a carbon number of 6 to 10, such as phenyloxy group and naphthyloxy group.

The acyl group above includes, for example, a linear or branched acyl group having a carbon number of 2 to 12, such as acetyl group, propionyl group, n-butanoyl group, i-butanoyl group, n-heptanoyl group, 2-methylbutanoyl group, 1-methylbutanoyl group and tert-heptanoyl group.

The arylcarbonyl group above includes, for example, an arylcarbonyl group having a carbon number of 6 to 10, such as phenylcarbonyl group and naphthylcarbonyl group.

The alkoxyalkyl group above includes, for example, a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

The aryloxyalkyl group above includes, for example, an aryloxyalkyl group having a carbon number of 7 to 12, such as phenyloxymethyl group, phenyloxyethyl group, naphthyloxymethyl group and naphthyloxyethyl group.

The alkoxycarbonyl group above includes, for example, a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

The aryloxycarbonyl group above includes, for example, an aryloxycarbonyl group having a carbon number of 7 to 11, such as phenyloxycarbonyl group and naphthyloxycarbonyl group.

The alkoxycarbonyloxy group above includes, for example, a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The aryloxycarbonyloxy group above includes, for example, an aryloxycarbonyloxy group having a carbon number of 7 to 11, such as phenyloxycarbonyloxy group and naphthyloxycarbonyloxy group.

In formula (ZI-3), it is more preferred that each of $R_{1c}$, $R_{2c}$, $R_{4c}$, and $R_{5c}$ independently represents a hydrogen atom and $R_{3c}$ represents a group except for hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Specific examples of the cation of the compound represented by formula (ZI-2) or (ZI-3) are illustrated below.

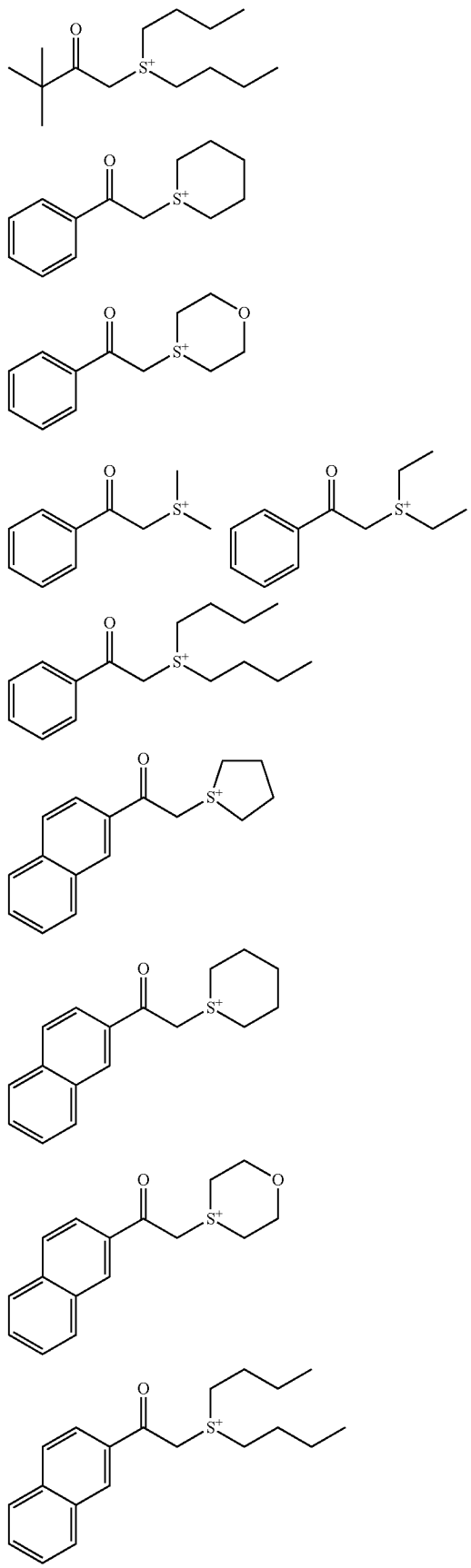

-continued
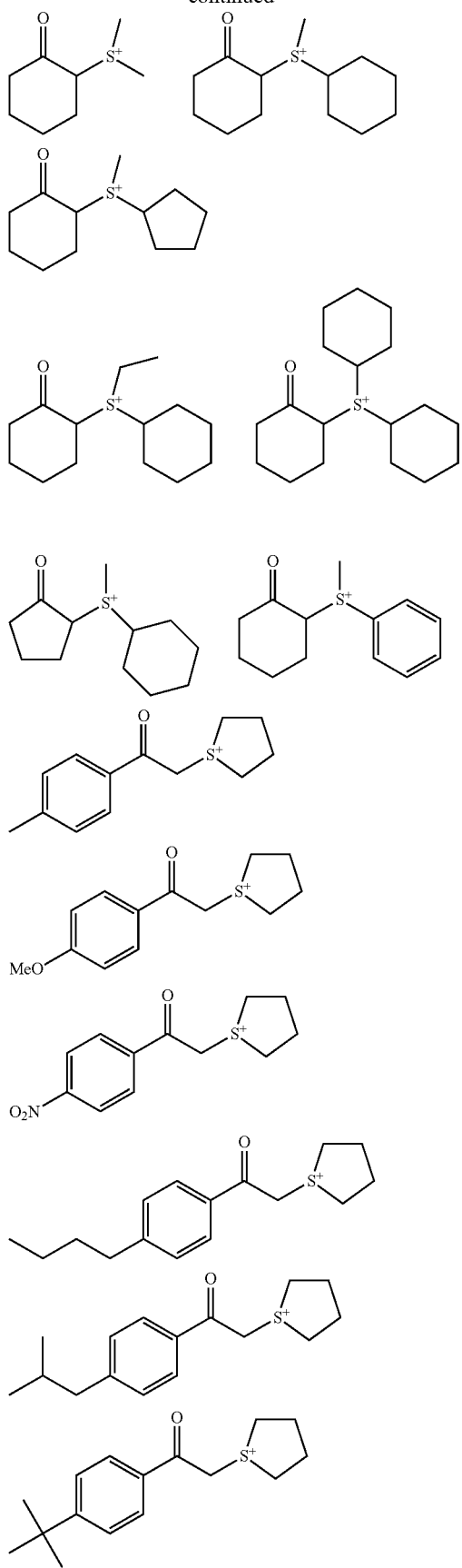
-continued
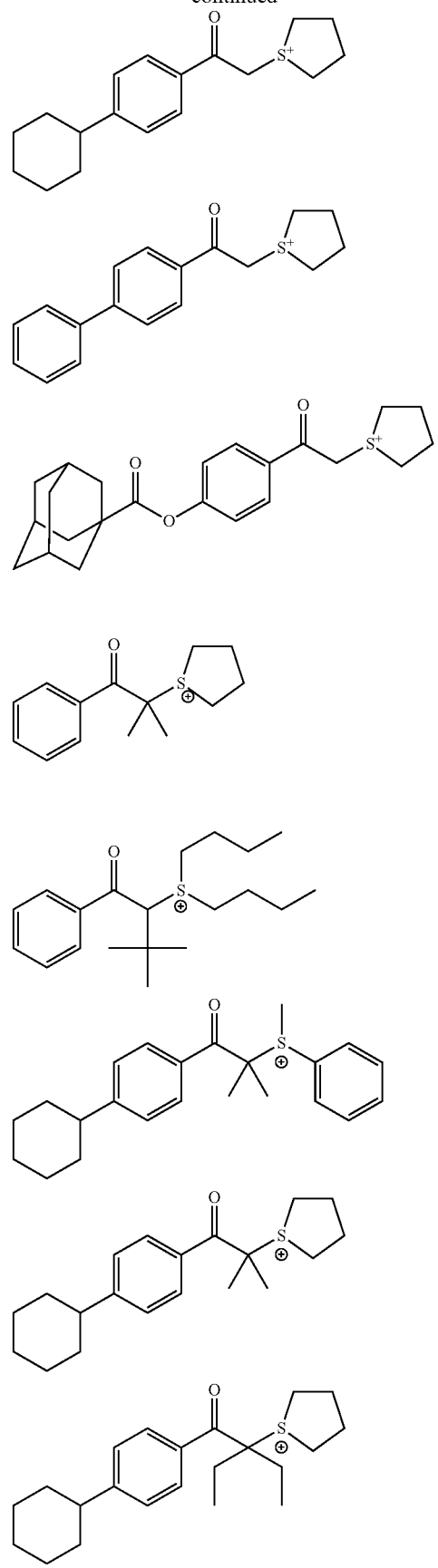

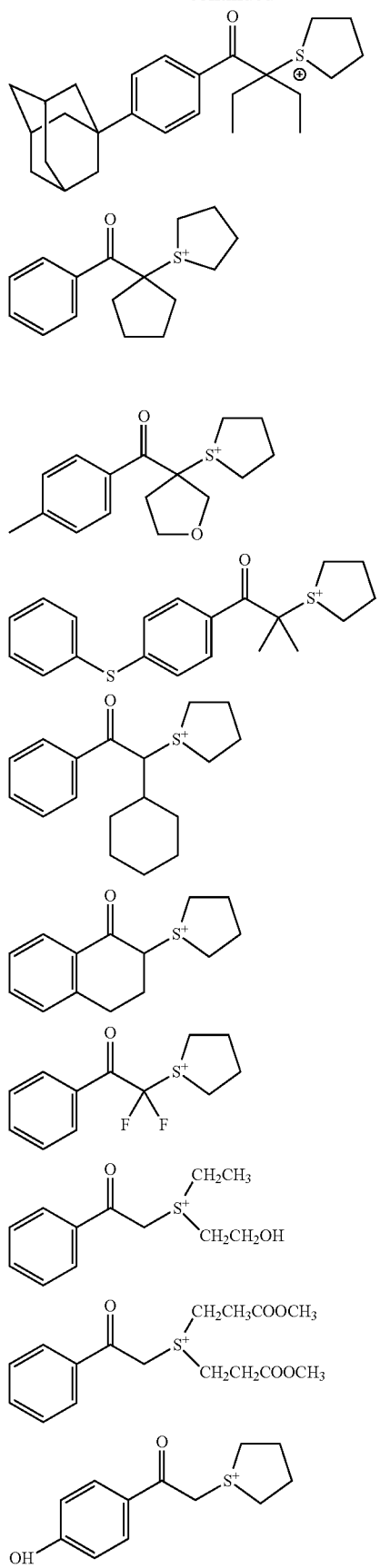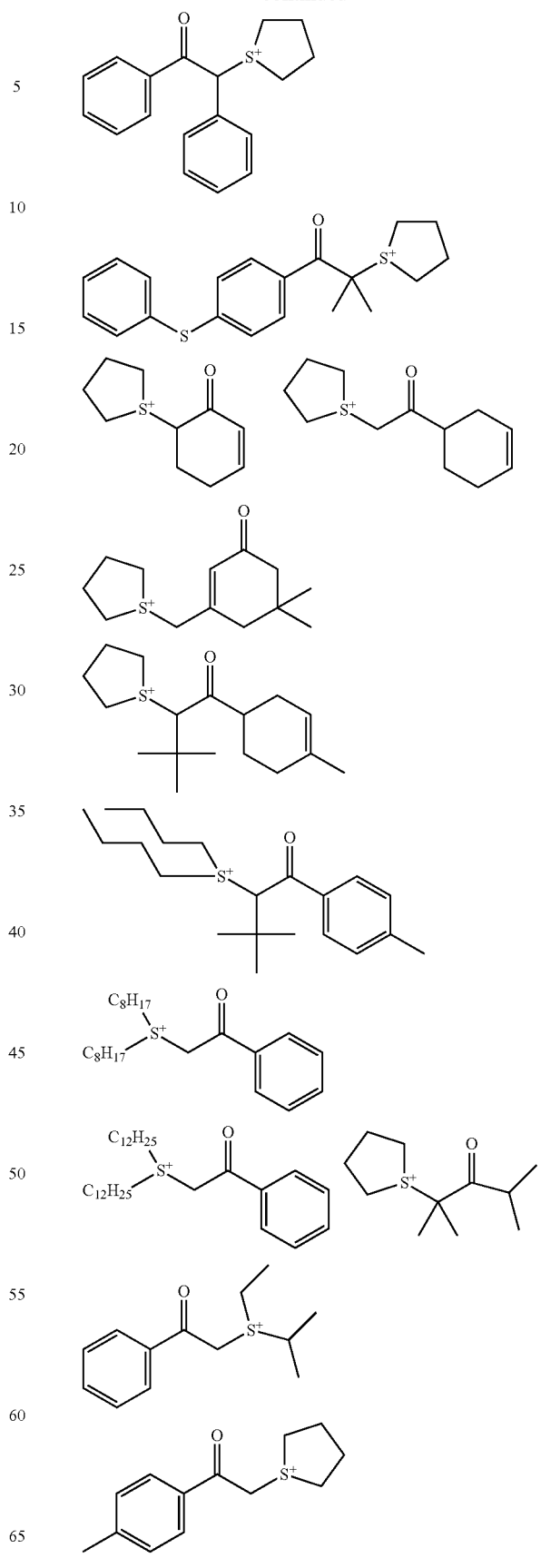

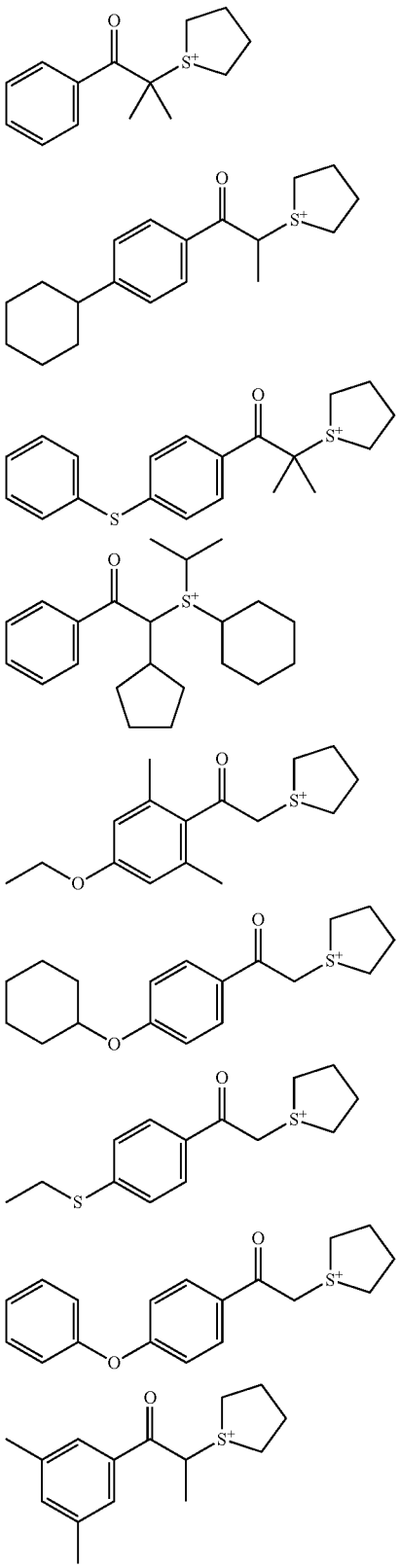

The compound (ZI-4) is described below.

The compound (ZI-4) is represented by the following formula (ZI-4):

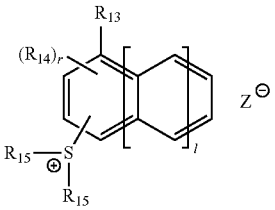

In formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

$R_{14}$ represents, when a plurality of $R_{14}$s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

Each $R_{15}$ independently represents an alkyl group, a cycloalkyl group or a naphthyl group. Two $R_{15}$s may combine with each other to form a ring. These groups may have a substituent.

l represents an integer of 0 to 2.

r represents an integer of 0 to 8.

$Z^-$ represents a non-nucleophilic anion, and examples thereof are the same as those of the non-nucleophilic anion of $Z^-$ in formula (ZI).

In formula (ZI-4), the alkyl group of $R_{13}$, $R_{14}$ and $R_{15}$ is a linear or branched alkyl group preferably having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are preferred.

The cycloalkyl group of $R_{13}$, $R_{14}$ and $R_{15}$ includes a monocyclic or polycyclic cycloalkyl group (preferably a cycloalkyl group having a carbon number of 3 to 20), and examples thereof include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl and adamantyl. Above all, cyclopropyl, cyclopentyl, cyclohexyl, cycloheptyl and cyclooctyl are preferred.

The alkoxy group of $R_{13}$ and $R_{14}$ is a linear or branched alkoxy group preferably having a carbon number of 1 to 10, and examples thereof include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group and an n-decyloxy group. Among these alkoxy groups, a methoxy group, an ethoxy group, an n-propoxy group and an n-butoxy group are preferred.

The alkoxycarbonyl group of $R_{13}$ and $R_{14}$ is a linear or branched alkoxycarbonyl group preferably having a carbon number of 2 to 11, and examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group and an n-decyloxycarbonyl group. Among these alkoxycarbonyl groups, a methoxycarbonyl group, an ethoxycarbonyl group and an n-butoxycarbonyl group are preferred.

The cycloalkyl group-containing group of $R_{13}$ and $R_{14}$ includes a monocyclic or polycyclic cycloalkyl group (preferably a cycloalkyl group having a carbon number of 3 to 20), and examples thereof include a monocyclic or polycyclic cycloalkyloxy group and an alkoxy group containing a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and is preferably a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cycloheptyloxy group, cyclooctyloxy group and cyclododecanyloxy group arbitrarily has a substituent such as alkyl group (e.g., methyl, ethyl, propyl, butyl, pentyl, hexyl, heptyl, octyl, dodecyl, 2-ethylhexyl, isopropyl, sec-butyl, tert-butyl, isoamyl), hydroxyl group, halogen atom (e.g., fluorine, chlorine, bromine, iodine), nitro group, cyano group, amido group, sulfonamido group, alkoxy group (e.g., methoxy, ethoxy, hydroxyethoxy, propoxy, hydroxypropoxy, butoxy), alkoxycarbonyl group (e.g., methoxycarbonyl, ethoxycarbonyl), acyl group (e.g., formyl, acetyl, benzoyl), acyloxy group (e.g., acetoxy, butyryloxy) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$ above.

The alkylsulfonyl and cycloalkylsulfonyl group of $R_{14}$ are a linear, branched or cyclic alkylsulfonyl group preferably having a carbon number of 1 to 10, and examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

Examples of the substituent which each of the groups above may have include a halogen atom (e.g., fluorine), a hydroxyl group, a carboxyl group, a cyano group, a nitro group, an alkoxy group, an alkoxyalkyl group, an alkoxycarbonyl group and an alkoxycarbonyloxy group.

The alkoxy group above includes, for example, a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

The alkoxyalkyl group includes, for example, a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

The alkoxycarbonyl group includes, for example, a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

The alkoxycarbonyloxy group includes, for example, a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The ring structure which may be formed by combining two $R_{15}$s with each other includes a 5- or 6-membered ring, preferably a 5-membered ring (that is, tetrahydrothiophene ring), formed by two divalent $R_{15}$s together with the sulfur atom in formula (ZI-4) and may be fused with an aryl group or a cycloalkyl group. This divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group and an alkoxycarbonyloxy group. A plurality of substituents may be substituted on the ring structure, and these substituents may combine with each other to form a ring (for example, an aromatic or non-aromatic hydrocarbon ring, an aromatic or non-aromatic heterocyclic ring, or a polycyclic condensed ring formed by combining two or more of such rings).

In formula (ZI-4), $R_{15}$ is preferably, for example, a methyl group, an ethyl group, a naphthyl group, or a divalent group capable of forming a tetrahydrothiophene ring structure together with the sulfur atom when two $R_{15}$s combine with each other.

The substituent which may be substituted on $R_{13}$ and $R_{14}$ is preferably a hydroxyl group, an alkoxy group, an alkoxycarbonyl group or a halogen atom (particularly fluorine atom).

l is preferably 0 or 1, more preferably 1.

r is preferably from 0 to 2.

Specific preferred examples of the cation in the compound represented by formula (ZI-4) for use in the present invention are illustrated below.

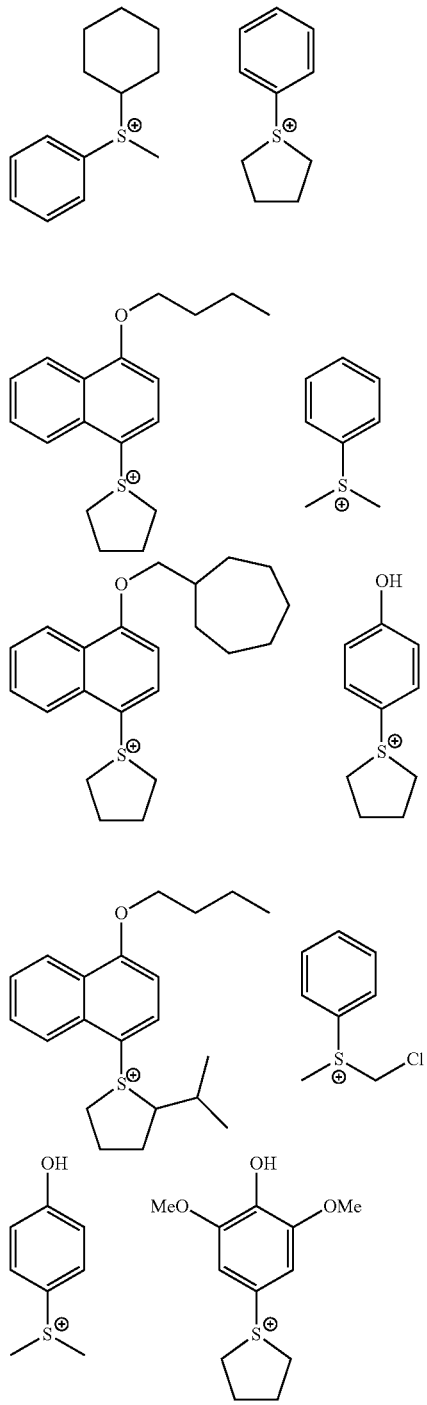

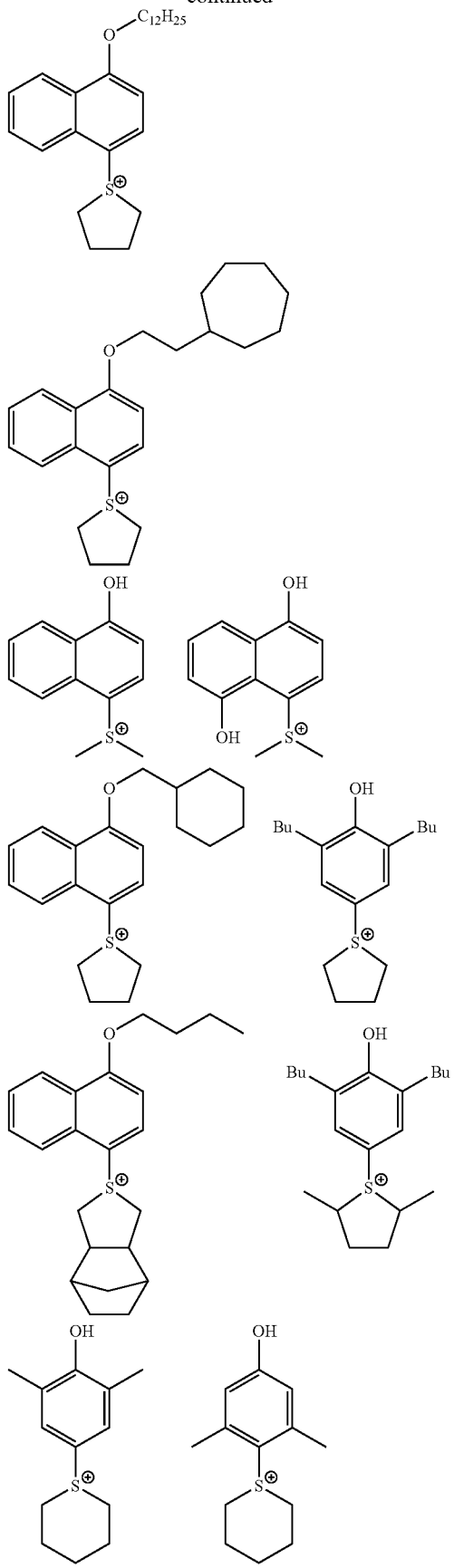

-continued

83
-continued
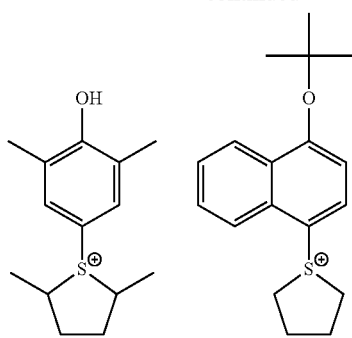
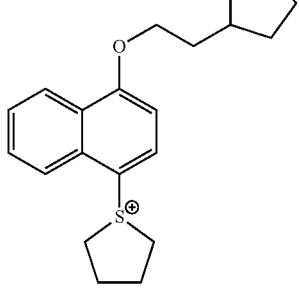
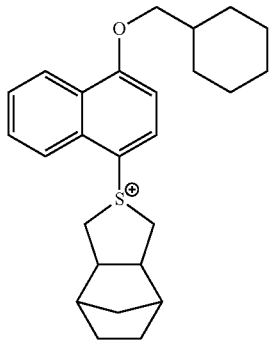
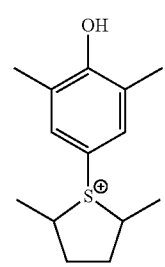
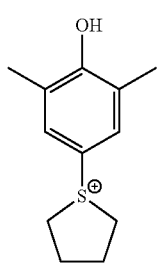
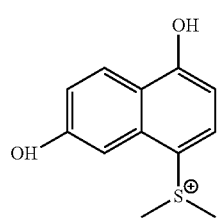
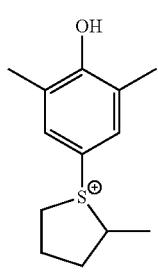
84
-continued
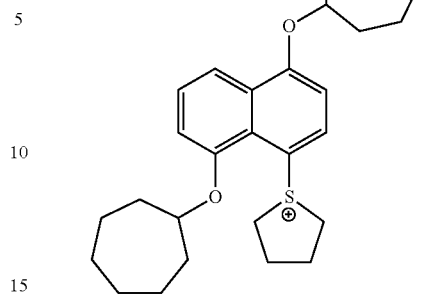
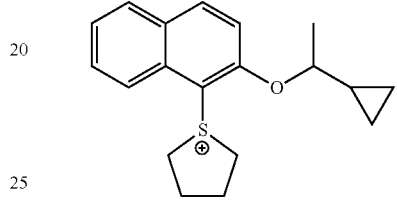
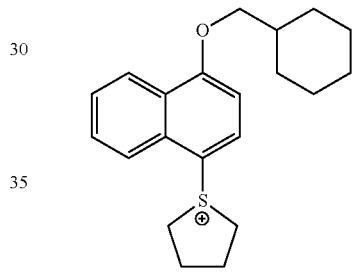
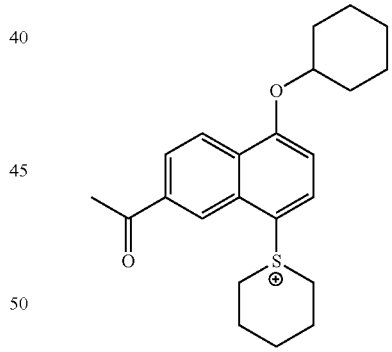
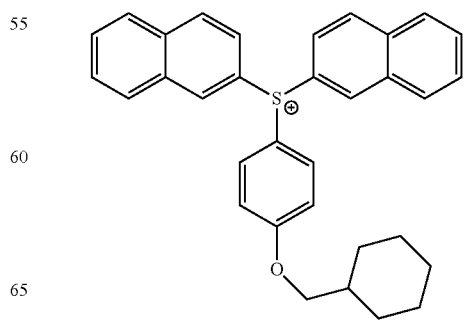

85
-continued
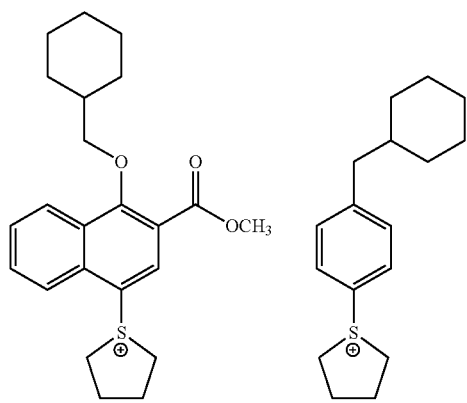
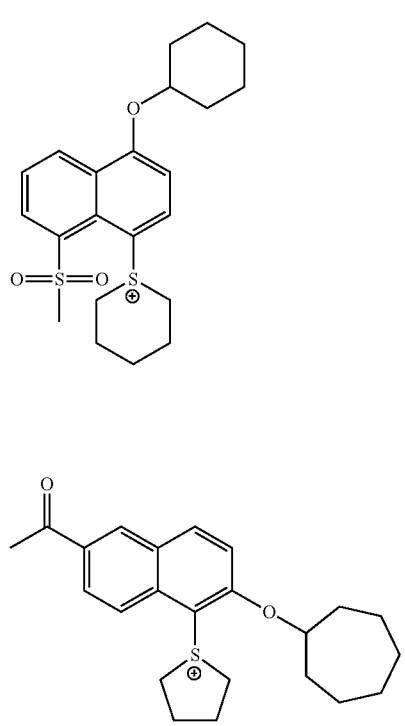
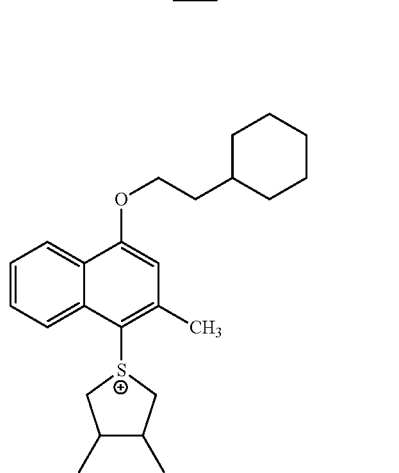
86
-continued
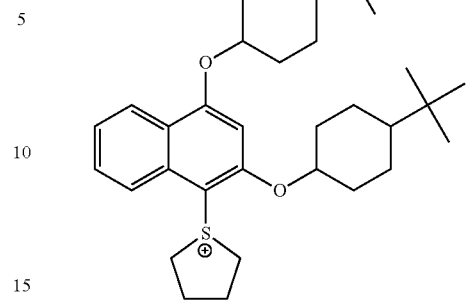
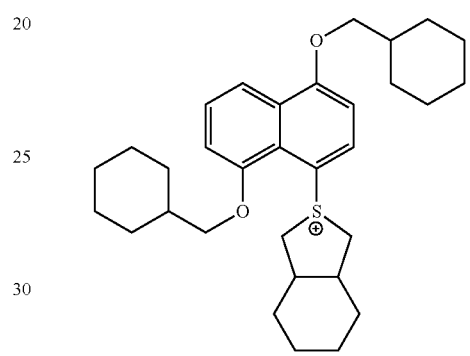
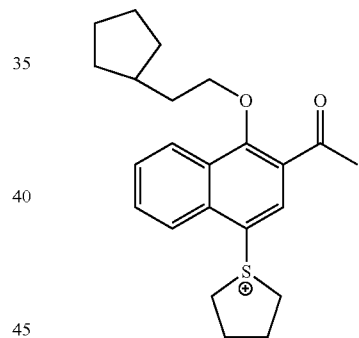
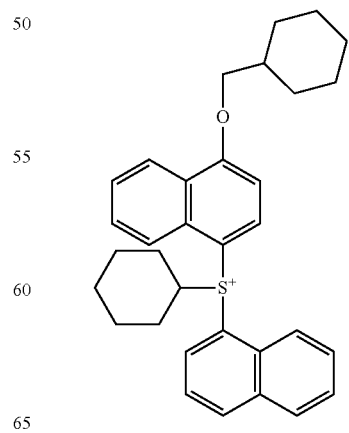

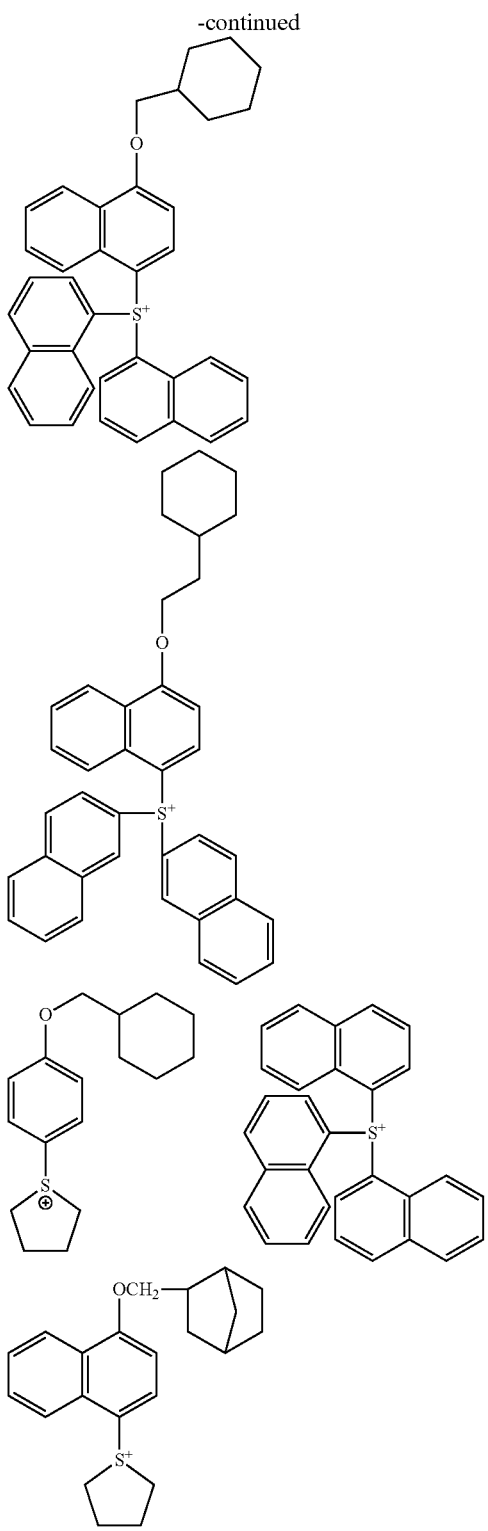

Formulae (ZII) and (ZIII) are described below.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the framework of the aryl group having a heterocyclic structure include pyrrole, furan, thiophene, indole, benzofuran and benzothiophene.

The alkyl group and cycloalkyl group of $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ to $R_{207}$ may have a substituent other than an acid-decomposable group. Examples of the substituent which may be substituted on the aryl group, alkyl group and cycloalkyl group of $R_{204}$ to $R_{207}$ include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

$Z^-$ represents a non-nucleophilic anion, and examples thereof the same as those of the non-nucleophilic anion of $Z^-$ in formula (ZI).

The acid generator further includes compounds represented by the following formulae (ZIV), (ZV) and (ZVI):

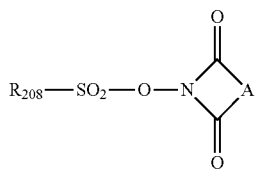

(ZIV) $Ar_3$—$SO_2$—$SO_2$—$Ar_4$

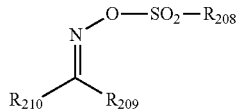

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI-2).

The alkylene group of A includes an alkylene group having a carbon number of 1 to 12 (e.g., methylene, ethylene, propylene, isopropylene, butylene, isobutylene); the alkenylene group of A includes an alkenylene group having a carbon number of 2 to 12 (e.g., ethenylene, propenylene, butenylene); and the arylene group of A includes an arylene group having a carbon number of 6 to 10 (e.g., phenylene, tolylene, naphthylene).

Among the acid generators, more preferred are the compounds represented by formulae (ZI) to (ZIII).

Also, the acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity is enhanced.

Out of the acid generators, particularly preferred examples are illustrated below.

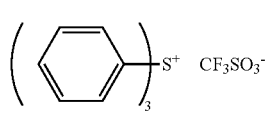 (z1)

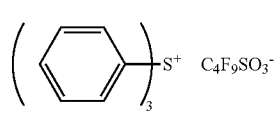 (z2)

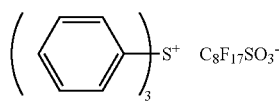 (z3)

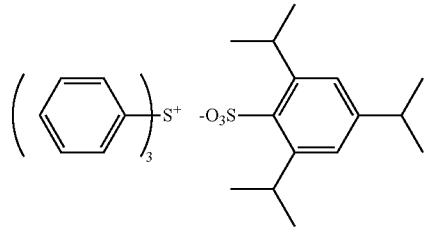 (z4)

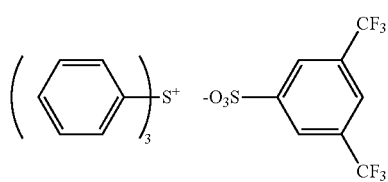 (z5)

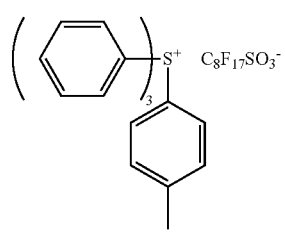 (z6)

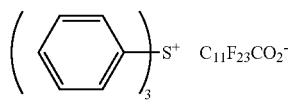 (z7)

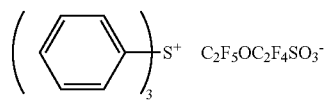 (z8)

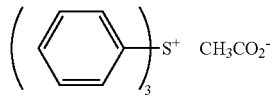 (z9)

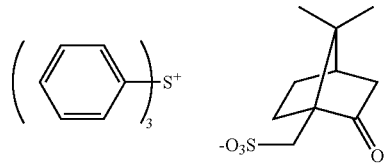 (z10)

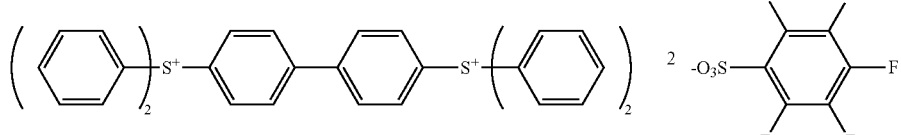 (z11)

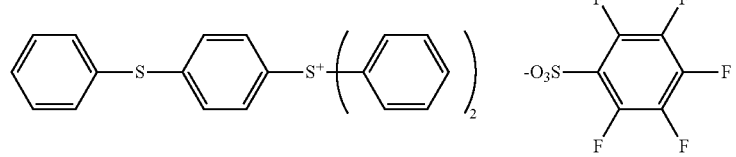 (z12)

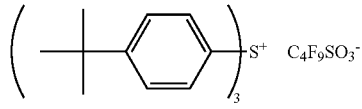 (z13)

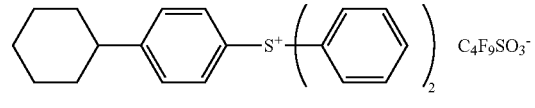 (z14)

-continued
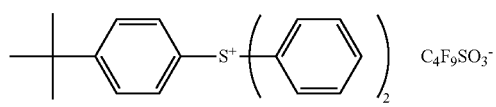 (z15)
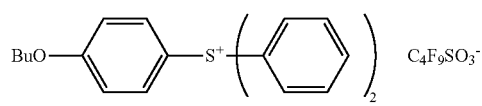 (z16)
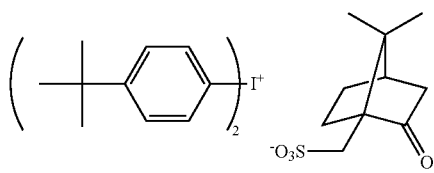 (z17)
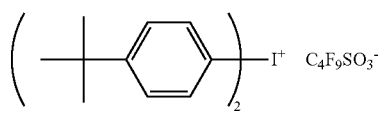 (z18)
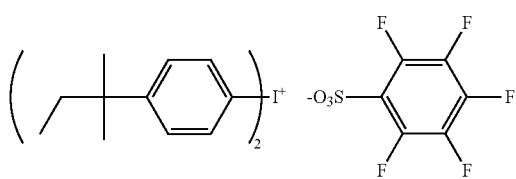 (z19)
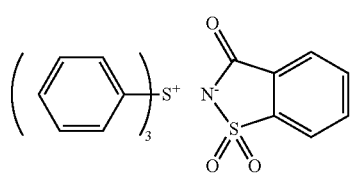 (z20)
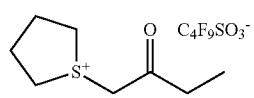 (z21)
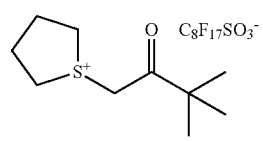 (z22)
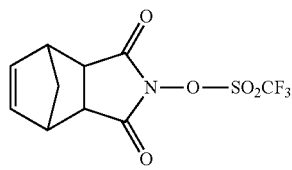 (z23)
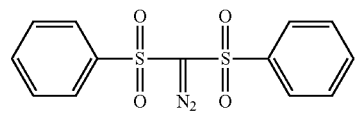 (z24)
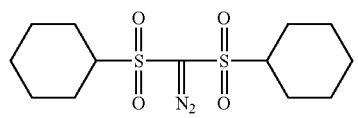 (z25)
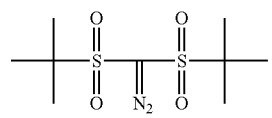 (z26)
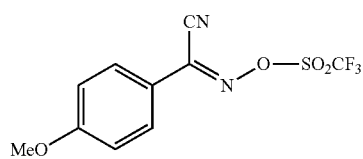 (z27)
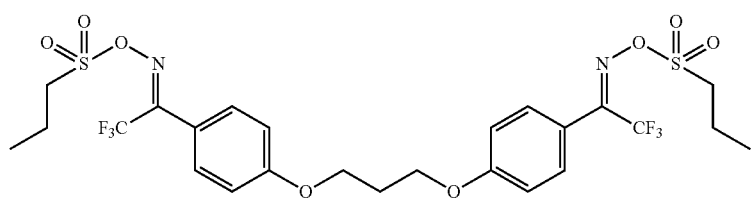 (z28)
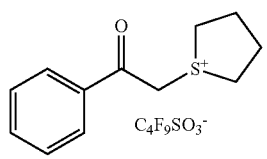 (z29)
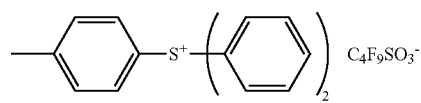 (z30)

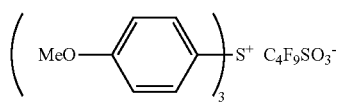 (z31)
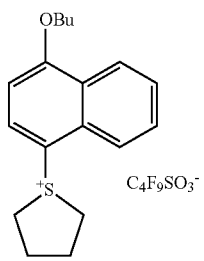 (z32)
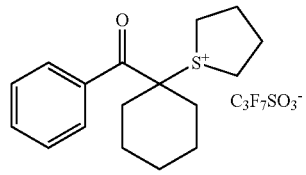 (z33)
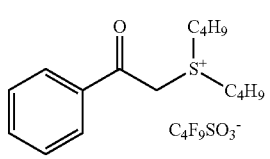 (z34)
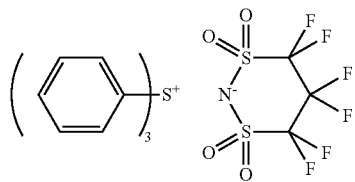 (z35)
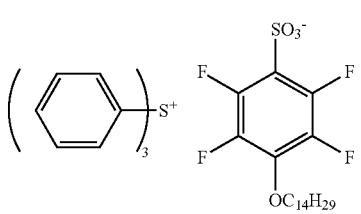 (z36)
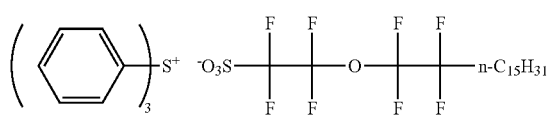 (z37)
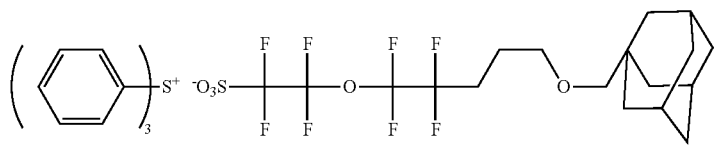 (z38)
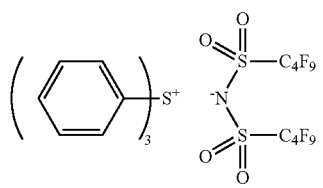 (z39)
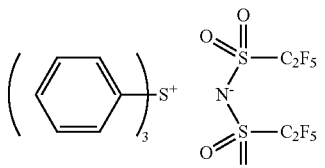 (z40)
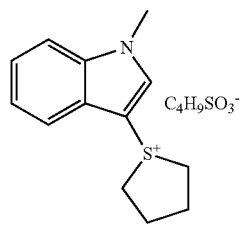 (z41)
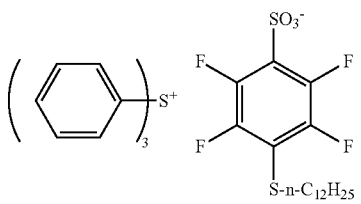 (z42)
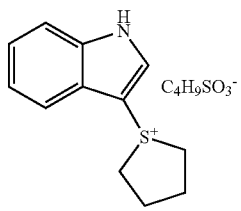 (z43)
(z44)

-continued
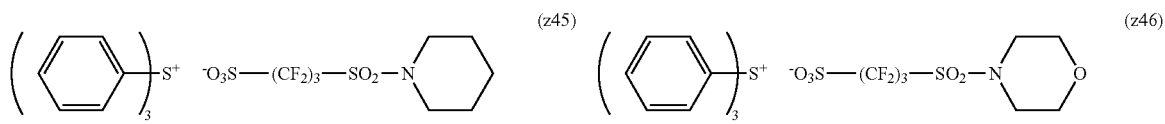
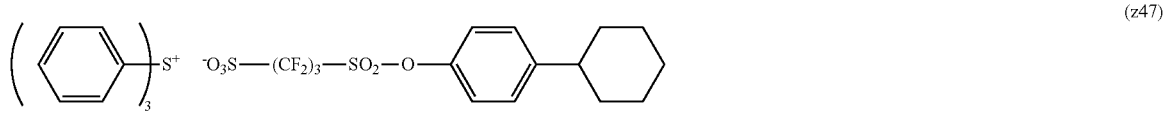
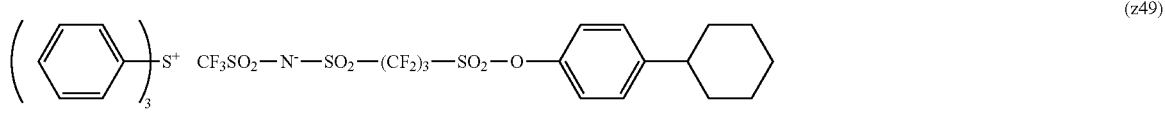
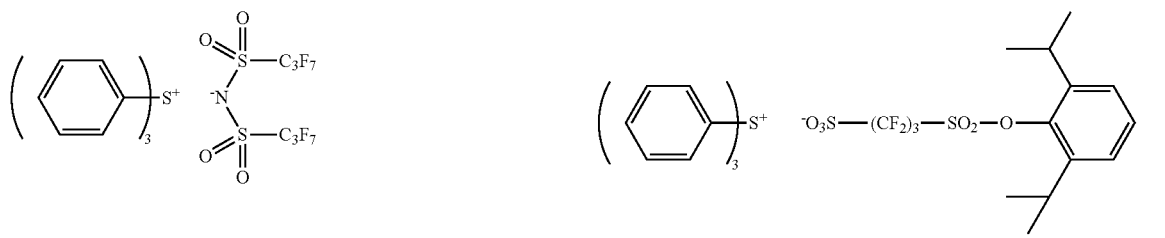
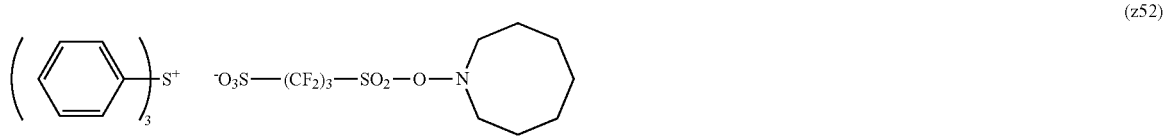
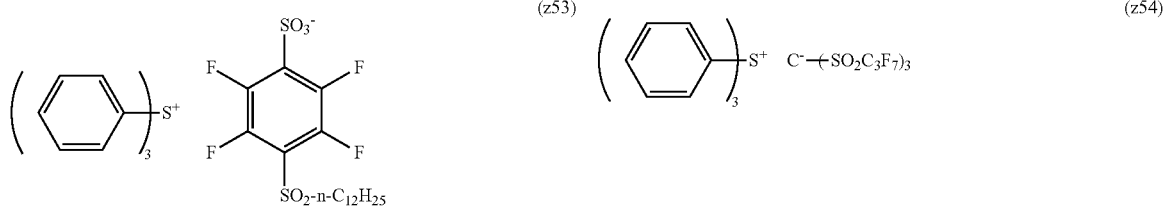
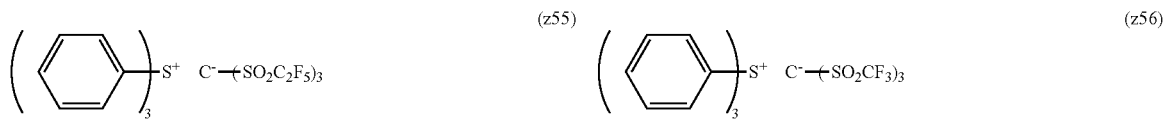
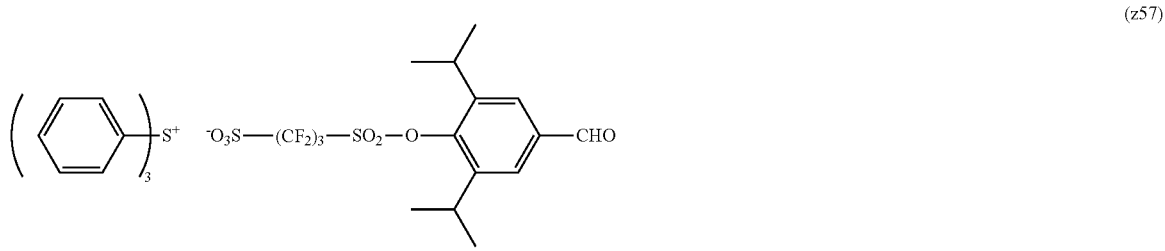
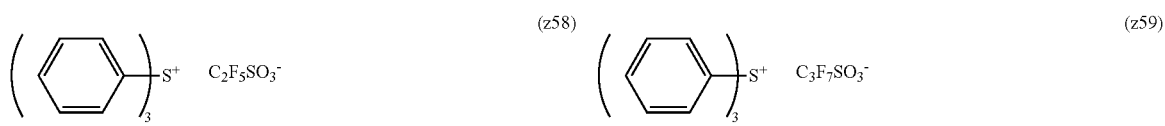

-continued
(z60)
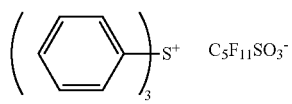
(z61)
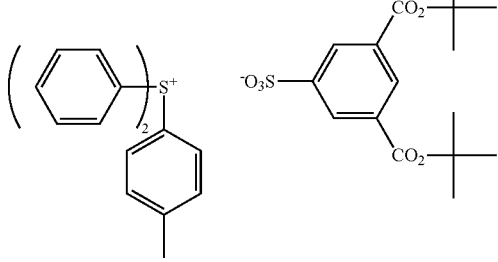
(z62)
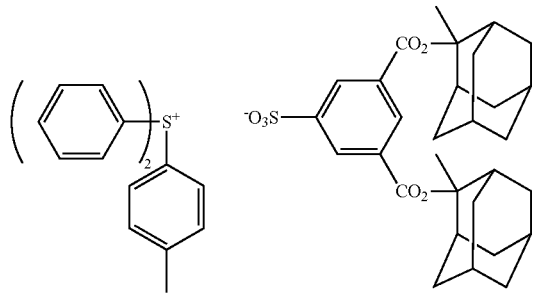
(z63)
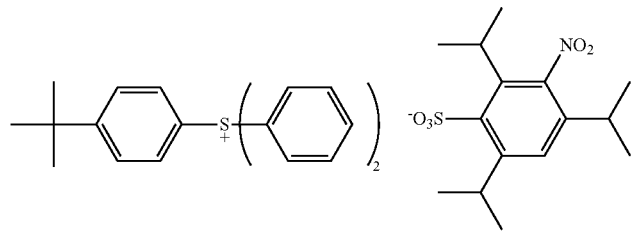
(z64)
(z65)
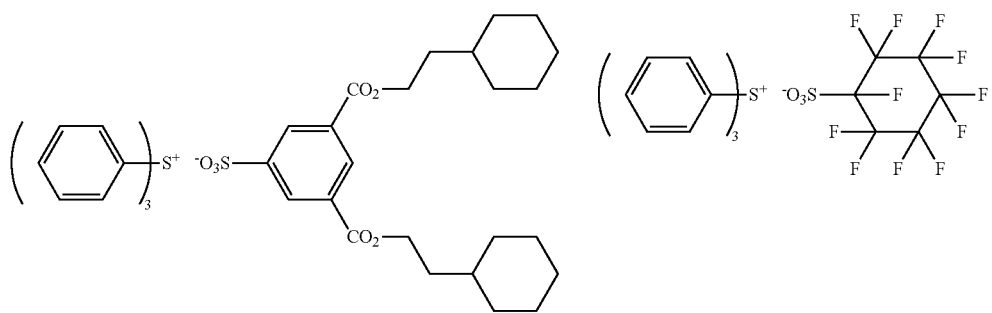
(z66)
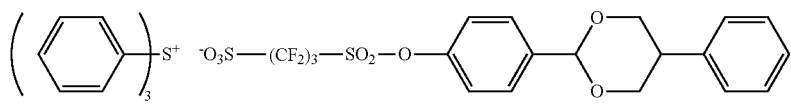
(z67)
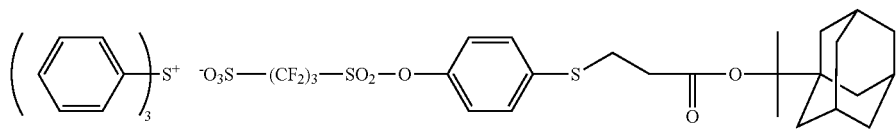
(z68)
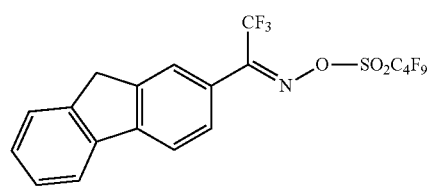

-continued
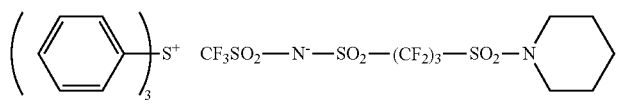
(z69)
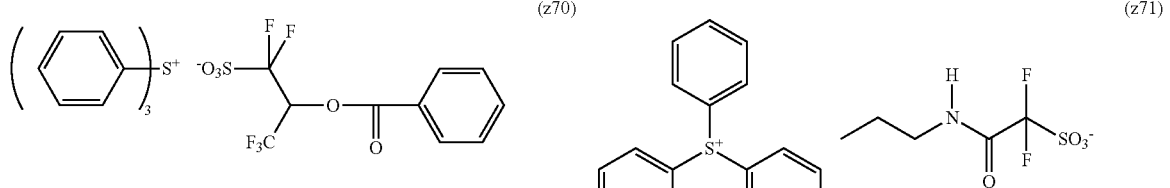
(z70)
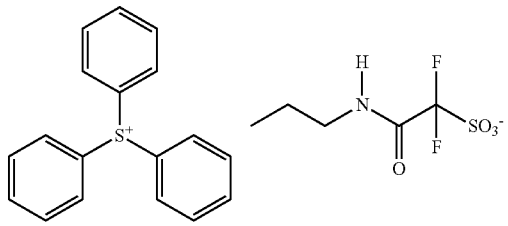
(z71)
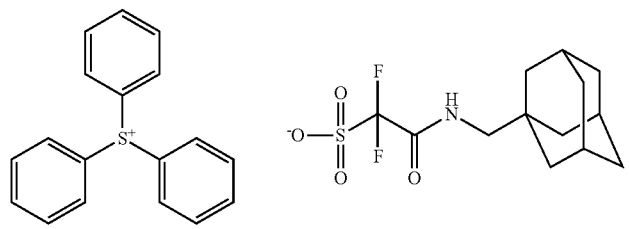
(z72)
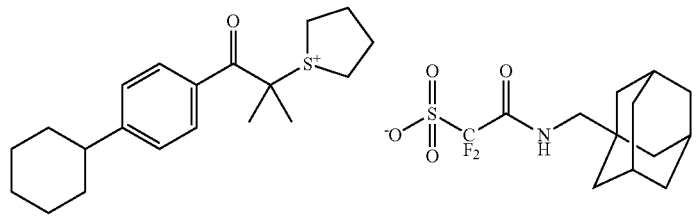
(z73)
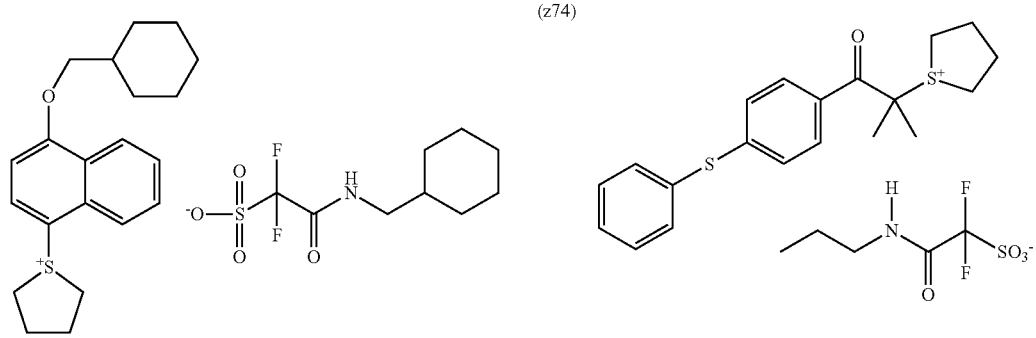
(z74)
(z75)
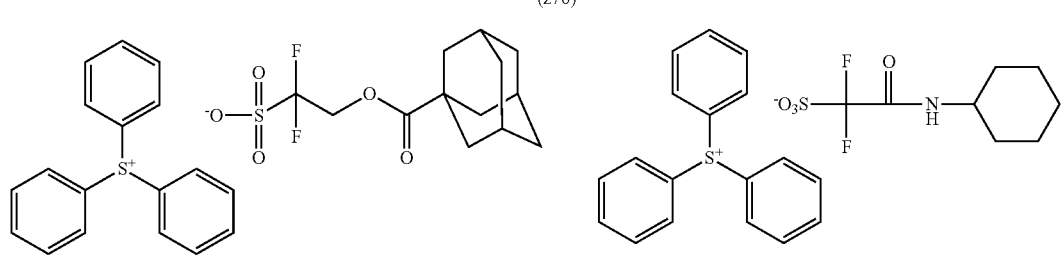
(z76)
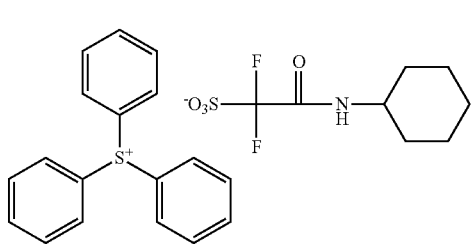
(z77)

-continued
(z78)
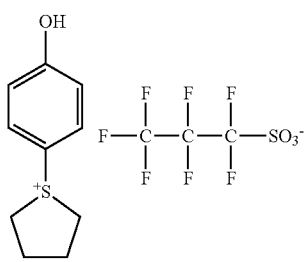
(z79)
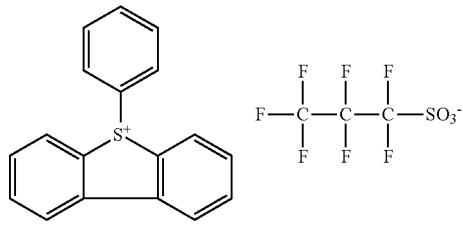
(z80)
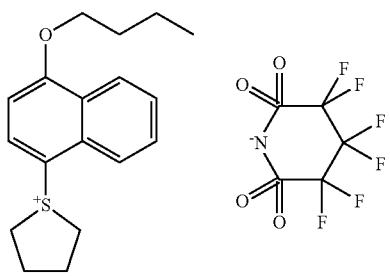 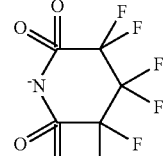
(z81)
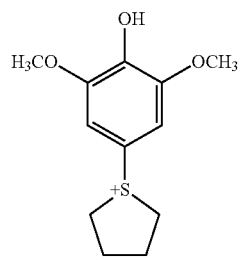 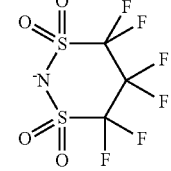
(z82)
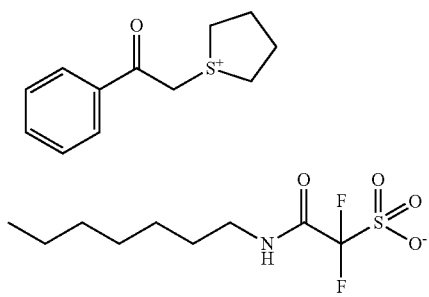
(z83)
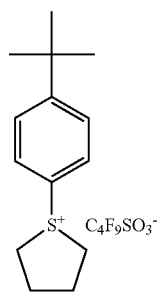
(z84)
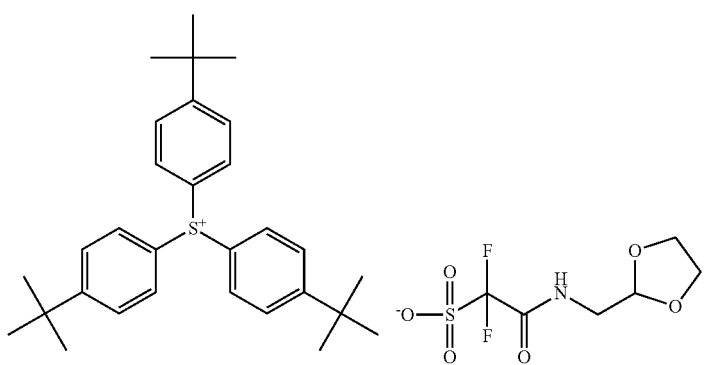
(z85)
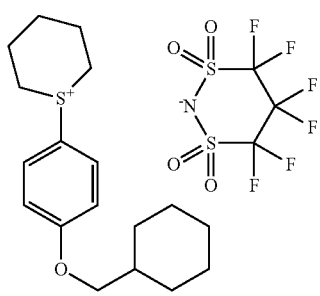
(z86)
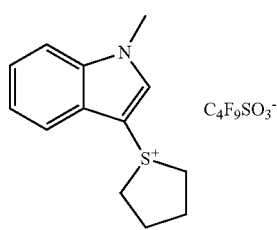

-continued
(z87)
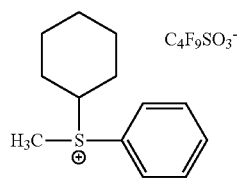
(z88)
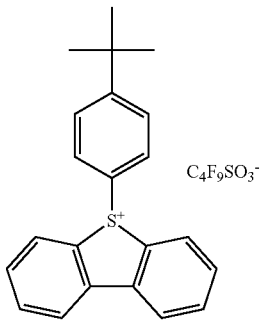
(z89)
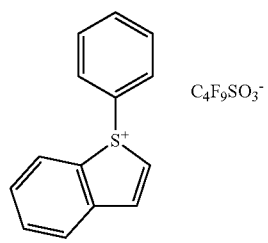
(z90)
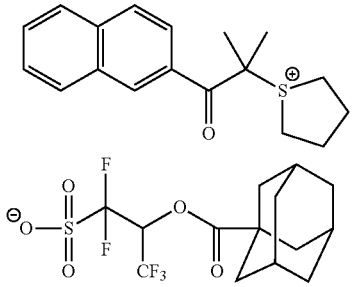
(z91)
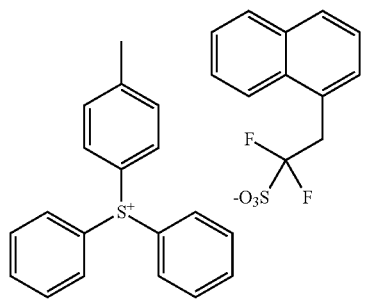
(z92)
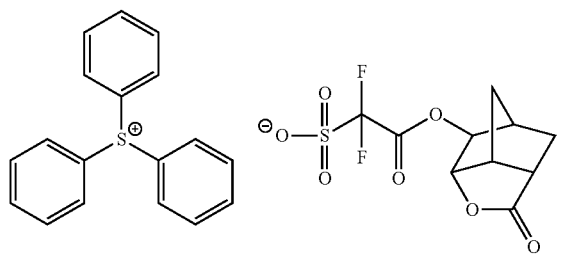
(z93)
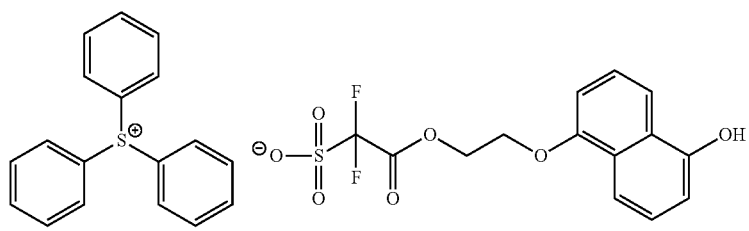
(z94)
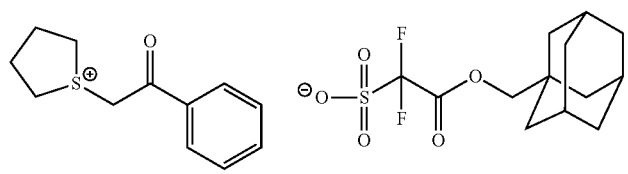

-continued
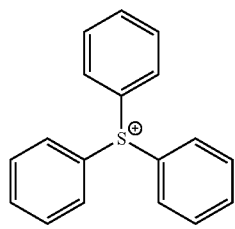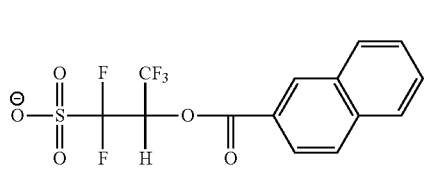
(z95)
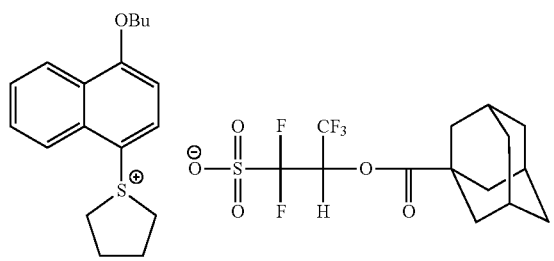
(z96)
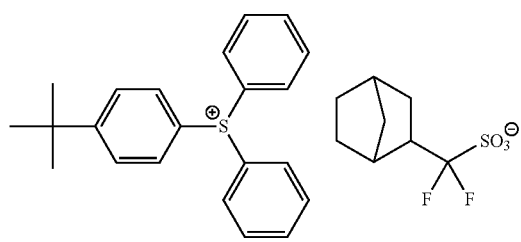
(z97)
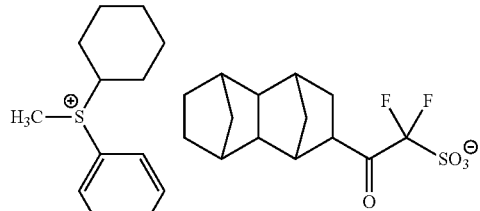
(z98)
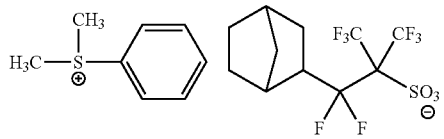
(z99)
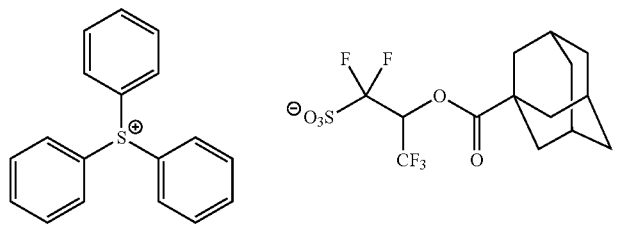
(z100)
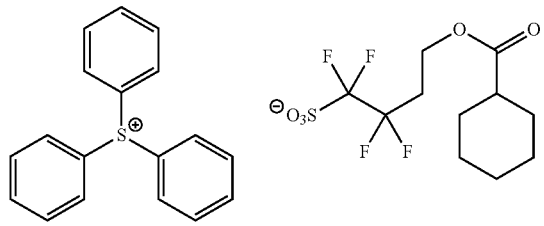
(z101)

-continued

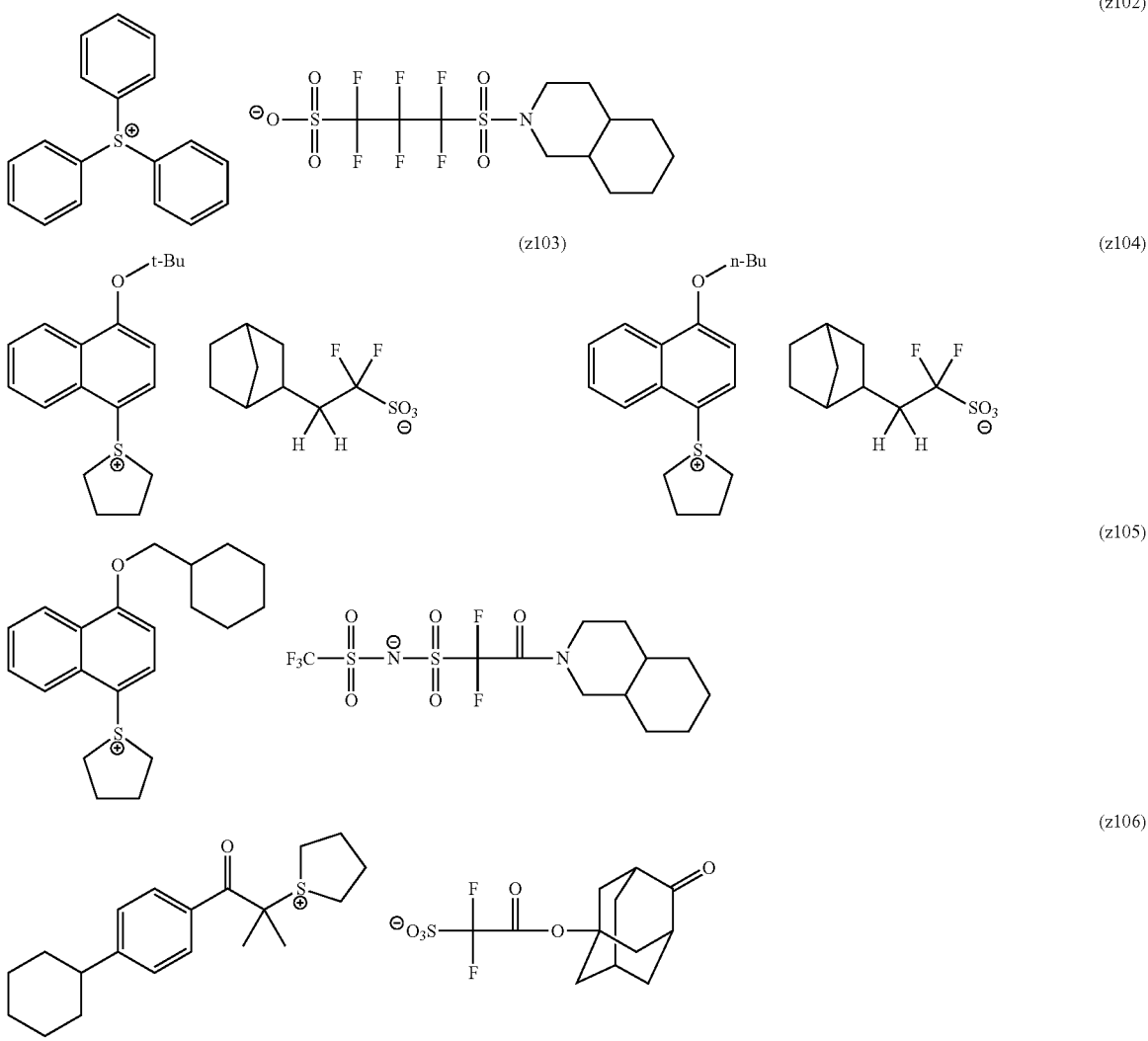

The acid generator can be synthesized by a known method, for example, can be synthesized in accordance with the method described in JP-A-2007-161707.

As for the acid generator, one kind may be used, or two or more kinds may be used in combination.

The content of the compound capable of generating an acid upon irradiation with an actinic ray or radiation, in the composition, is preferably from 0.1 to 40 mass %, more preferably from 1 to 30 mass %, still more preferably from 5 to 25 mass %, based on the entire solid content of the resist composition.

[4] (D) Solvent

Examples of the solvent which can be used at the preparation of the resist composition of the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Specific examples of these solvents include those described in paragraphs [0441] to of U.S. Patent Application Publication 2008/0187860.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably an alkylene glycol monoalkyl ether, an alkyl lactate or the like, more preferably propylene glycol monomethyl ether (PGME, another name: 1-methoxy-2-propanol) or ethyl lactate. The solvent not containing a hydroxyl group is preferably an alkylene glycol monoalkyl ether acetate, an alkyl alkoxypropionate, a monoketone compound which may contain a ring, a cyclic lactone, an alkyl acetate or the like, more preferably propylene glycol monomethyl ether acetate (PGMEA, another name: 1-methoxy-2-acetoxypropane), ethyl ethoxypropionate, 2-heptanone, γ-butyrolactone, cyclohexanone or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, more preferably from 20/80 to 60/40. A mixed solvent in which the solvent not containing a hydroxyl group accounts for 50 mass % or more is particularly preferred in view of coating uniformity.

The solvent preferably contains propylene glycol monomethyl ether acetate and is preferably a solvent containing propylene glycol monomethyl ether acetate alone or a mixed solvent of two or more kinds of solvents containing propylene glycol monomethyl ether acetate.

[5] (E) Hydrophobic Resin

The resist composition of the present invention may contain a hydrophobic resin having at least either a fluorine atom or a silicon atom (hereinafter sometimes referred to as a "hydrophobic resin (E)" or simply as a "resin (E)") particularly when the resist composition is applied to immersion exposure. The hydrophobic resin (E) is unevenly distributed to the film surface layer and when the immersion medium is water, the static/dynamic contact angle on the resist film surface for water as well as the followability of immersion liquid can be enhanced.

The hydrophobic resin (E) is preferably designed, as described above, to be unevenly distributed to the interface but unlike a surfactant, need not have necessarily a hydrophilic group in the molecule and may not contribute to uniform mixing of polar/nonpolar substances.

The hydrophobic resin (E) typically contains a fluorine atom and/or a silicon atom. The fluorine atom and/or silicon atom in the hydrophobic resin (E) may be contained in the main chain of the resin or contained in the side chain.

In the case where the hydrophobic resin (E) contains a fluorine atom, the resin preferably contains, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being replaced by a fluorine atom and may further have a substituent other than the fluorine atom.

The fluorine atom-containing cycloalkyl group is a monocyclic or polycyclic cycloalkyl group with at least one hydrogen atom being replaced by a fluorine atom and may further have a substituent other than the fluorine atom.

The fluorine atom-containing aryl group is an aryl group (e.g., phenyl, naphthyl) with at least one hydrogen atom being replaced by a fluorine atom and may further have a substituent other than the fluorine atom.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

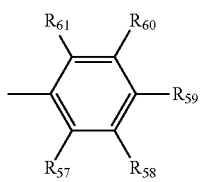

(F2)

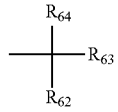

(F3)

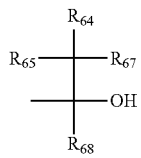

(F4)

In formulae (F2) to (F4), each of $R_{57}$ to $R_{68}$ independently represents a hydrogen atom, a fluorine atom or an alkyl group (linear or branched). However, each of at least one of $R_{57}$ to $R_{61}$, at least one of $R_{62}$ to $R_{64}$, and at least one of $R_{65}$ to $R_{68}$ independently represents a fluorine atom or an alkyl group (preferably having a carbon number of 1 to 4) with at least one hydrogen atom being replaced by a fluorine atom.

It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being replaced by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

The fluorine atom-containing partial structure may be bonded directly to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by combining two or more of these groups and bonds.

As the repeating unit having a fluorine atom, those shown below are preferred.

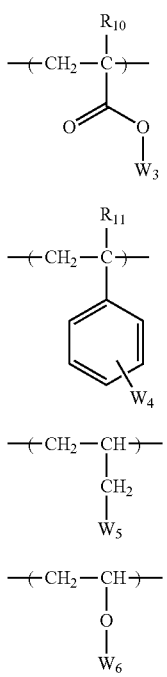

(C-Ia)

(C-Ib)

(C-Ic)

(C-Id)

In the formulae, each of $R_{10}$ and $R_{11}$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

Each of $W_3$ to $W_6$ independently represents an organic group having at least one or more fluorine atoms and specifically includes the atomic groups of (F2) to (F4).

Other than these, the hydrophobic resin (E) may contain a unit shown below as the repeating unit having a fluorine atom.

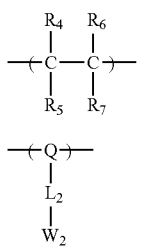

(C-II)

(C-III)

In the formulae, each of $R_4$ to $R_7$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

However, at least one of $R_4$ to $R_7$ represents a fluorine atom. $R_4$ and $R_5$, or $R_6$ and $R_7$ may form a ring.

$W_2$ represents an organic group having at least one fluorine atom and specifically includes the atomic groups of (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or an alkyl group), —NHSO$_2$—, or a divalent linking group formed by combining a plurality of these groups.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having a carbon number of 3 to 8, and examples thereof include a cyclopentyl group, a cyclohexyl group, a cyclobutyl group and a cyclooctyl group. Examples of the polycyclic structure include a group containing a bicyclo, tricyclo or tetracyclo structure having a carbon number of 5 or more. A cycloalkyl group having a carbon number of 6 to 20 is preferred, and examples thereof include an adamantyl group, a norbornyl group, a dicyclopentyl group, a tricyclodecanyl group and a tetracyclododecyl group. A part of carbon atoms in the cycloalkyl group may be substituted with a heteroatom such as oxygen atom. In particular, Q is preferably a norbornyl group, a tricyclodecanyl group, a tetracyclododecyl group or the like.

Specific examples of the repeating unit containing a fluorine atom are illustrated below, but the present invention is not limited thereto.

In specific examples, $X_1$ represents a hydrogen atom, —CH$_3$, —F or —CF$_3$, and $X_2$ represents —F or —CF$_3$.

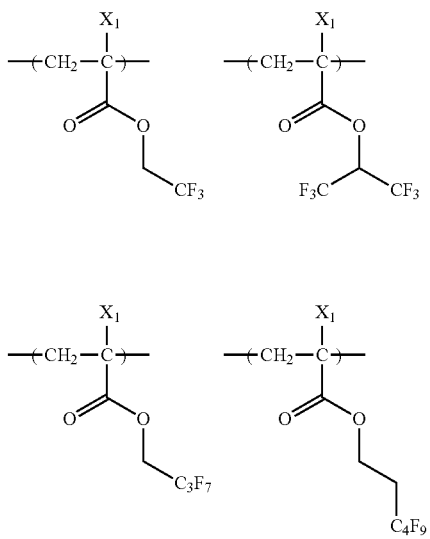

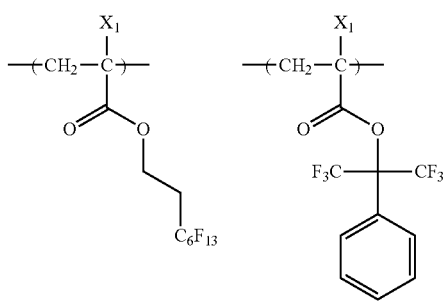

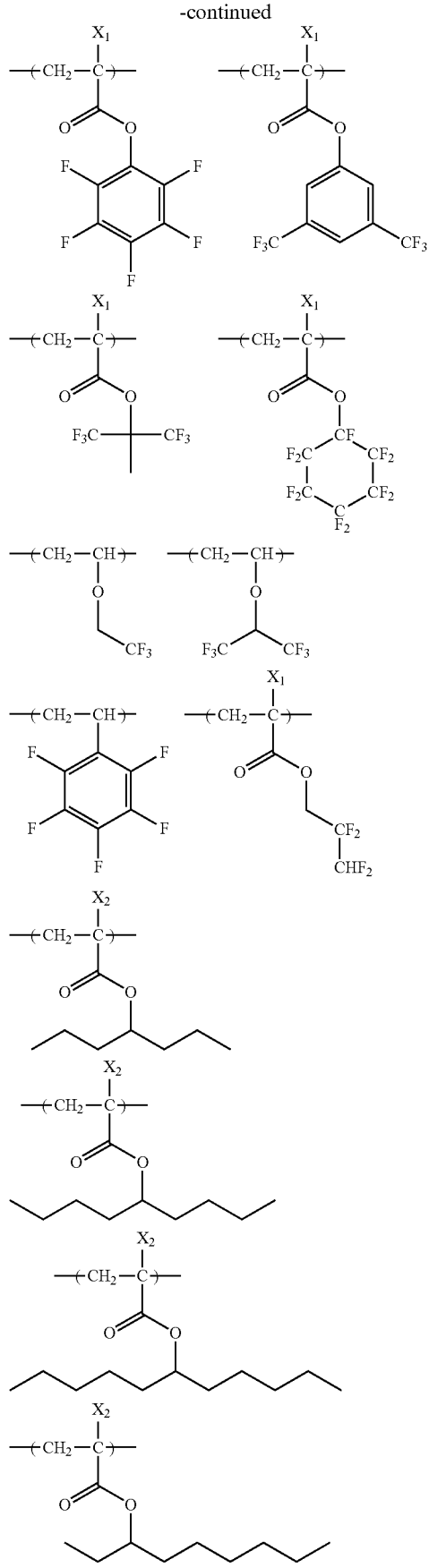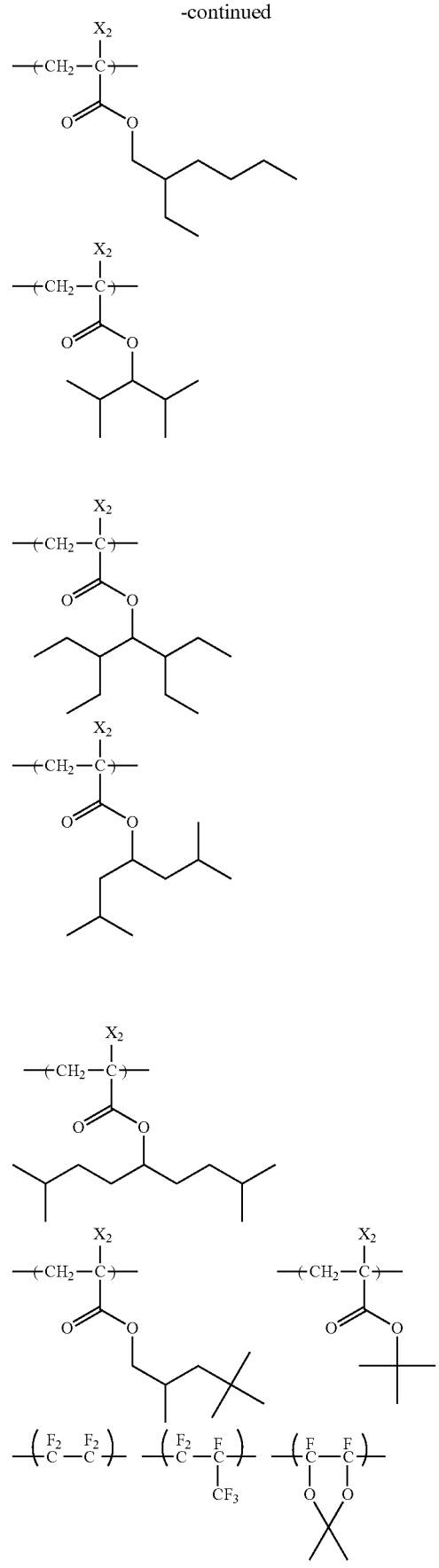

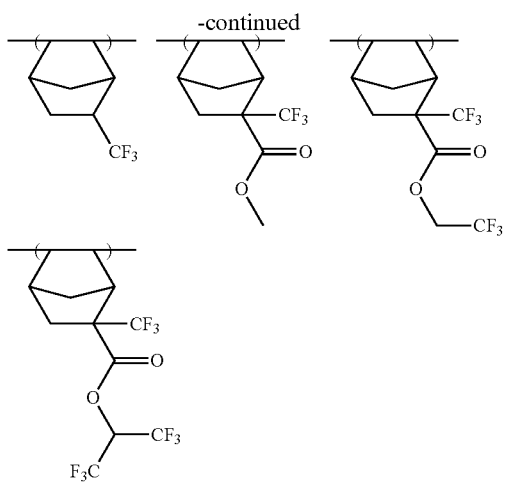

The hydrophobic resin (E) may contain a silicon atom. The resin preferably has, as the silicon atom-containing partial structure, an alkylsilyl structure (preferably a trialkylsilyl group) or a cyclic siloxane structure.

The alkylsilyl structure and cyclic siloxane structure specifically include, for example, the groups represented by the following formulae (CS-1) to (CS-3):

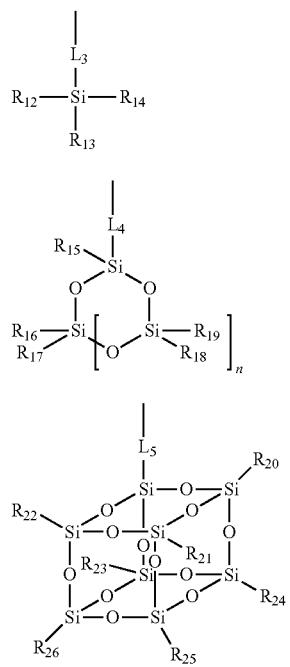

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole group or a combination of two or more groups (the total carbon number is preferably 12 or less), selected from the group consisting of an alkylene group, a phenylene group, an ether bond, a thioether bond, a carbonyl group, an ester bond, an amide bond, a urethane bond and a urea bond.

n represents an integer of 1 to 5. n is preferably an integer of 2 to 4.

Specific examples of the repeating unit having a group represented by formulae (CS-1) to (CS-3) are illustrated below, but the present invention is not limited thereto. In specific examples, $X_1$ represents a hydrogen atom, —$CH_3$, —F or —$CF_3$.

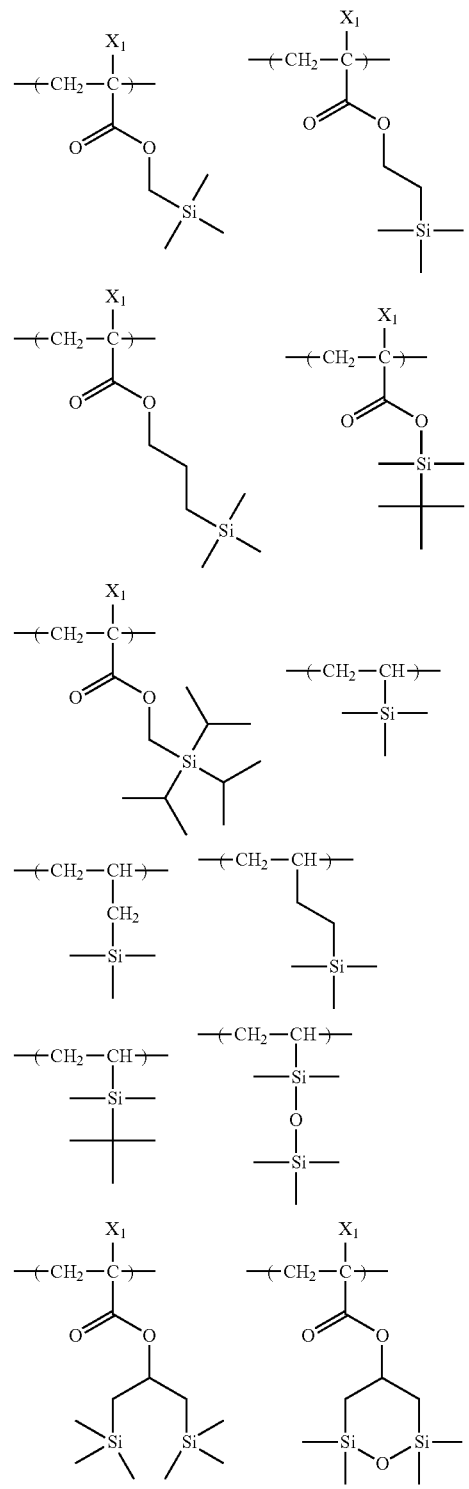

-continued

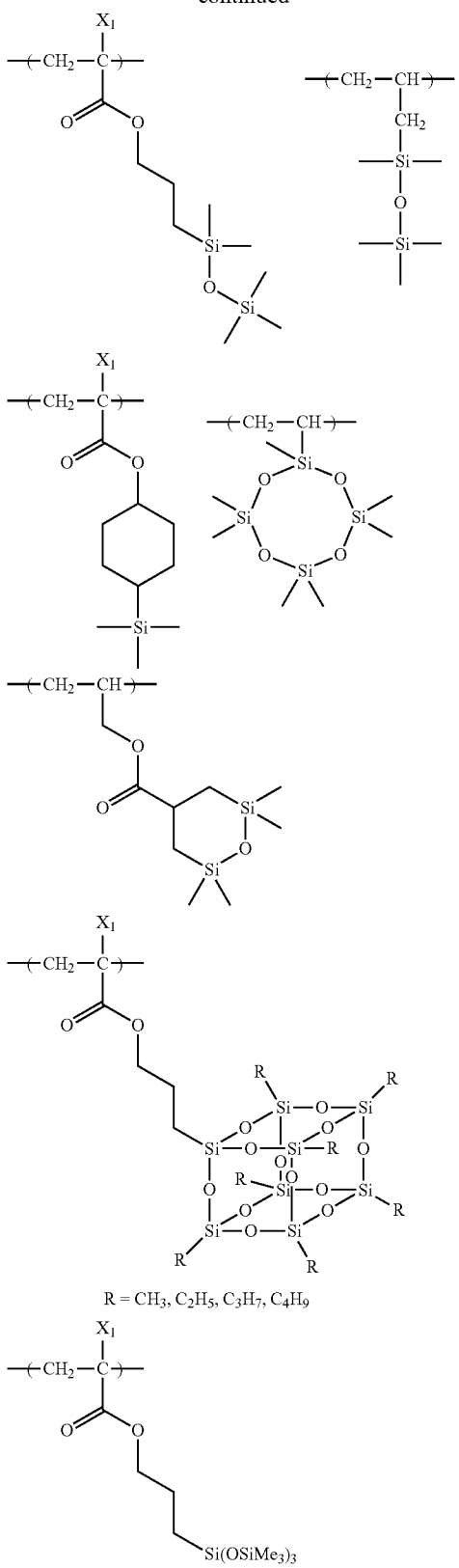

The hydrophobic resin (E) may further contain at least one group selected from the group consisting of the following (x) to (z):

(x) an acid group,
(y) a lactone structure-containing group, an acid anhydride group, or an acid imide group, and
(z) a group capable of decomposing by the action of an acid.

Examples of the (x) acid group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred acid groups include a fluorinated alcohol group (preferably hexafluoroisopropanol group), a sulfonimide group and a bis(carbonyl)methylene group.

Examples of the repeating unit having (x) an acid group include a repeating unit where an acid group is directly bonded to the main chain of the resin, such as repeating unit by an acrylic acid or a methacrylic acid, and a repeating unit where an acid group, is bonded to the main chain of the resin through a linking group. Furthermore, an acid group may be introduced into the terminal of the polymer chain by using an acid group-containing polymerization initiator or chain transfer agent at the polymerization. All of these cases are preferred. The repeating unit having (x) an acid group may have at least either a fluorine atom or a silicon atom.

The content of the repeating unit having (x) an acid group is preferably from 1 to 50 mol %, more preferably from 3 to 35 mol %, still more preferably from 5 to 20 mol %, based on all repeating units in the hydrophobic resin (E).

Specific examples of the repeating unit having (x) an acid group are illustrated below, but the present invention is not limited thereto. In the formulae, Rx represents a hydrogen atom, $CH_3$, $CF_3$ or $CH_2OH$.

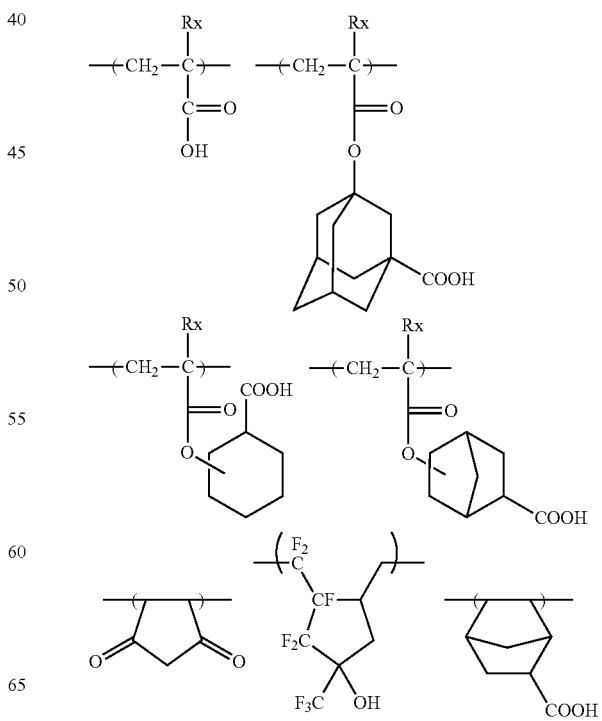

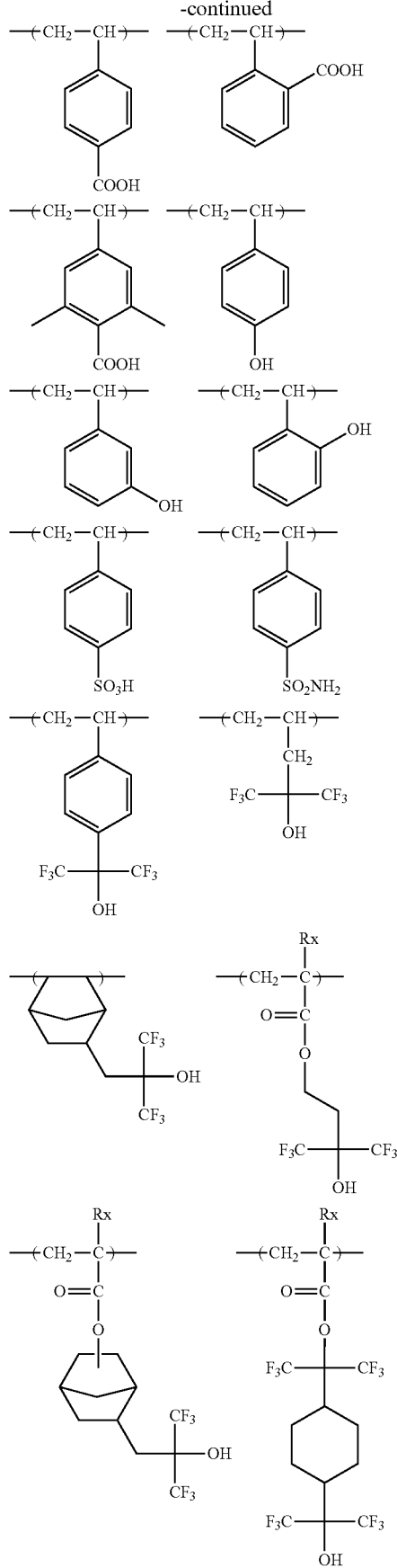
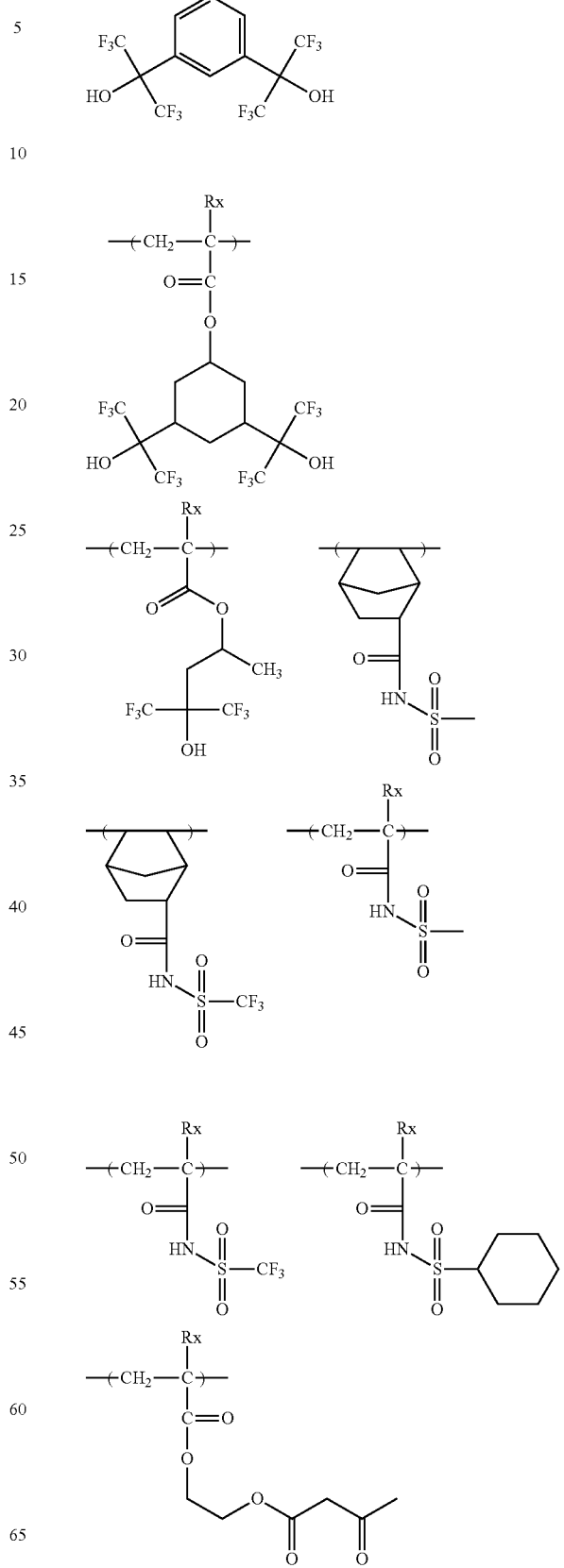

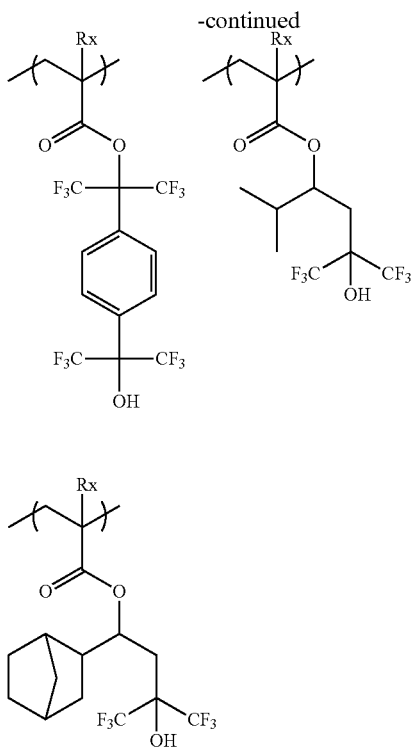

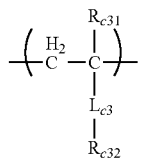

The (y) lactone structure-containing group, acid anhydride group or acid imide group is preferably a lactone structure-containing group.

The repeating unit having such a group is a repeating unit where the group is directly bonded to the main chain of the resin, such as repeating unit by an acrylic acid ester or a methacrylic acid ester. This repeating unit may be also a repeating unit where the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a lactone structure-containing group are the same as those of the repeating unit having a lactone structure described above in the paragraph of (A) resin.

The content of the repeating unit having a lactone structure-containing group, an acid anhydride group or an acid imide group is preferably from 1 to 100 mol %, more preferably from 3 to 98 mol %, still more preferably from 5 to 95 mol %, based on all repeating units in the hydrophobic resin.

Examples of the repeating unit having (z) a group capable of decomposing by the action of an acid, which is contained in the hydrophobic resin (E), are the same as those of the repeating unit having an acid-decomposable group described for the resin (A). The repeating unit having (z) a group capable of decomposing by the action of an acid may contain at least either a fluorine atom or a silicon atom. The content of the repeating unit having (z) a group capable of decomposing by the action of an acid, in the hydrophobic resin (E), is preferably from 1 to 80 mol %, more preferably from 10 to 80 mol %, still more preferably from 20 to 60 mol %, based on all repeating units in the resin (E).

The hydrophobic resin (E) may further contain a repeating unit represented by the following formula (III):

(III)

In formula (III), $R_{c31}$ represents a hydrogen atom, an alkyl group (which may be substituted with a fluorine atom or the like), a cyano group or a —$CH_2$—O—$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a fluorine atom or a silicon atom-containing group.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably an aryl group having a carbon number of 6 to 20, more preferably a phenyl group or a naphthyl group, and these groups may have a substituent.

$R_{c32}$ is preferably an unsubstituted alkyl group or an alkyl group substituted with a fluorine atom.

The divalent linking group of $L_{c3}$ is preferably an alkylene group (preferably having a carbon number of 1 to 5), an ether bond, a phenylene group or an ester bond (a group represented by —COO—).

The content of the repeating unit represented by formula (III) is preferably from 1 to 100 mol %, more preferably from 10 to 90 mol %, still more preferably from 30 to 70 mol %, based on all repeating units in the hydrophobic resin.

It is also preferred that the hydrophobic resin (E) further contains a repeating unit represented by the following formula (CII-AB):

(CII-AB)

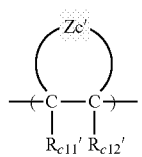

In formula (CII-AB), each of $R_{c11}'$ and $R_{c12}'$ independently represents a hydrogen atom, a cyano group, a halogen atom or an alkyl group.

$Z_c'$ (represents an atomic group for forming an alicyclic structure containing two carbon atoms (C—C) to which bonded.

The content of the repeating unit represented by formula (CII-AB) is preferably from 1 to 100 mol %, more preferably from 10 to 90 mol %, still more preferably from 30 to 70 mol %, based on all repeating units in the hydrophobic resin.

Specific examples of the repeating units represented by formulae (III) and (CII-AB) are illustrated below, but the present invention is not limited thereto. In the formulae, Ra represents H, CH₃, CH₂OH, CF₃ or CN.
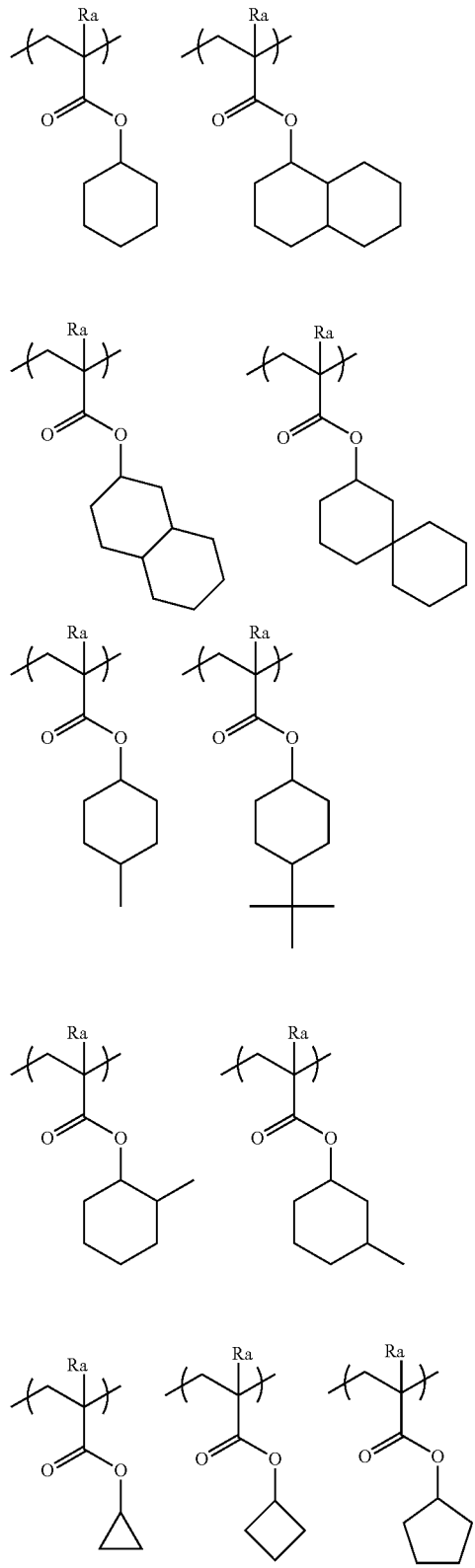
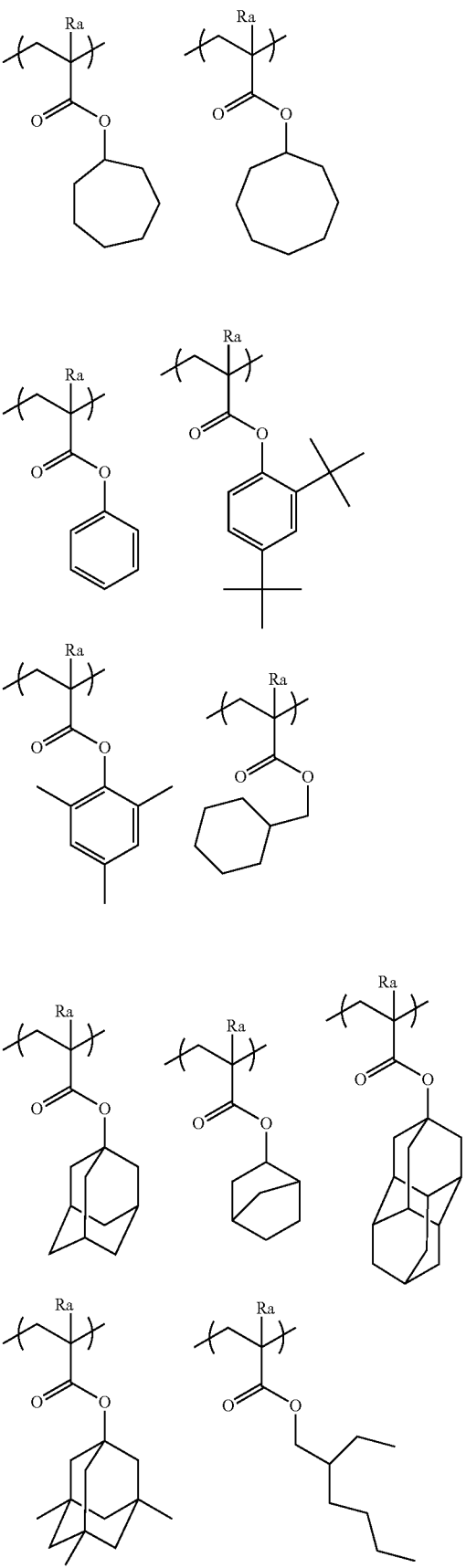

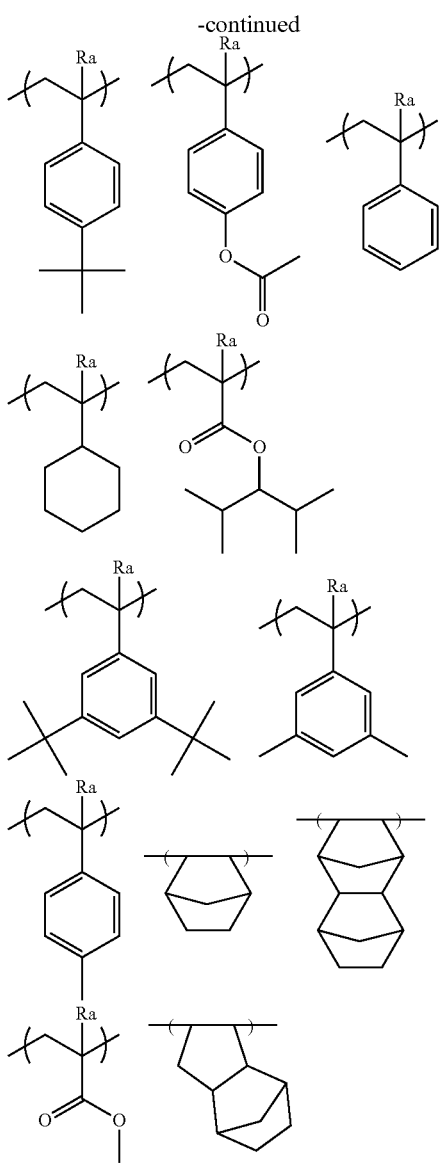

In the case where the hydrophobic resin (E) contains a fluorine atom, the fluorine atom content is preferably from 5 to 80 mass %, more preferably from 10 to 80 mass %, based on the weight average molecular weight of the hydrophobic resin (E). Also, the fluorine atom-containing repeating unit preferably accounts for 10 to 100 mol %, more preferably from 30 to 100 mol %, based on all repeating units contained in the hydrophobic resin (E).

In the case where the hydrophobic resin (E) contains a silicon atom, the silicon atom content is preferably from 2 to 50 mass %, more preferably from 2 to 30 mass %, based on the weight average molecular weight of the hydrophobic resin (E). Also, the silicon atom-containing repeating unit preferably accounts for 10 to 100 mol %, more preferably from 20 to 100 mol %, based on all repeating units contained in the hydrophobic resin (E).

The weight average molecular weight of the hydrophobic resin (E) is preferably from 1,000 to 100,000, more preferably from 1,000 to 50,000, still more preferably from 2,000 to 15,000, in terms of standard polystyrene.

As for the hydrophobic resin (E), one kind of a resin may be used, or a plurality of kinds of resins may be used in combination.

The content of the hydrophobic resin (E) in the composition is preferably from 0.01 to 10 mass %, more preferably from 0.05 to 8 mass %, still more preferably from 0.1 to 5 mass %, based on the entire solid content in the composition of the present invention.

In the hydrophobic resin (E), similarly to the resin (A), it is of course preferred that the content of impurities such as metal is small, but the content of residual monomers or oligomer components is also preferably from 0.01 to 5 mass %, more preferably from 0.01 to 3 mass %, still more preferably from 0.05 to 1 mass %. When these conditions are satisfied, a resist composition free from extraneous substances in liquid or changes with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As for the hydrophobic resin (E), various commercially available products may be used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (e.g., temperature, concentration) and the purification method after reaction are the same as those described for the resin (A), but in the synthesis of the hydrophobic resin (E), the concentration during reaction is preferably from 30 to 50 mass %.

Specific examples of the hydrophobic resin (E) are illustrated below. Also, the molar ratio of repeating units (corresponding to repeating units starting from the left), weight average molecular weight and polydispersity of each resin are shown in Tables 1 and 2 later.

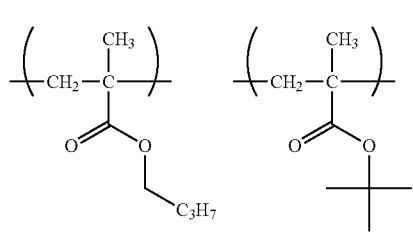

(HR-1)

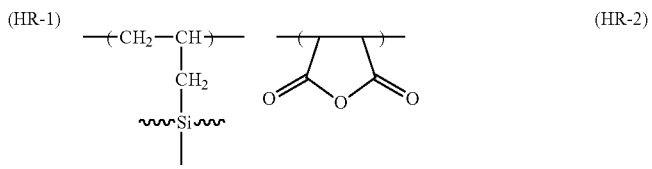

(HR-2)

-continued
| | |
|---|---|
| (HR-3) 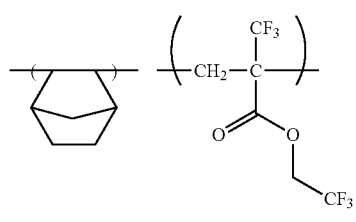 | (HR-4) 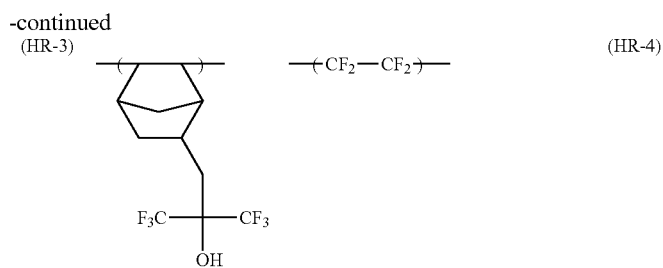 |
| (HR-5) 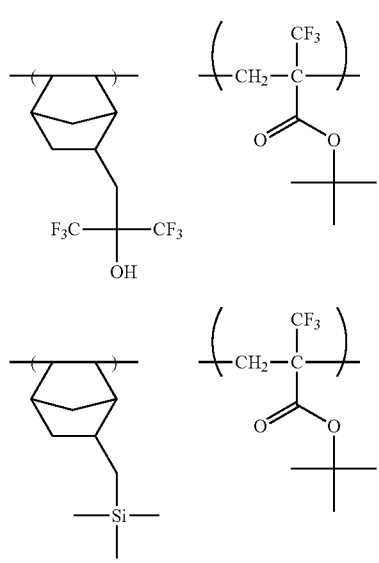 | (HR-6) 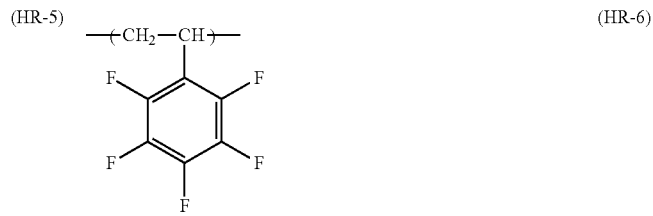 |
| (HR-7) | (HR-8) |
| | 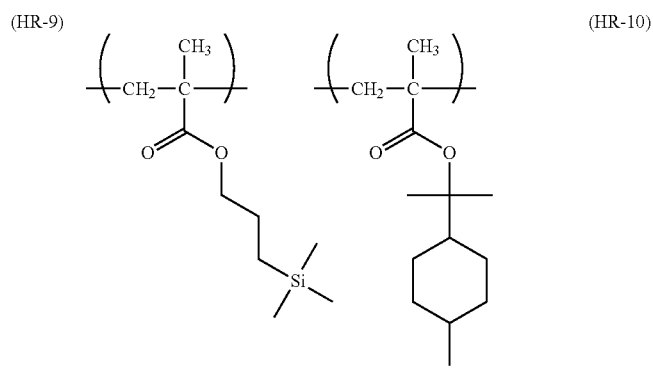 |
| 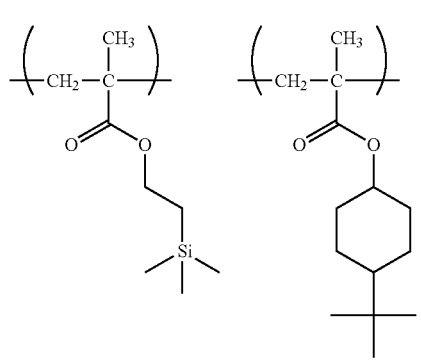 | |
| (HR-9) | (HR-10) |
| (HR-11) 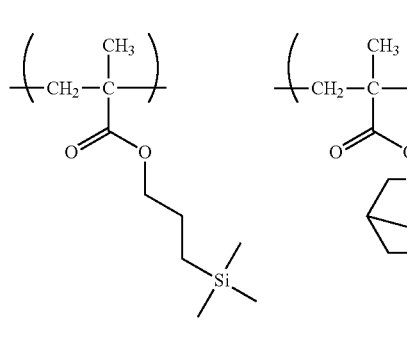 | (HR-12) 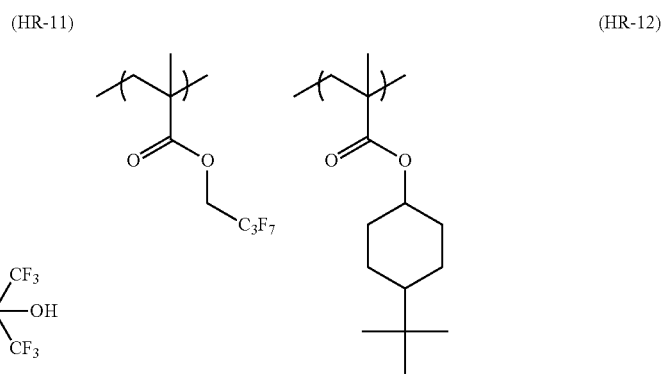 |

-continued
(HR-13)
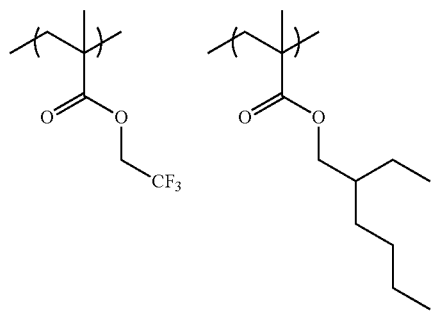
(HR-14)
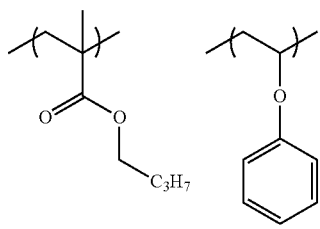
(HR-15)
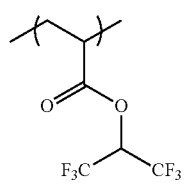
(HR-16)
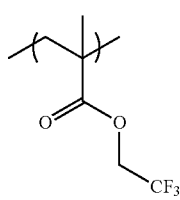
(HR-17)
(HR-18)
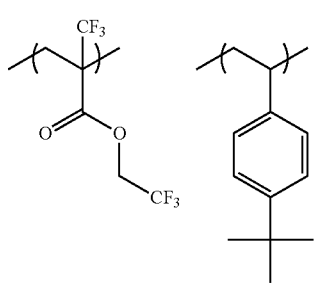
(HR-19)
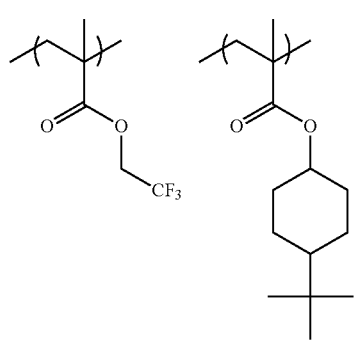
(HR-20)
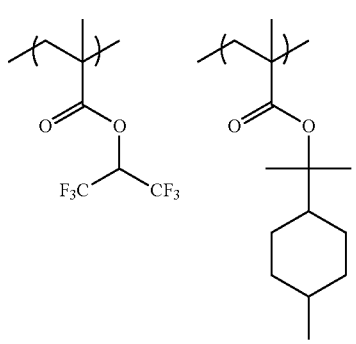
(HR-21)
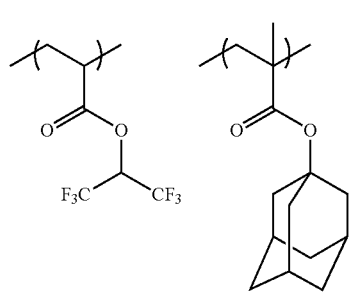
(HR-22)
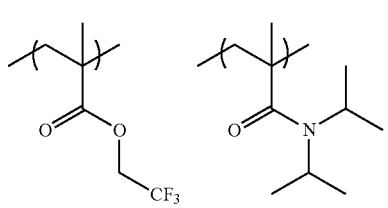

-continued
(HR-23)
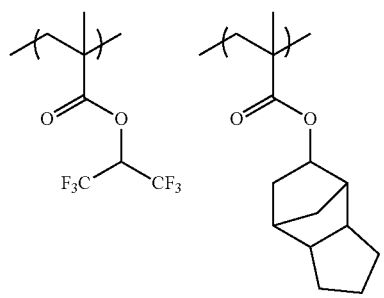
(HR-24)
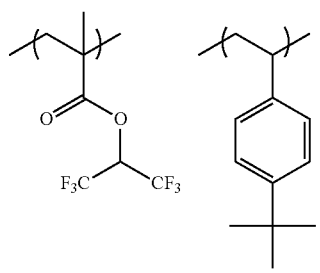
(HR-25)
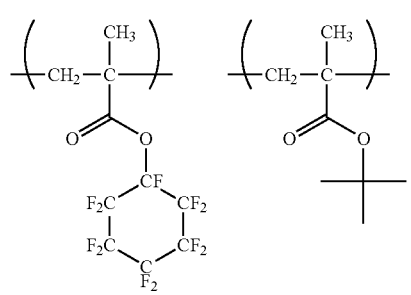
(HR-26)
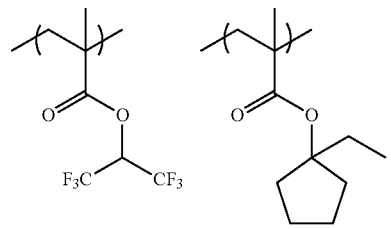
(HR-27)
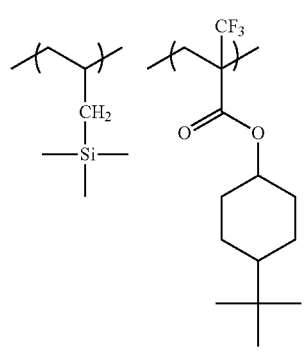
(HR-28)
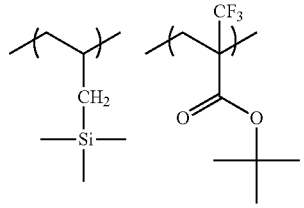
(HR-29)
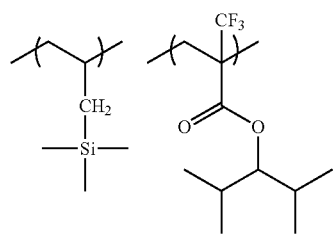
(HR-30)
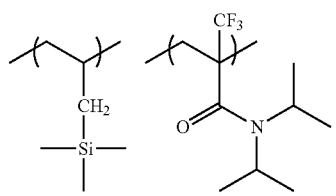
(HR-31)
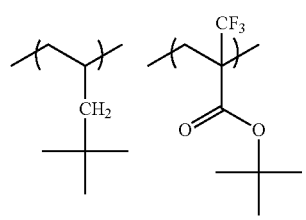

-continued
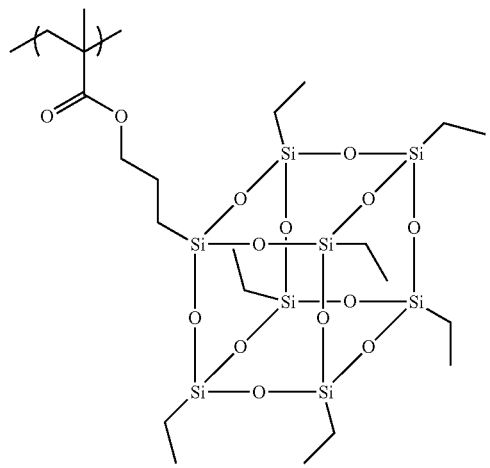
(HR-32)
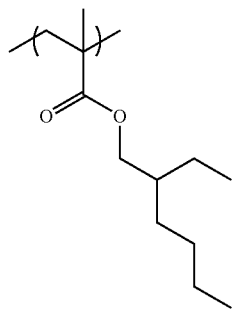
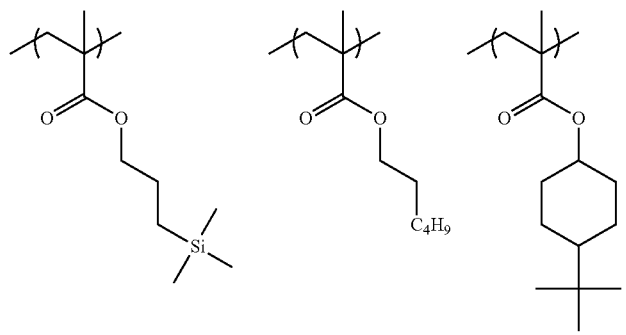
(HR-33)
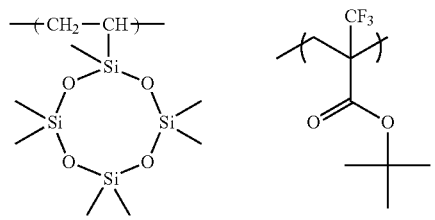
(HR-34)
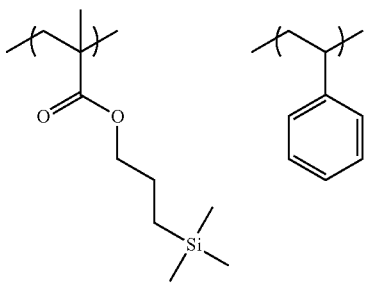
(HR-35)
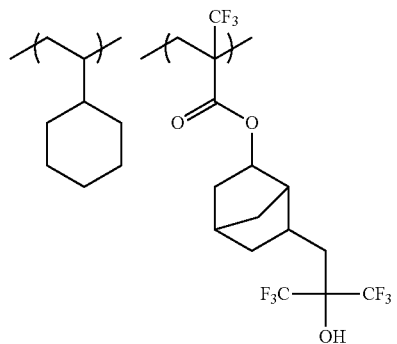
(HR-36)
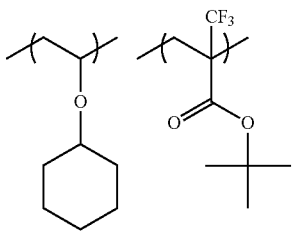
(HR-37)

-continued
(HR-38) 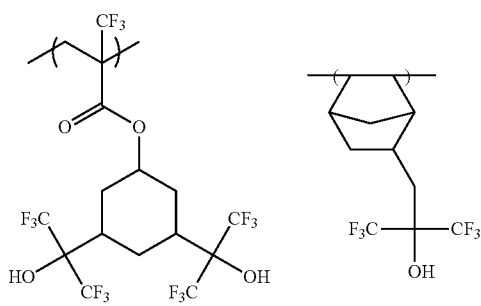
(HR-39) 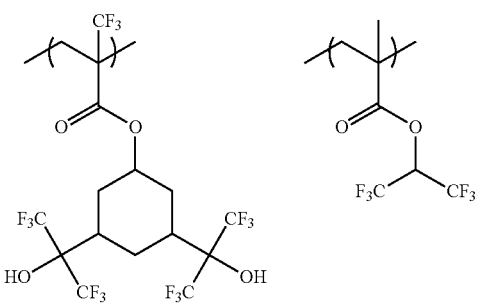
(HR-40) 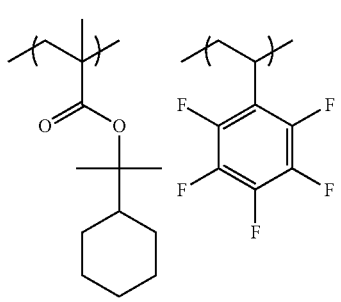
(HR-41) 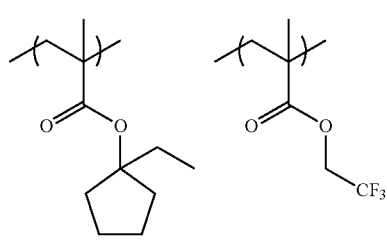
(HR-42) 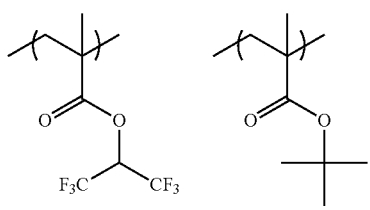
(HR-43) 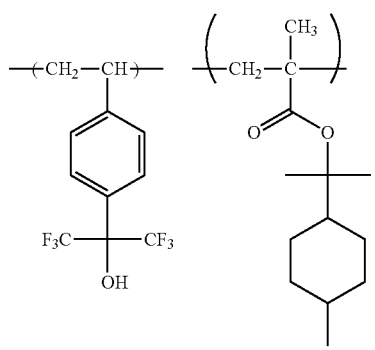
(HR-44) 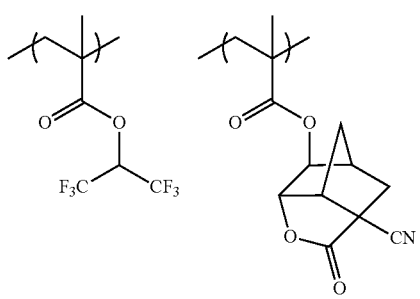
(HR-45) 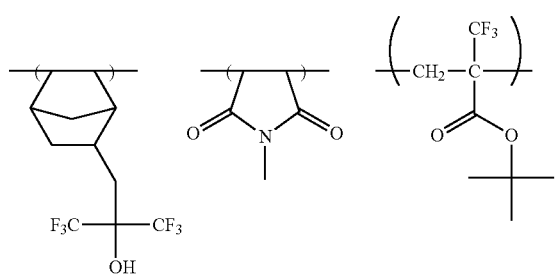
(HR-46) 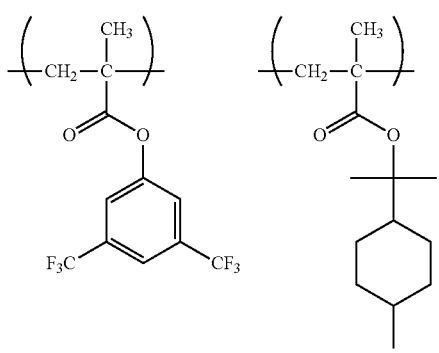
(HR-47) 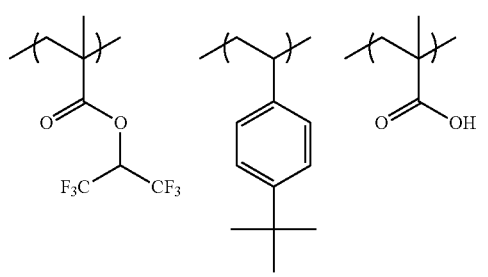

(HR-48)
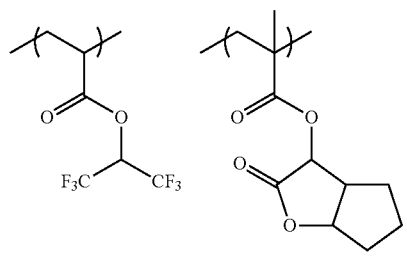
(HR-49)
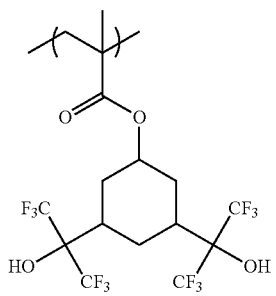
(HR-50)
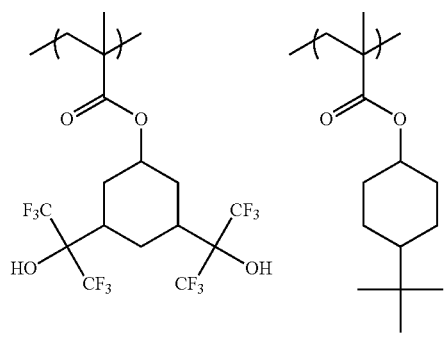
(HR-51)
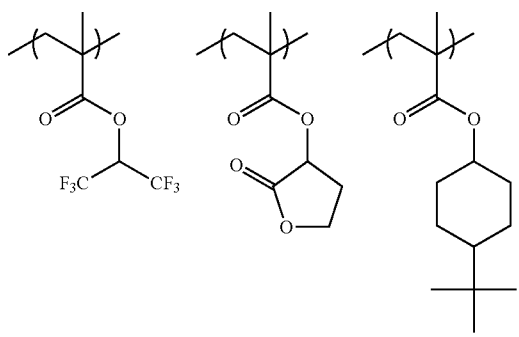
(HR-52)
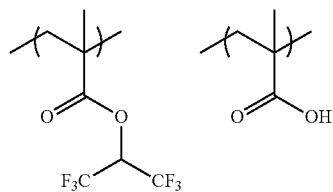
(HR-53)
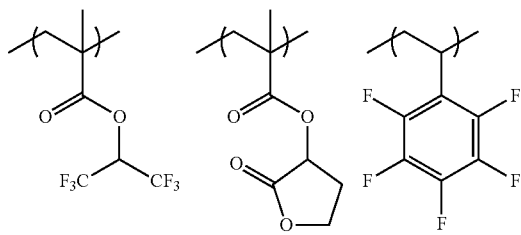
(HR-54)
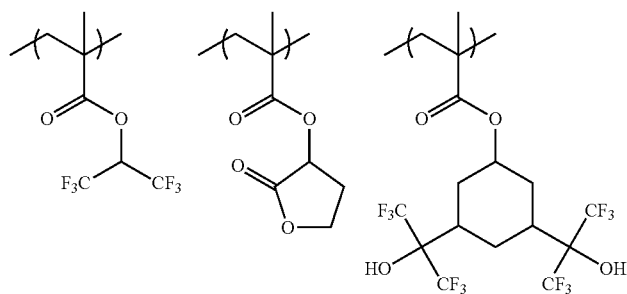
(HR-55)
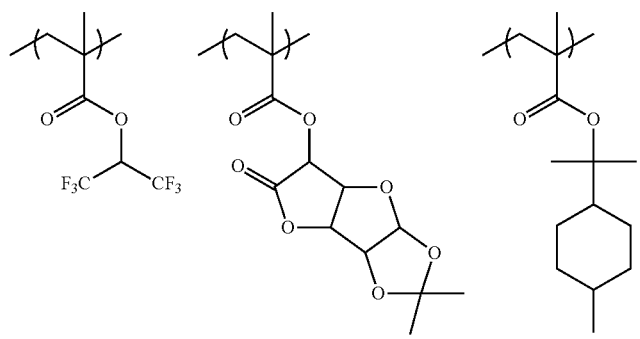

(HR-56)
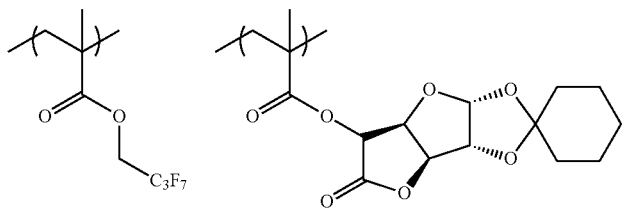
(HR-57)
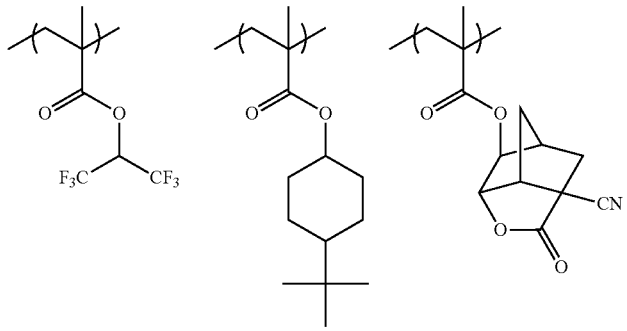
(HR-58)
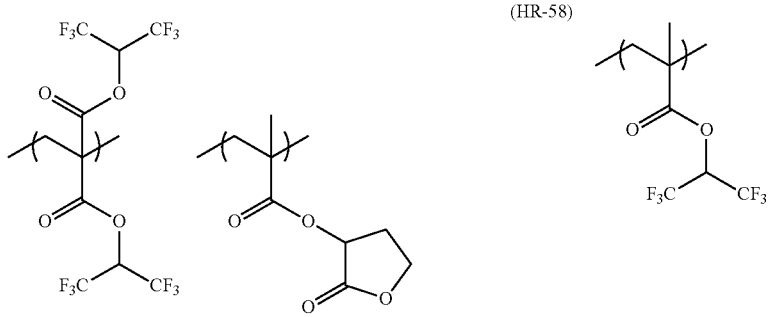
(HR-59)
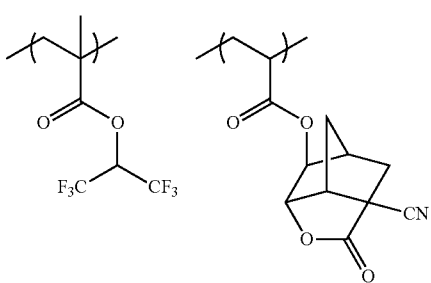
(HR-60)
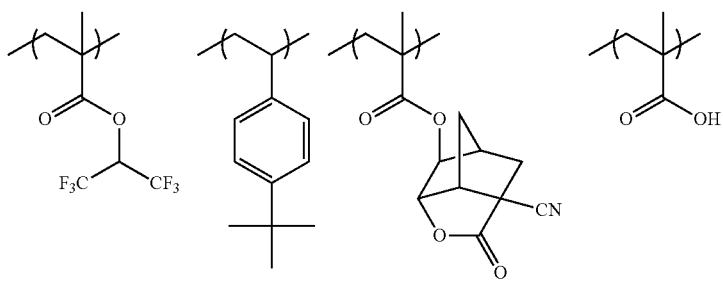
(HR-61) (HR-62)
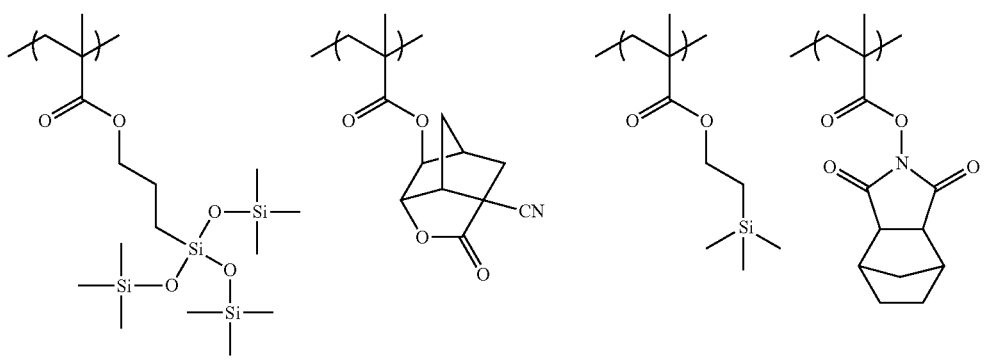

-continued
(HR-63)
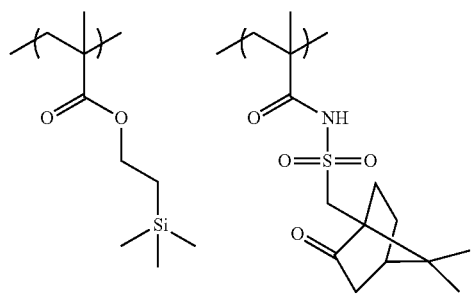
(HR-64)
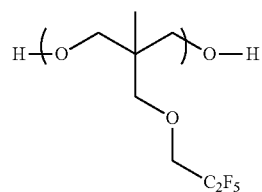
(HR-65)
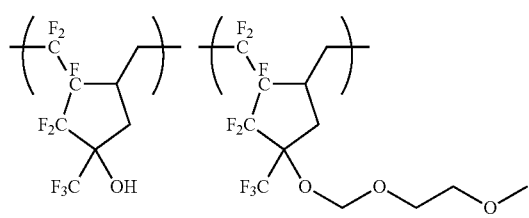
(HR-66)
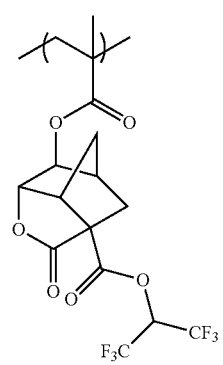
(HR-67)
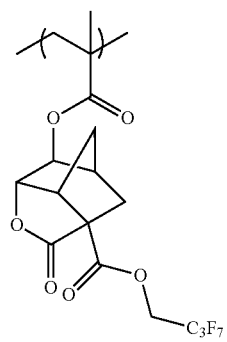
(HR-68)
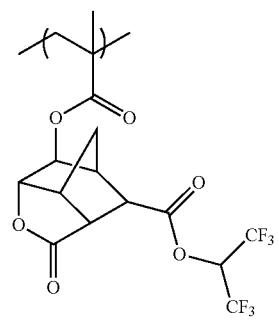
(HR-69)
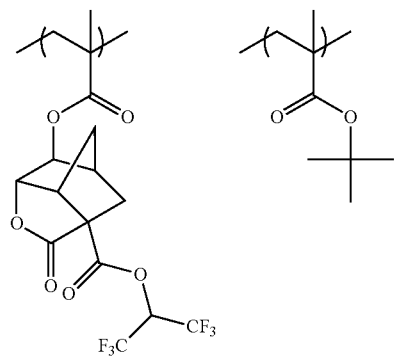
(HR-70)
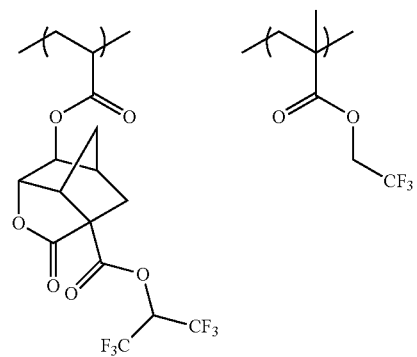

(HR-71)
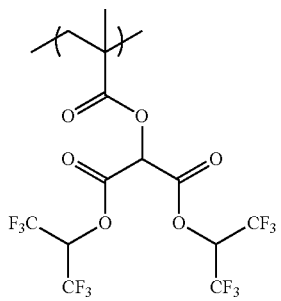
(HR-72)
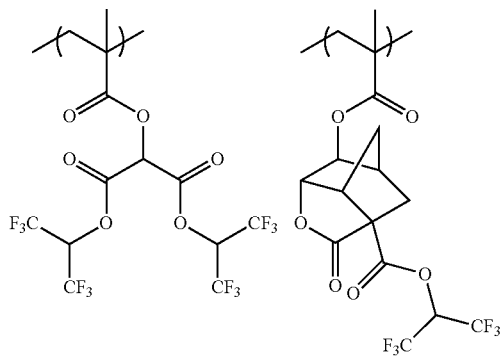
(HR-73)
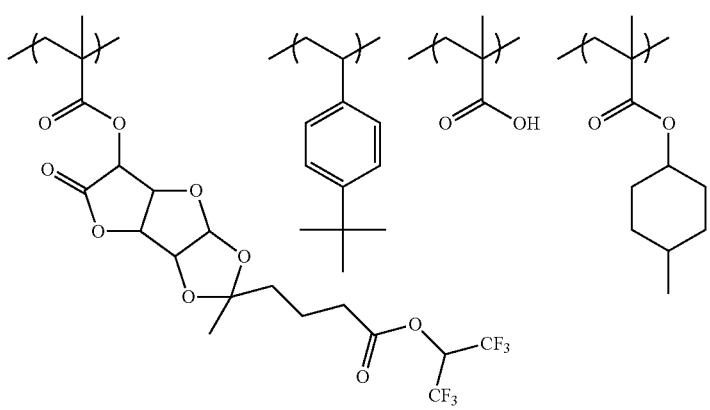
(HR-74)
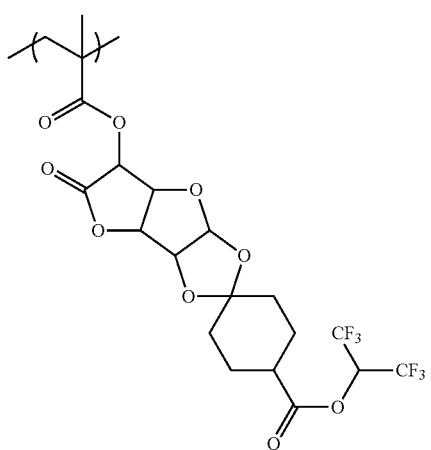
(HR-75)
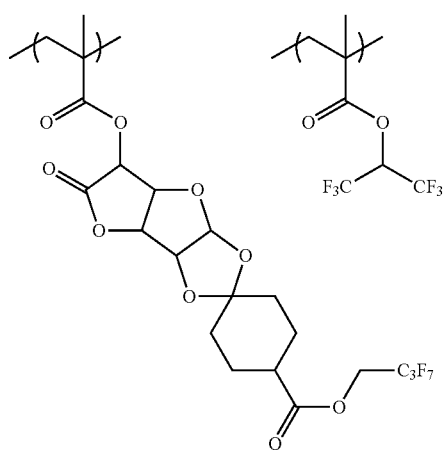

-continued
(HR-76)
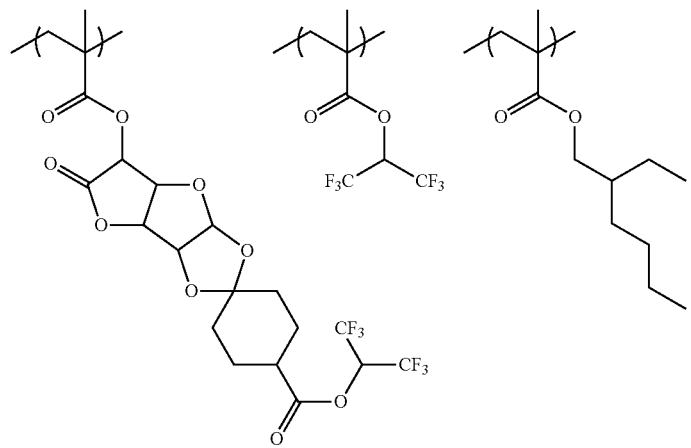
(HR-77)
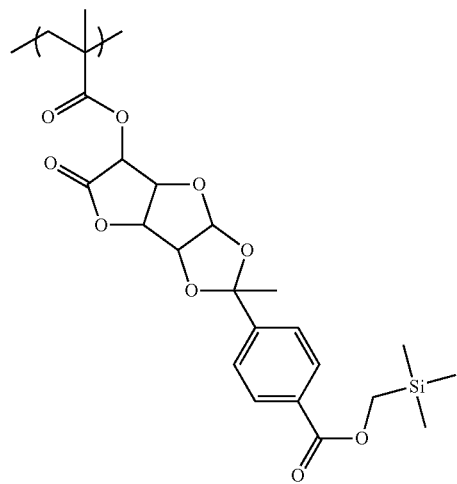
(HR-78)
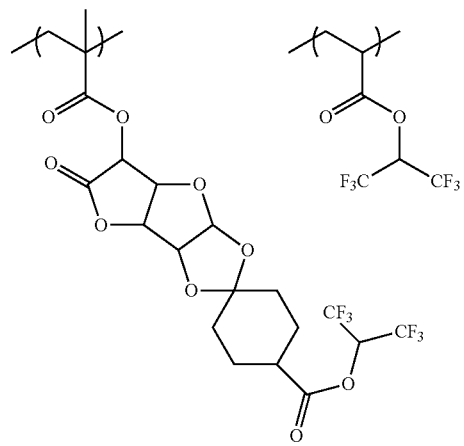
(HR-79)
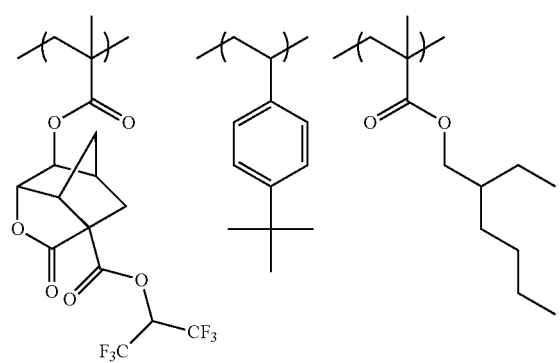
(HR-80)
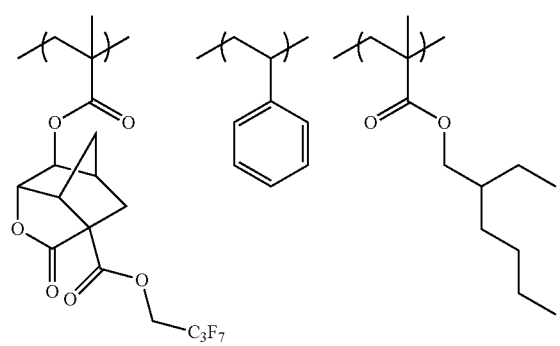

(HR-81)
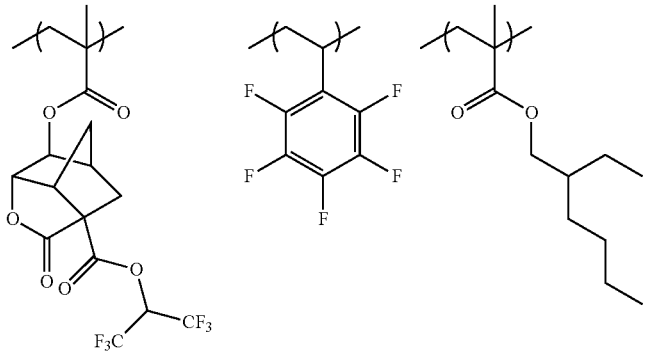
(HR-82)
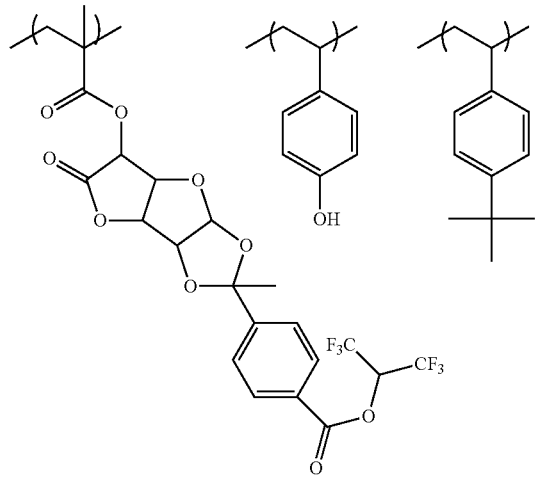
(HR-83)
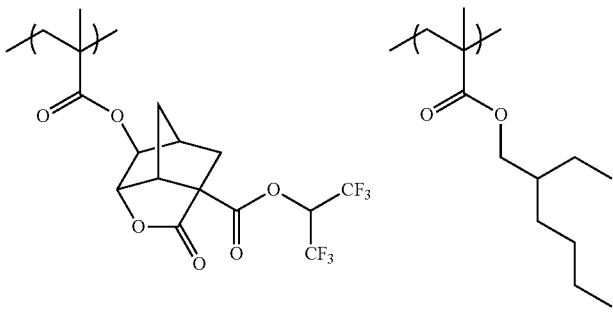
(HR-84)
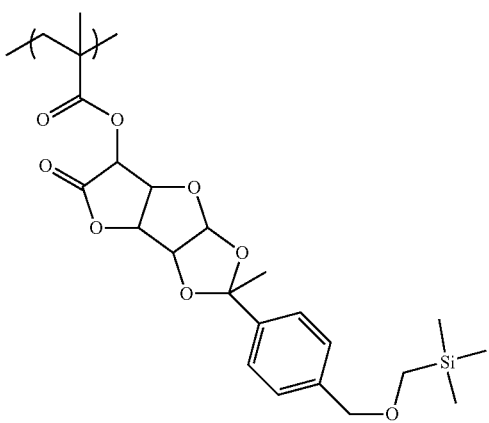
(HR-85)
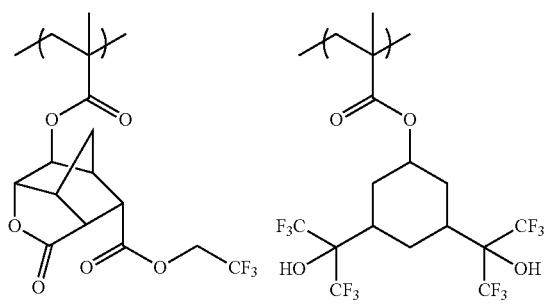

-continued
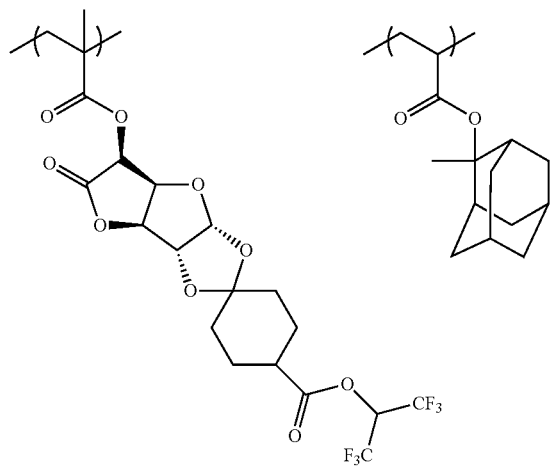
(HR-86) (HR-87)
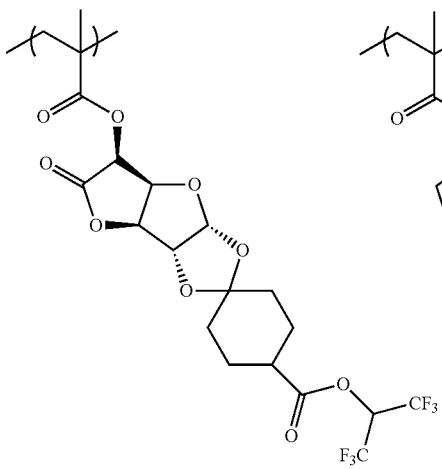
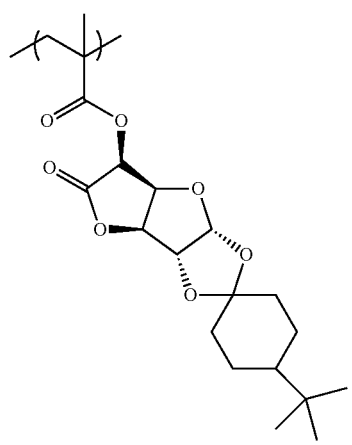
(HR-88)
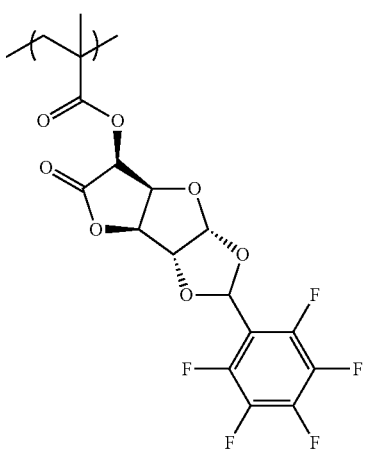
(HR-89)
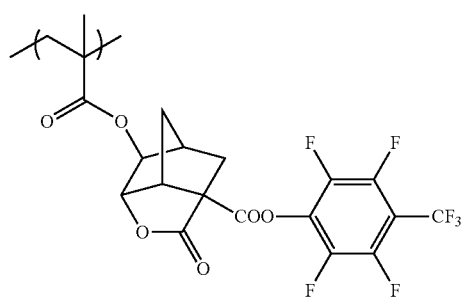
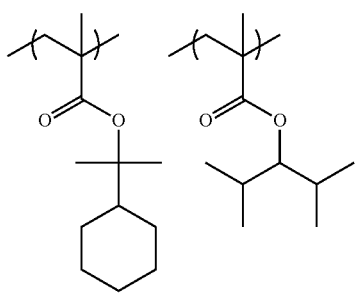
(HR-90)
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |

TABLE 1-continued

| Resin | Composition | Mw | Mw/Mn |
|---|---|---|---|
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[6] (F) Basic Compound

The resist composition of the present invention preferably contains (F) a basic compound so as to reduce the change of performance with aging from exposure to heating.

The basic compound is preferably a compound having a structure represented by the following formulae (A) to (E):

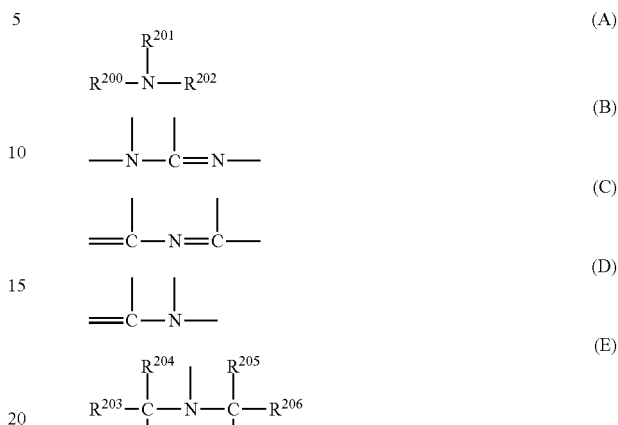

In formulae (A) to (E), each of $R_{200}$, $R_{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R_{201}$ and $R_{202}$ may combine together to form a ring. Each of $R_{203}$, $R_{204}$, $R_{205}$ and $R_{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide, and a 2-oxoalkyl group-containing sulfonium hydroxide, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure replaced by a carboxylate, and examples thereof include an acetate, an adamantane-1-carboxylate and a perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom. Also, an oxygen atom is preferably contained in the alkyl chain to form an oxyalkylene group. The number of oxyalkylene groups within the molecule is 1 or more, preferably from 3 to 9, more preferably from 4 to 6. Among oxyalkylene groups, structures of —CH$_2$CH$_2$O—, —CH(CH$_3$)CH$_2$O— and —CH$_2$CH$_2$CH$_2$O— are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in paragraph [0066] of U.S. Patent Application Publication 2007/0224539.

In addition, a nitrogen-containing organic compound having a group capable of leaving by the action of an acid, which is a kind of a basic compound, can be also used. Examples of this compound include a compound represented by the following formula (F). Incidentally, the compound represented by the following formula (F) exhibits an effective basicity in the system as a result of elimination of the group capable of leaving by the action of an acid.

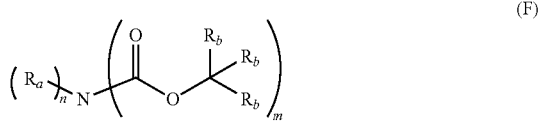

(F)

In formula (F), each Ra independently represents a hydrogen atom, an alkyl group, a cycloalkyl group, an aryl group or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group.

At least two Rb's may combine to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In formula (F), each of the alkyl group, cycloalkyl group, aryl group and aralkyl group represented by Ra and Rb may be substitute with a functional group such as hydroxyl group, cyano group, amino group, pyrrolidino group, piperidino group, morpholino group and oxo group, an alkoxy group or a halogen atom.

Examples of the alkyl group, cycloalkyl group, aryl group and aralkyl group (each of these alkyl, cycloalkyl, aryl and aralkyl groups may be substituted with the above-described functional group, an alkoxy group or a halogen atom) of R include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more cycloalkyl groups such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more linear or branched alkyl groups such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more linear or branched alkyl groups such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more linear or branched alkyl groups or aromatic compound-derived groups; a group where the group derived from a linear or branched alkane or the group derived from a cycloalkane is substituted with one or more kinds of or one or more aromatic compound-derived groups such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more linear or branched alkane-derived groups, cycloalkane-derived groups, aromatic compound-derived groups, heterocyclic compound-derived groups or functional groups such as hydroxyl group, cyano group, amino group, pyrrolidino group, piperidino group, morpholino group and oxo group.

Specific examples particularly preferred in the present invention include N-tert-butoxycarbonyl di-n-octyl amine, N-tert-butoxycarbonyldi-n-nonylamine, N-tert-butoxycarbonyldi-n-decylamine, N-tert-butoxycarbonyldicyclohexyl amine, N-tert-butoxycarbonyl-1-adamantylamine, N-tert-butoxycarbonyl-2-adamantylamine, N-tert-butoxycarbonyl-N-methyl-1-adamantylamine, (S)-(−)-1-(tert-butoxycarbonyl)-2-pyrrolidinemethanol, (R)-(+)-1-(tert-butoxycarbonyl)-2-pyrrolidinemethanol, N-tert-butoxycarbonyl-4-hydroxypiperidine, N-tert-butoxycarbonylpyrrolidine, N-tert-butoxycarbonylmorpholine, N-tert-butoxycarbonylpiperazine, N,N-di-tert-butoxycarbonyl-1-adamantylamine, N,N-di-tert-butoxycarbonyl-N-methyl-1-adamantyl amine, N-tert-butoxycarbonyl-4,4'-diaminodiphenylmethane, N,N-di-tert-butoxycarbonylhexamethylenediamine, N,N,N',N'-tetra-tert-butoxycarbonylhexamethylenediamine, N,N'-di-tert-butoxycarbonyl-1,7-diaminoheptane, N,N'-di-tert-butoxycarbonyl-1,8-diaminooctane, N,N'-di-tert-butoxycarbonyl-1,9-diaminononane, N,N'-di-tert-butoxycarbonyl-1,10-diaminodecane, N,N'-di-tert-butoxycarbonyl-1,12-diaminodo decane, N,N'-di-tert-butoxycarbonyl-4,4'-diaminodiphenylmethane, N-tert-butoxycarbonylbenzimidazole, N-tert-butoxycarbonyl-2-methylbenzimidazole and N-tert-butoxycarbonyl-2-phenylbenzimidazole.

As for the compound represented by formula (F), a commercial product may be used, or the compound may be synthesized from a commercially available amine by the method described, for example, in Protective Groups in Organic Synthesis, 4th edition. The compound may be synthesized by the method described, for example, in JP-A-2009-199021, which is a most general method.

The molecular weight of the basic compound is preferably from 250 to 2,000, more preferably from 400 to 1,000. From the standpoint of more reducing LWR, the molecular weight of the basic compound is preferably 400 or more, more preferably 500 or more, still more preferably 600 or more.

One of these basic compounds is used alone, or two or more thereof are used in combination.

The amount of the basic compound used is usually from 0.001 to 10 mass %, preferably from 0.01 to 5 mass %, based on the solid content of the resist composition.

The ratio between the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

[7] (G) Surfactant

The resist composition of the present invention may or may not further contain a surfactant and in the case of containing a surfactant, it is preferred to contain any one of fluorine-containing and/or silicon-containing surfactants (a fluorine-containing surfactant, a silicon-containing surfactant or a surfactant containing both a fluorine atom and a silicon atom), or two or more thereof.

By virtue of containing a surfactant, the resist composition of the present invention can give a resist pattern with good sensitivity, resolution and adherence as well as little development defect when used for exposure to a light source of 250 nm or less, particularly 220 nm or less.

Examples of the fluorine-containing and/or silicon-containing surfactants include the surfactants described in paragraph [0276] of U.S. Patent Application Publication 2008/0248425, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, Polysiloxane Polymer KP-341 (produced by Shin-Etsu Chemical Co., Ltd.) may be also used as the silicon-containing surfactant.

As for the surfactant, other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the surfactant coming under this type include Megaface F 178, F-470, F-473, F-475, F-476 and F-472 (produced by Dainippon Ink & Chemicals, Inc.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactants, described in paragraph [0280] of U.S. Patent Application Publication 2008/0248425, may be also used.

One of these surfactants may be used alone, or some of them may be used in combination.

In the case where the resist composition contains a surfactant, the amount of the surfactant used is preferably from 0.0001 to 2 mass %, more preferably from 0.0005 to 1 mass %, based on the entire amount of the resist composition (excluding the solvent).

On the other hand, by setting the amount added of the surfactant to 10 ppm or less based on the entire amount of the resist composition (excluding the solvent), the hydrophobic resin is more unevenly distributed to the surface, so that the resist film surface can be made more hydrophobic and the followability of water at the immersion exposure can be enhanced.

[8] (H) Other Additives

The resist composition of the present invention may or may not contain an onium carboxylate. Examples of onium carboxylate include those described in paragraphs [0605] and [0606] of U.S. Patent Application Publication No. 2008/0187860.

Such an onium carboxylate can be synthesized by reacting a sulfonium, iodonium or ammonium hydroxide and a carboxylic acid with silver oxide in an appropriate solvent.

In the case where the resist composition contains an onium carboxylate, the content thereof is generally from 0.1 to 20 mass %, preferably from 0.5 to 10 mass %, more preferably from 1 to 7 mass %, based on the entire solid content of the composition.

The resist composition of the present invention may further contain, for example, a dye, a plasticizer, a photosensitizer, a light absorber, an alkali-soluble resin, a dissolution inhibitor, and a compound capable of accelerating dissolution for a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

The solid content concentration of the resist composition of the present invention is usually from 1.0 to 10 mass %, preferably from 2.0 to 5.7 mass %, more preferably from 2.0 to 5.3 mass %. When the solid content concentration is in this range, the resist solution can be uniformly applied on a substrate and moreover, a resist pattern improved in the line edge roughness can be formed. The reasons therefor are not clearly known, but it is considered that by setting the solid content concentration to 10 mass % or less, preferably 5.7 mass % or less, the materials, particularly the photoacid generator, in the resist solution are prevented from aggregation, as a result, a uniform resist film can be formed.

The solid content concentration is a weight percentage of the weight of resist components excluding solvents, based on the total weight of the resist composition.

[9] Pattern Forming Method

The pattern forming method (negative pattern forming method) of the present invention comprises at least:

a step of forming a film (resist film) from a chemical amplification resist composition, (ii) a step of exposing the film, and (iii) a step of performing development by using an organic solvent-containing developer.

The resist film is formed from the above-described chemical amplification resist composition of the present invention and, more specifically, is preferably formed on a substrate. In the pattern forming method of the present invention, the step of forming a film from a resist composition on a substrate, the step of exposing the film, and the development step can be performed by a generally known method.

The present invention also relates to a chemical amplification resist composition used for the pattern forming method. That is, the present invention also relates to a chemical amplification resist composition for organic solvent development, containing the resin (A), the compound (B) and the compound (C) capable of decomposing by the action of an acid to enhance the volatility. The term "for organic solvent development" as used herein means to use the composition at least in the step (iii) above.

It is also preferred to include, after film formation, a preheating step (PB; Prebake) before the exposure step.

Furthermore, it is also preferred to include a post-exposure heating step (PEB; Post Exposure Bake) after the exposure step but before the development step.

As for the heating temperature, both PB and PEB are preferably performed at 70 to 120° C., more preferably at 80 to 110° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

In the present invention, particularly the volatilization of an alkene produced by the dehydration reaction of the tertiary alcohol (C) can be accelerated by performing the post-exposure baking, and remaining of the alkene in the exposed area can be reduced or prevented.

The light source wavelength of the exposure apparatus for use in the present invention is not limited, but, for example, a KrF excimer laser wavelength (248 nm), an ArF excimer laser wavelength (193 nm) and an $F_2$ excimer laser wavelength (157 nm) are applicable.

In the present invention, an immersion exposure method can be applied in the step of performing exposure.

The immersion exposure method is a technique to increase the resolution, and this is a technique of performing the exposure by filling a high refractive-index liquid (hereinafter, sometimes referred to as an "immersion liquid") between the projection lens and the sample.

As for the "effect of immersion", assuming that $\lambda_0$ is the wavelength of exposure light in air, n is the refractive index of the immersion liquid for air, $\theta$ is the convergence half-angle of beam and $NA_0 = \sin \theta$, the resolution and the depth of focus in immersion can be expressed by the following formulae. Here, $k_1$ and $k_2$ are coefficients related to the process.

$$(\text{Resolution}) = k_1 \cdot (\lambda_0/n)/NA_0$$

$$(\text{Depth of focus}) = \pm k_2 \cdot (\lambda_0/n)/NA_0^2$$

That is, the effect of immersion is equal to use of an exposure wavelength of 1/n. In other words, in the case of a projection optical system having the same NA, the depth of focus can be made n times larger by the immersion. This is effective for all pattern profiles and furthermore, can be combined with the super-resolution technology under study at present, such as phase-shift method and modified illumination method.

In the case of performing immersion exposure, a step of washing the film surface with an aqueous chemical solution may be performed (1) after forming the film on a substrate but before the step of performing exposure and/or (2) after the step of exposing the film through an immersion liquid but before the step of heating the film.

The immersion liquid is preferably a liquid being transparent to light at the exposure wavelength and having as small a temperature coefficient of refractive index as possible in order to minimize the distortion of an optical image projected on the film. Particularly, when the exposure light source is an ArF excimer laser (wavelength: 193 nm), water is preferably used in view of easy availability and easy handleability in addition to the above-described aspects.

In the case of using water, an additive (liquid) capable of decreasing the surface tension of water and increasing the interface activity may be added in a small ratio. This additive is preferably a liquid that does not dissolve the resist layer on the wafer and at the same time, gives only a negligible effect on the optical coat on the undersurface of the lens element.

Such an additive is preferably, for example, an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the liquid as a whole can be advantageously made very small.

On the other hand, if a substance opaque to light at 193 nm or an impurity greatly differing in the refractive index from water is mingled, this incurs distortion of the optical image projected on the resist. Therefore, the water used is preferably distilled water. Furthermore, pure water after filtration through an ion exchange filter or the like may be also used.

In the present invention, the substrate on which the film is formed is not particularly limited, and an inorganic substrate such as silicon, SiN, SiO$_2$ and SiN, a coating-type inorganic substrate such as SOCK, or a substrate generally used in the process of producing a semiconductor such as IC or producing a liquid crystal device or a circuit board such as thermal head or in the lithography of other photo-fabrication processes can be used. If desired, an organic antireflection film may be formed between the film and the substrate.

In the case where the pattern forming method of the present invention further includes a step of performing development by using an alkali developer, examples of the alkali developer which can be used include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

This alkaline aqueous solution may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous solution of 2.38 mass % tetramethylammonium hydroxide is preferred.

As for the rinsing solution in the rinsing treatment performed after the alkali development, pure water is used, and the pure water may be used after adding thereto an appropriate amount of a surfactant.

As for the developer in the step of performing development by using an organic solvent-containing developer (hereinafter, sometimes referred to as an "organic developer"), a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include dioxane and tetrahydrofuran, in addition to the glycol ether-based solvents above.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the water content ratio in the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the entire amount of the developer.

In particular, the organic developer is preferably a developer containing at least one kind of an organic solvent selected from the group consisting of a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the organic developer, a surfactant may be added in an appropriate amount, if desired.

The surfactant is not particularly limited but, for example, ionic or nonionic fluorine-containing and/or silicon-containing surfactants can be used. Examples of such fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As regards the developing method, for example, a method of dipping the substrate in a bath filled with the developer for a fixed time (dipping method), a method of raising the developer on the substrate surface by the effect of a surface tension and keeping it still for a fixed time, thereby performing development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film or resist pattern is kept from inadvertent chipping or collapse.

Here, the ejection pressure (ml/sec/mm$^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using an organic solvent-containing developer, a step of stopping the development by replacing the solvent with another solvent may be practiced.

A step of rinsing the film with a rinsing solution is preferably provided after the step of performing development by using an organic solvent-containing developer.

The rinsing solution used in the rinsing step after the step of performing development by using an organic solvent-containing developer is not particularly limited as long as it does not dissolve the resist pattern, and a solution containing a general organic solvent may be used. As for the rinsing solution, a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent are the same as those described above for the organic solvent-containing developer.

After the step of performing development by using an organic solvent-containing developer, more preferably, a step of rinsing the film by using a rinsing solution containing at least one kind of an organic solvent selected from the group consisting of a ketone-based solvent, an ester-based solvent, an alcohol-based solvent and an amide-based solvent is performed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The water content ratio in the rinsing solution is preferably 10 mass % or less, more preferably 5 mass % or less, still more preferably 3 mass % or less. By setting the water content ratio to 10 mass % or less, good development characteristics can be obtained.

The vapor pressure at 20° C. of the rinsing solution used after the step of performing development by using an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may be also used after adding thereto an appropriate amount of a surfactant.

In the rinsing step, the wafer after development using an organic solvent-containing developer is rinsed using the above-described organic solvent-containing rinsing solution. The method for rinsing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the rinsing treatment by the spin coating method and after the rinsing, remove the rinsing solution from the substrate surface by spinning the substrate at a rotational speed of 2,000 to 4,000 rpm. It is also preferred to include a heating step (Post Bake) after the rinsing step. The developer and rinsing solution remaining between patterns and in the inside of the pattern are removed by the baking. The heating step after the rinsing step is performed at usually from 40 to 160° C., preferably from 70 to 95° C., for usually from 10 seconds to 3 minutes, preferably from 30 to 90 seconds.

EXAMPLES

The present invention is described below by referring to Examples, but the present invention should not be construed as being limited thereto.

Synthesis Example 1

Synthesis of Resin (A)

Synthesis of Resin (A-1):

In a nitrogen stream, a three-neck flask was charged with 40 g of cyclohexanone and heated at 80° C. (Solvent 1). Monomers corresponding to the following repeating units were dissolved in a molar ratio of 40/10/40/10 in cyclohexanone to prepare a 22 mass % monomer solution (400 g), and polymerization initiator V-601 (produced by Wako Pure Chemical Industries, Ltd.) in a concentration of 7.2 mol % based on the monomers was added thereto and dissolved. The resulting solution was added dropwise to Solvent 1 over 6 hours. After the completion of dropwise addition, the reaction was further allowed to proceed at 80° C. for 2 hours. The reaction solution was left standing to cool and then poured in 3,600 ml of heptane/400 ml of ethyl acetate, and the powder precipitated was collected by filtration and dried, as a result, 74 g of Resin (A-1) was obtained. The compositional ratio of the polymer as determined from NMR was 40/10/40/10. Also, the weight average molecular weight of the obtained Resin (A-1) was 8,100 and the polydispersity (Mw/Mn) was 1.66.

Synthesis Example 2

Synthesis of Hydrophobic Resin 1

Respective monomers corresponding to the following repeating units were charged in a ratio (molar ratio) of 20/80 and dissolved in propylene glycol monomethyl ether acetate (PGMEA) to prepare 450 g of a solution having a solid content concentration of 15 mass %. To this solution, 1 mol % of polymerization initiator V-60 produced by Wako Pure Chemical Industries, Ltd. was added and in a nitrogen atmosphere, the resulting mixture was added dropwise over 6 hours to 50 g of PGMEA heated to 100° C. After the completion of dropwise addition, the reaction solution was stirred for 2 hours. Once the reaction was completed, the reaction solution was cooled to room temperature and crystallized from 5 L of methanol, and the precipitated white powder was collected by filtration to obtain the objective Hydrophobic Resin 1.

The compositional ratio of the polymer as determined from NMR was 20/80. Also, the weight average molecular weight in terms of standard polystyrene as determined by GPC measurement was 6,500, and the polydispersity was 1.53.

Resins (A-2) to (A-8) and Hydrophobic Resins 2 to 8 were synthesized in the same manner as in Synthesis Examples 1 and 2 except for using monomers corresponding to respective repeating units to give a desired compositional ratio (molar ratio).

Structures of Resins (A-1) to (A-8) and Hydrophobic Resins 1 to 8 are shown below. Also, the compositional ratio (molar ratio), weight average molecular weight and polydispersity of each of Resins (A-1) to (A-8) and Hydrophobic Resins 1 to 8 are shown in Table 3.

TABLE 3

| Resin | Composition (molar ratio) | Mw | Mw/Mn |
|---|---|---|---|
| A-1 | 40/10/40/10 | 8100 | 1.66 |
| A-2 | 20/20/50/10 | 13800 | 1.77 |
| A-3 | 55/25/15/5 | 10500 | 1.65 |
| A-4 | 40/50/10 | 7200 | 1.55 |
| A-5 | 40/10/30/20 | 11500 | 1.71 |
| A-6 | 40/5/45/10 | 7100 | 1.56 |
| A-7 | 35/10/35/15/5 | 11000 | 1.77 |
| A-8 | 30/15/25/30 | 6500 | 1.49 |
| 1 | 20/80 | 6500 | 1.53 |
| 2 | 50/50 | 4500 | 1.52 |
| 3 | 25/75 | 3600 | 1.44 |
| 4 | 40/60 | 5100 | 1.40 |
| 5 | 40/55/5 | 4100 | 1.35 |
| 6 | 37/60/3 | 7500 | 1.65 |
| 7 | 30/70 | 10000 | 1.75 |
| 8 | 45/55 | 3500 | 1.21 |

TABLE 3-continued
| Resin | Composition (molar ratio) | Mw | Mw/Mn |
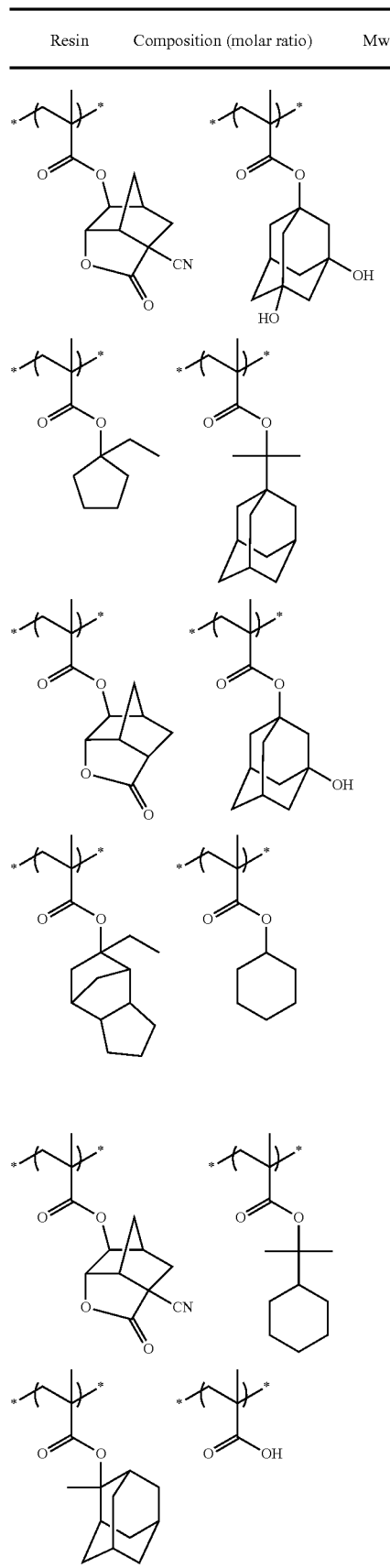
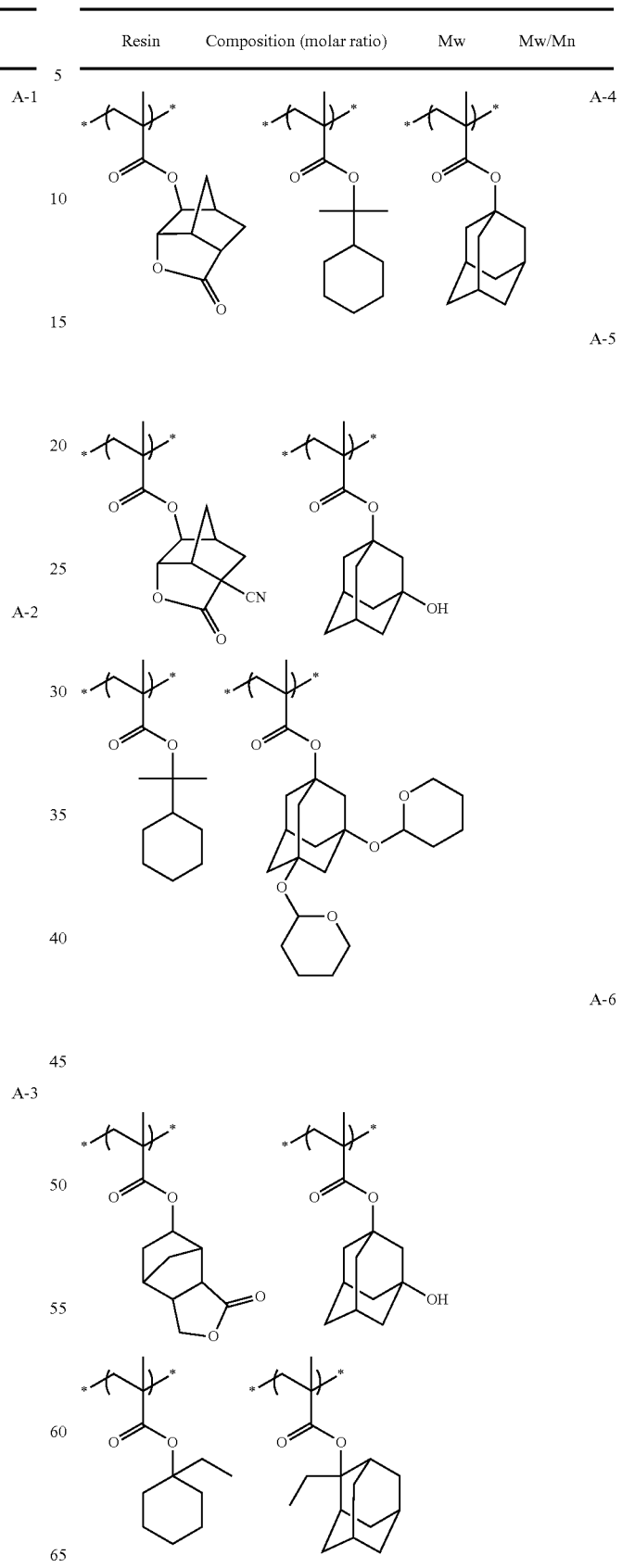

TABLE 3-continued

| Resin | Composition (molar ratio) | Mw | Mw/Mn |
|---|---|---|---|

A-7: [structures shown: lactone-containing methacrylate / hydroxyadamantyl methacrylate; ethyl-norbornyl methacrylate / dioxaspiro methacrylate; hexafluoroisopropanol-containing methacrylate; lactone methacrylate / hydroxyadamantyl methacrylate; adamantyl t-butyl carbonate methacrylate / ethylcyclopentyl methacrylate; hexafluoroisopropyl methacrylate / t-butylphenyl styrene; trimethylsilylmethyl styrene / t-butyl methacrylate with CF₃]

A-8: [structures shown: norbornyl / t-butyl trifluoromethyl methacrylate; norbornyl-HFIP / t-butyl trifluoromethyl methacrylate; norbornyl / trifluoroethyl trifluoromethyl methacrylate / methacrylic acid; hexafluoroisopropyl methacrylate / t-butyl methacrylate / methacrylic acid; trifluoroethyl methacrylate / t-butylcyclohexyl methacrylate; hexafluoroisopropyl methacrylate / ethylcyclopentyl methacrylate]

Synthesis Example 3

Synthesis of Acid Generator (PAG-10)

Acid Generator (PAG-10) was synthesized in accordance with the description in paragraphs [0382] to [0385] of WO2008153110A1.

Photoacid Generators (PAG-1) to (PAG-9), (PAG-11) and (PAG-12) represented by the following formulae were synthesized in the same manner.

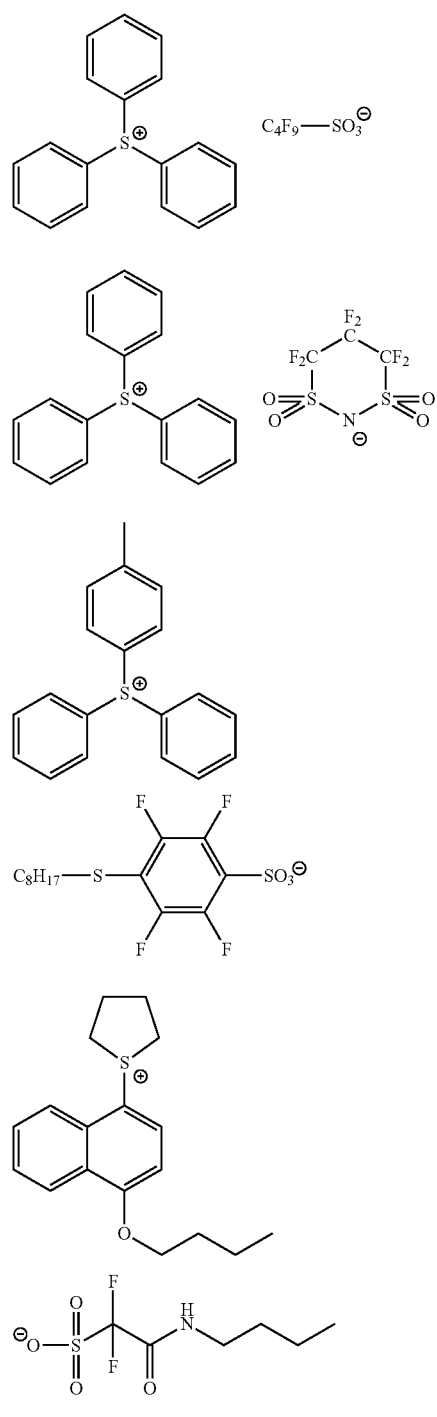
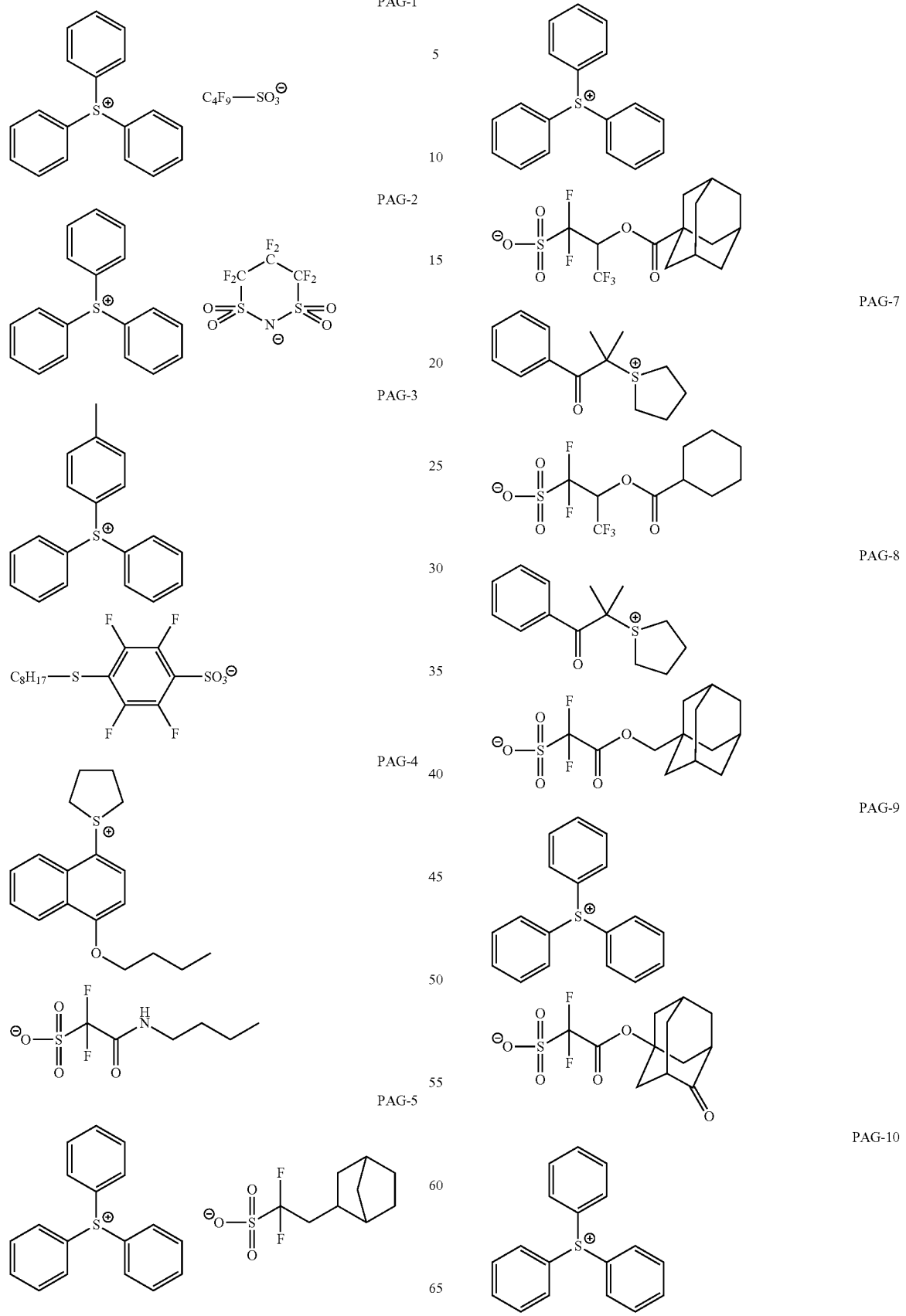

-continued

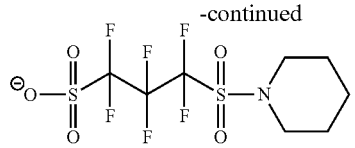

PAG-11

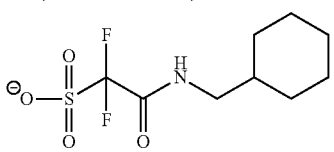

-continued

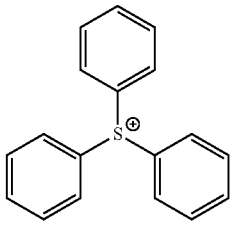

PAG-12

<Preparation of Resist Composition>

The components shown in Table 4 below were dissolved in the solvent shown in Table 4, and the resulting solution was filtered through a polyethylene filter having a pore size of 0.03 μm to prepare the resist compositions of Examples 1 to 10 and Comparative Examples 1 and 2.

TABLE 4

| | Resin (A) | | Resin Used in Combination | | Hydrophobic Resin | | Acid Generator 1 | | Acid Generator 2 | | Basic Compound 1 | | Basic Compound 2 | |
|---|---|---|---|---|---|---|---|---|---|---|---|---|---|---|
| | Compound No. | parts by mass | Compound No. | parts by mass | Compound No. | parts by mass | Compound No. | parts by mass | Compound No. | parts by mass | Compound No. | parts by mass | Compound No. | parts by mass |
| Example 1 | A-1 | 66.8 | | | 1 | 1.1 | PAG-1 | 2.0 | PAG-10 | 4.0 | N-1 | 0.60 | | |
| Example 2 | A-2 | 71.9 | | | 2 | 1.9 | PAG-3 | 4.0 | PAG-12 | 6.0 | N-3 | 1.10 | N-1 | 0.10 |
| Example 3 | A-3 | 64.1 | A-4 | 10.0 | 3 | 1.9 | PAG-8 | 5.0 | PAG-2 | 7.0 | N-2 | 0.90 | N-3 | 0.10 |
| Example 4 | A-4 | 78.8 | | | 4 | 1.8 | PAG-5 | 6.0 | PAG-4 | 4.0 | N-5 | 0.90 | | |
| Example 5 | A-5 | 67.6 | A-8 | 15.0 | 5 | 1.7 | PAG-6 | 7.0 | PAG-1 | 2.0 | N-4 | 0.70 | | |
| Example 6 | A-6 | 76.3 | | | 6 | 1.5 | PAG-11 | 6.0 | PAG-6 | 2.0 | N-6 | 1.20 | | |
| Example 7 | A-7 | 44.8 | A-3 | 30.0 | 7 | 2.8 | PAG-9 | 8.0 | PAG-10 | 4.0 | N-2 | 1.30 | N-8 | 0.10 |
| Example 8 | A-8 | 83.0 | | | 8 | 2.2 | PAG-7 | 4.0 | PAG-2 | 3.5 | N-7 | 1.20 | N-1 | 0.10 |
| Example 9 | A-1 | 77.4 | | | 8 | 1.5 | PAG-9 | 4.0 | PAG-8 | 6.0 | N-6 | 1.10 | | |
| Example 10 | A-2 | 75.2 | | | 1 | 1.6 | PAG-11 | 6.0 | PAG-6 | 4.0 | N-8 | 1.20 | | |
| Comparative Example 1 | A-4 | 87.0 | | | 1 | 1.0 | PAG-10 | 10.0 | | | N-3 | 1.00 | | |
| Comparative Example 2 | A-1 | 77.7 | | | 4 | 2.0 | PAG-6 | 9.0 | | | N-6 | 0.80 | | |

| | Compound C | | | | Surfactant | | Solvent | | | | | |
|---|---|---|---|---|---|---|---|---|---|---|---|---|
| | Compound No. | parts by mass | Compound No. | parts by mass | Compound No. | parts by mass | Solvent 1 | parts by mass | Solvent 2 | Parts by mass | Solvent 3 | parts by mass |
| Example 1 | C-1 | 25.0 | | | W-2 | 0.50 | SL-1 | 1231 | SL-6 | 1000 | SL-7 | 50 |
| Example 2 | C-2 | 15.0 | | | | | SL-1 | 1611 | SL-5 | 600 | SL-7 | 70 |
| Example 3 | C-3 | 10.0 | | | W-2 | 1.00 | SL-1 | 1681 | SL-6 | 600 | | |
| Example 4 | C-4 | 8.0 | | | W-1 | 0.50 | SL-1 | 1781 | SL-4 | 400 | SL-7 | 100 |
| Example 5 | C-5 | 6.0 | | | | | SL-1 | 1861 | SL-3 | 400 | SL-8 | 20 |
| Example 6 | C-6 | 12.0 | | | W-6 | 1.00 | SL-6 | 1631 | SL-1 | 650 | | |
| Example 7 | C-7 | 9.0 | | | | | SL-1 | 1781 | SL-4 | 500 | | |
| Example 8 | C-8 | 5.0 | | | W-3 | 1.00 | SL-2 | 1819 | SL-6 | 442 | SL-8 | 20 |
| Example 9 | C-1 | 5.0 | C-4 | 5.0 | | | SL-1 | 1581 | SL-3 | 600 | SL-7 | 100 |
| Example 10 | C-5 | 9.0 | AD-1 | 2.0 | W-4 | 1.00 | SL-1 | 1431 | SL-5 | 800 | SL-8 | 50 |
| Comparative Example 1 | | | | | W-1 | 1.00 | SL-1 | 1681 | SL-6 | 600 | | |
| Comparative Example 2 | AD-1 | 10.0 | | | W-5 | 0.50 | SL-1 | 1881 | SL-5 | 400 | | |

Abbreviations in Table 4 are as follows.
N-1 to N-8: Each indicates the compound shown below.
C-1 to C-8 and AD-1: Each indicates the compound shown below.
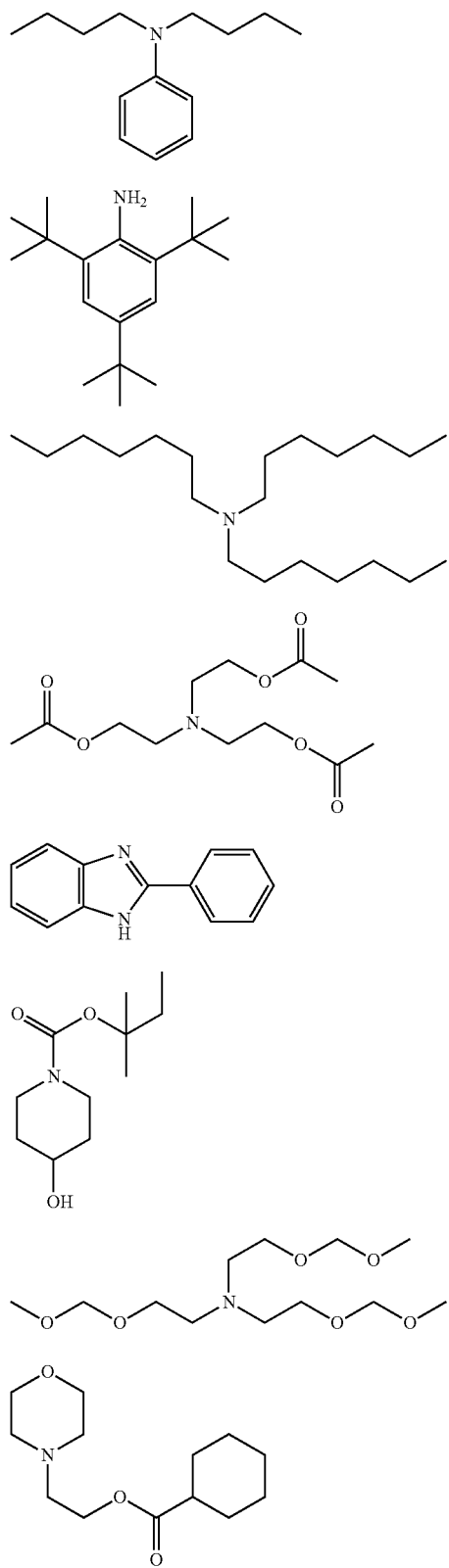
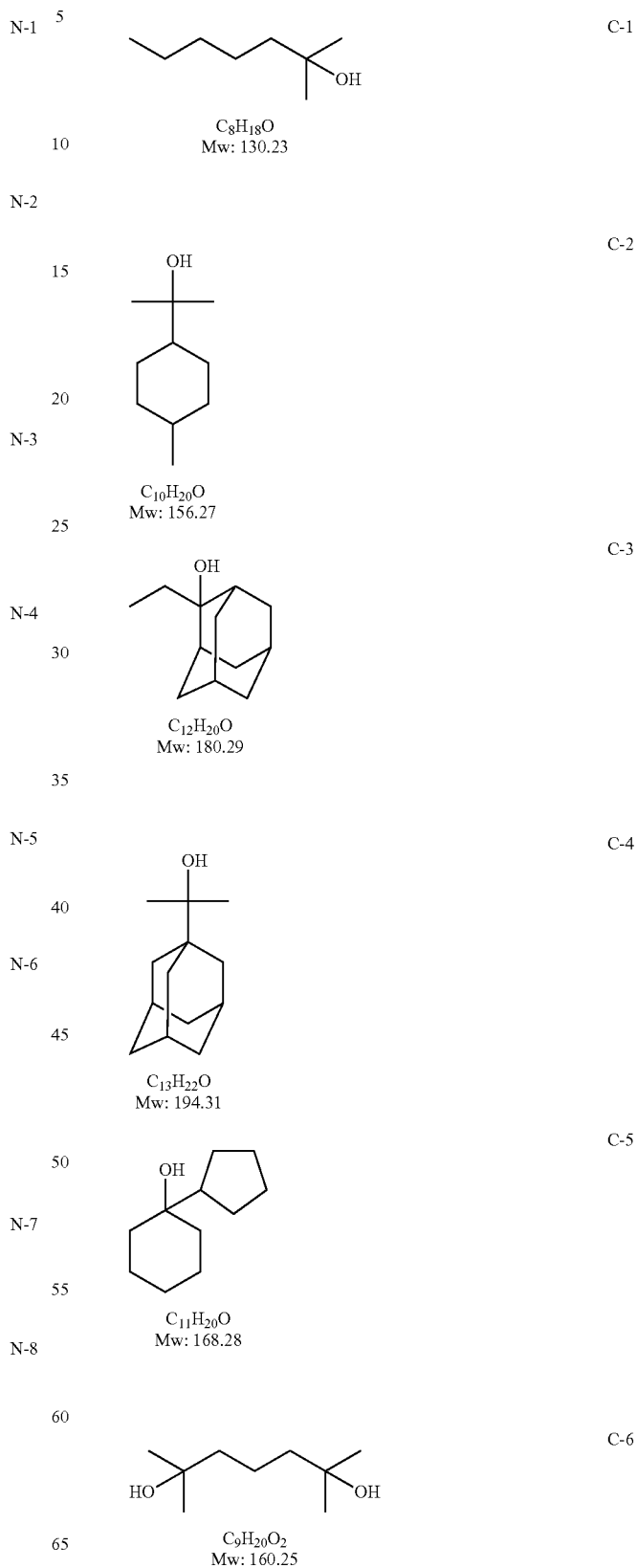

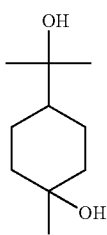

C-7

$C_{10}H_{20}O_2$
Mw: 172.26

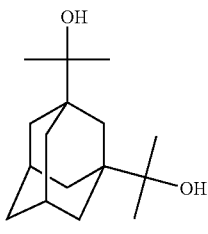

C-8

$C_{16}H_{28}O_2$
Mw: 252.39

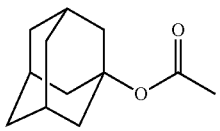

AD-1

W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: Polysiloxane Polymer KP-341 (produced by Shin-Etsu Chemical Co., Ltd.) (silicon-containing)
W-4: Troysol S-366 (produced by Troy Chemical)
W-5: KH-20 (produced by Asahi Kasei Chemicals Corporation)
W-6: PolyFox™ PF-6320 (produced by OMNOVA solution inc.), (fluorine-containing)
Group a:
SL-1: Propylene glycol monomethyl ether acetate (PGMEA)
SL-2: Propylene glycol monomethyl ether propionate
SL-3: 2-Heptanone
Group b:
SL-4: Ethyl lactate
SL-5: Propylene glycol monomethyl ether (PGME)
SL-6: Cyclohexanone
Group c:
SL-7: γ-Butyrolactone
SL-8: Propylene carbonate Using the resist composition prepared, a resist pattern was formed by the following method.

Example 1

Immersion Exposure→Baking→Development→Rinsing, abbr. iE-B-D-R

An organic antireflection film, ARC29SR (produced by Nissan Chemical Industries, Ltd.), was applied on a silicon wafer and baked at 205° C. for 60 seconds to form an antireflection film having a thickness of 86 nm. The resist composition of Example 1 was applied thereon and baked (PB) at 100° C. for 60 seconds to form a resist film having a thickness of 100 nm. The obtained wafer was subjected to pattern exposure through a 6% halftone mask having a 1:1 line-and-space pattern with a line width of 50 nm by using an ArF excimer laser immersion scanner (XT1700i, manufactured by ASML, NA: 1.20, C-Quad, outer sigma: 0.981, inner sigma: 0.895, XY deflection). As the immersion liquid, ultra-pure water was used. Thereafter, the wafer was baked (PEB) at 100° C. for 60 seconds, developed by puddling a developer (butyl acetate) for 30 seconds, rinsed by puddling a rinsing solution (4-methyl-2-pentanol) for 30 seconds, then spun at a rotation speed of 4,000 rpm for 30 seconds and further baked at 90° C. for 60 seconds to obtain a 1:1 line-and-space resist pattern with a line width of 50 nm.

Examples 2 to 10 and Comparative Examples 1 and 2

A 1:1 line-and-space resist pattern with a line width of 50 nm was obtained by the same method as in Example 1 except for employing the resist composition shown in Table 4.
<Evaluation Method>
[Sensitivity]
The line width of the obtained pattern was observed using a scanning electron microscope (SEM, S-9380II, manufactured by Hitachi Ltd.), and the irradiation energy when resolving a 1:1 line-and-space resist pattern with a line width of 50 nm was taken as Sensitivity (Eopt). A smaller value indicates higher sensitivity.
[Development Defect]
In the obtained pattern, the number of development defects was detected by using a defect inspection apparatus, UVision (trade name), manufactured by Applied Materials Inc. under the conditions of a pixel size of 120 nm, a light source polarization of Horizontal, and an inspection mode of Gray Field. The number of development defects per unit area (defects/$cm^2$) was counted, and the development defect performance was evaluated according to the following criteria.
A (Good): The value was less than 1.
B (Slightly bad): The value was from 1 to less than 2.
C (Bad): The value was 2 or more.
[Pattern Profile]
The cross-sectional profile of the obtained pattern was observed using a scanning electron microscope (SEM, S-9380II, manufactured by Hitachi Ltd.), and the pattern profile was rated A when a rectangular pattern was obtained, and rated B when a T-top profile was obtained.

TABLE 5

| | Performance Evaluation Results | | |
|---|---|---|---|
| | Eopt (mJ/$cm^2$) | Development Defect | Pattern Profile |
| Example 1 | 24.0 | A | A |
| Example 2 | 20.5 | A | A |
| Example 3 | 21.0 | A | A |
| Example 4 | 20.0 | A | A |
| Example 5 | 20.0 | A | A |
| Example 6 | 19.5 | A | A |
| Example 7 | 19.0 | A | A |
| Example 8 | 19.0 | A | A |
| Example 9 | 20.5 | A | A |
| Example 10 | 22.0 | A | A |
| Comparative Example 1 | 31.5 | C | A |
| Comparative Example 2 | 37.8 | B | B |

As apparent from Table 5, in Comparative Example 1 containing no additives, the sensitivity and the reduction of development defect were poor. In Comparative Example 2 containing a low molecular additive that is not a tertiary alcohol, the sensitivity, the reduction of development defect, and the pattern profile were inferior.

On the other hand, in Examples 1 to 10 where the resist composition using the tertiary alcohol (C) is developed with an organic solvent-containing developer, all of sensitivity, reduction of development defect, and pattern profile were excellent.

With respect to Examples 1 to 10, the developer was changed from butyl acetate to methyl amyl ketone or ethyl 2-ethoxypropionate and also in this case, excellent results were similarly obtained in all of sensitivity, reduction of development defect, and pattern profile.

According to the present invention, a pattern forming method, a chemical amplification resist composition and a resist film, ensuring that in the negative pattern formation, all of sensitivity, reduction of development defect, and pattern profile are excellent, can be provided.

This application is based on Japanese patent application JP 2010-217967, filed on Sep. 28, 2010, the entire content of which is hereby incorporated by reference, the same as if set forth at length.

What is claimed is:

1. A pattern forming method, comprising:
   (i) forming a film from a chemical amplification resist composition that contains (A) a resin, (B) a compound capable of generating an acid upon irradiation with an actinic ray or radiation and (C) a tertiary alcohol;
   (ii) exposing the film; and
   (iii) performing development to form a negative type pattern by using a developer containing an organic solvent and capable of dissolving low exposure regions in the exposed film,
   wherein the tertiary alcohol (C) is not a polymer or oligomer obtained by cleaving an unsaturated bond of a compound having an unsaturated bond with use of an initiator and expanding the bond through a chain reaction, and the content of the organic solvent in the developer containing an organic solvent is from 90 to 100 mass % based on the entire amount of the developer.

2. The pattern forming method according to claim 1, wherein the tertiary alcohol (C) is a compound represented by the following formula (C1):

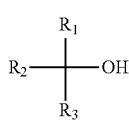

(C1)

wherein each of $R_1$, $R_2$ and $R_3$ independently represents an alkyl group, a cycloalkyl group, an alkenyl group, an alkynyl group or an aryl group, and two or more of $R_1$, $R_2$ and $R_3$ may combine with each other to form a ring; and the compound may have a structure containing two or more structures represented by formula (C1) where any one of $R_1$ to $R_3$ in a structure represented by formula (C1) is bonded to any one of $R_1$ to $R_3$ in another structure represented by formula (C1).

3. The pattern forming method according to claim 2, wherein each of $R_1$ to $R_3$ independently represents an alkyl group or a cycloalkyl group.

4. The pattern forming method according to claim 1, wherein the tertiary alcohol (C) has a molecular weight of from 120 to 500.

5. The pattern forming method according to claim 4, wherein the tertiary alcohol (C) has a molecular weight of from 150 to 400.

6. The pattern forming method according to claim 5, wherein the tertiary alcohol (C) has a molecular weight of from 180 to 300.

7. The pattern forming method according to claim 1, wherein the resin (A) is a resin capable of increasing a polarity of the resin (A) by an action of an acid to decrease a solubility of the resin (A) for a developer containing an organic solvent.

8. The pattern forming method according to claim 1, further comprising:
   heating the film after the exposing of the film but before the development.

9. The pattern forming method according to claim 1, further comprising:
   (iv) performing rinsing by using a rinsing solution containing an organic solvent.

10. The pattern forming method according to claim 1, wherein the exposing of the film in the step (ii) is exposure using an ArF excimer laser.

11. The pattern forming method according to claim 1, wherein the exposing of the film in the step (ii) is immersion exposure.

12. The pattern forming method according to claim 1, wherein the chemical amplification resist composition further contains a hydrophobic resin.

13. The pattern forming method according to claim 1, wherein the developer contains substantially no water.

14. The pattern forming method according to claim 1, wherein the developer consists essentially of the organic solvent.

15. The pattern forming method according to claim 1, wherein the developer contains at least one of an ester-based solvent and a ketone-based solvent as the organic solvent.

* * * * *